United States Patent

Yano et al.

[11] Patent Number: 5,810,923
[45] Date of Patent: Sep. 22, 1998

[54] METHOD FOR FORMING OXIDE THIN FILM AND THE TREATMENT OF SILICON SUBSTRATE

[75] Inventors: Yoshihiko Yano, Kanagawa; Takao Noguchi, Chiba; Katsuto Nagano, Kanagawa, all of Japan

[73] Assignee: TDK Corporation, Tokyo, Japan

[21] Appl. No.: 644,829

[22] Filed: May 10, 1996

Related U.S. Application Data

[62] Division of Ser. No. 516,356, Aug. 17, 1995.

[30] Foreign Application Priority Data

| Aug. 17, 1994 | [JP] | Japan | 6-215300 |
| Mar. 15, 1995 | [JP] | Japan | 7-83184 |
| Mar. 27, 1995 | [JP] | Japan | 7-93024 |
| Mar. 31, 1995 | [JP] | Japan | 7-99948 |
| Mar. 31, 1995 | [JP] | Japan | 7-99949 |

[51] Int. Cl.⁶ ................................................. C03B 25/02
[52] U.S. Cl. .................. 117/84; 117/89; 117/94; 427/248.1; 427/250
[58] Field of Search ................. 117/84, 89, 94; 427/248.1, 250

[56] References Cited

U.S. PATENT DOCUMENTS

| 3,655,429 | 4/1972 | Deklerk | 427/255.2 |
| 4,950,643 | 8/1990 | Aqostinelli et al. | 505/446 |

Primary Examiner—Felisa Garrett
Attorney, Agent, or Firm—Oblon, Spivak, McClelland, Maier & Neustadt, P.C.

[57] ABSTRACT

The invention provides an oxide thin film in the form of an epitaxial film of the composition: $Zr_{1-x}R_xO_{2-\delta}$ wherein R is a rare earth metal inclusive of Y, x=0 to 0.75, preferably x=0.20 to 0.50, formed on a surface of a single crystal silicon substrate. A rocking curve of the film has a half-value width of up to 1.50°. The film has a ten point mean roughness Rz of up to 0.60 nm across a reference length of 500 nm. An epitaxial film of the composition $ZrO_2$ is constructed by unidirectionally oriented crystals. When a functional film is to be formed on the oxide thin film serving as a buffer film, an adequately epitaxially grown functional film of quality is available.

Particularly when the single crystal substrate is rotated within its plane, an oxide thin film of uniform high quality having an area as large as 10 cm² or more is obtained.

21 Claims, 35 Drawing Sheets

3-1

3-2

3-3

3-3

3-4

3-5

3-5

3-6

3-7

METHOD FOR FORMING OXIDE THIN FILM AND THE TREATMENT OF SILICON SUBSTRATE

This is a Division of application Ser. No. 08/516,356 filed on Aug. 17, 1995, pending now allowed.

BACKGROUND OF THE INVENTION

1. Field of the Invention

This invention relates to an oxide thin film in the form of an epitaxial film composed mainly of $ZrO_2$ formed on a single crystal silicon substrate and a semiconductor device technique using the same.

2. Background Art

Electronic devices have been elaborated which are fabricated by forming superconducting films or dielectric films on silicon substrates or semiconductor crystal substrates, followed by integration. By combining semiconductors with superconductors or dielectrics, attempts have been made to fabricate a variety of devices, for example, SQUID, Josephson devices, superconducting transistors, electromagnetic sensors, and superconductor wired LSIs for the combination of semiconductors with superconductors, and LSIs having a higher degree of integration, dielectric isolated LSIs relying on SOI technology, non-volatile memories, infrared sensors, optical modulators, optical switch OEIC (opto-electronic integrated circuits) for the combination of semiconductors with dielectrics.

On the other hand, the gate of SiFET used in DRAM, for example, generally uses polycrystalline or amorphous $SiO_2$ films as the oxide film to construct a MOS structure. As the degree of integration increases, MOS capacitors are required to be of smaller size, and the size reduction has approached to the limit for the current degree of integration. Since $SiO_2$ has a dielectric constant of about 3, other dielectric materials having a higher dielectric constant must be used instead of $SiO_2$ in order to ensure that MOS capacitors afford electric charges for gates of FET to operate while providing satisfactory MOS characteristics. $SiO_2$ in a polycrystalline or amorphous state has been used in silicon devices since it is highly compatible with silicon. The $SiO_2$ substitute materials in a polycrystalline or amorphous state, however, are difficult to ensure optimum device characteristics and reproducibility thereof. It is believed that this is mainly attributable to the disturbance of physical quantities by grain boundary in polycrystalline material and the instability of physical values of amorphous material. So far the $SiO_2$ substitute materials have not been actually used in silicon devices.

Therefore, there is a need for a dielectric thin film material as a $SiO_2$ substitute which meets the requirements of single crystal, high dielectric constant, and improved MOS (or MIS) characteristics. Development of such dielectric thin films enables the fabrication of SOI devices such as LSIs having a higher degree of integration and dielectric isolated ICs relying on SOI technology.

Also in order that the above-mentioned semiconductor devices using superconducting materials or dielectric materials afford optimum device characteristics and reproducibility thereof, single crystals must be used as the superconducting materials or dielectric materials. Polycrystalline materials are difficult to achieve good device characteristics due to the disturbance of physical quantities by grain boundary. This is also true for thin film materials, and a superconducting or dielectric epitaxial film which is as close to a complete single crystal as possible is desirable.

As to crystal structure, most oxide superconductors and ferroelectric materials which are valuable in applications have a perovskite structure. Since epitaxial growth of perovskite type oxides largely depends on the material and crystal orientation of the underlying substrate, direct epitaxial growth of perovskite type oxides on silicon substrates is impossible at present. It was then proposed to form a buffer layer on silicon by epitaxial growth and allow a perovskite type oxide to epitaxially grow thereon as disclosed in Appl. Phys. Lett., Vol. 54, No. 8, pp. 754–756 (1989), Japanese Journal of Applied Physics, Vol. 27, No. 4, L634–635 (1988), and Japanese Patent Application Kokai (JP-A) No. 82585/1990.

In particular, $ZrO_2$ has good lattice matching with substrate silicon crystals and is also improved in lattice matching with perovskite crystals. Therefore, epitaxial films of $ZrO_2$ on silicon substrates have drawn attention from the early years as a buffer between silicon substrates and perovskite crystal films.

Moreover, since $ZrO_2$ features high chemical stability, insulating property, wide band gap (about 5 eV), and high dielectric constant (about 20), epitaxial $ZrO_2$ films on silicon can be utilized in SOI devices and capacitors for DRAM as well as the buffer layer.

It was recently reported that YSZ ($ZrO_2$ doped with Y for stabilization) which is a dielectric oxide material can be epitaxially grown on a silicon single crystal. Since YSZ features high chemical stability, wide band gap (about 5 eV), and high dielectric constant (about 20), it is suitable for use in MIS capacitors, LSIs having a higher degree of integration, and SOI devices. As to its preparation, various methods and compositions have been studied.

Heretofore, various methods and compositions have been studied for the preparation of epitaxial $ZrO_2$ films. For example, Appl. Phys. Lett., Vol. 53, No. 16, pp. 1506–08 (1988), to be referred to as a first prior art reference, hereinafter, describes to form an epitaxial film of YSZ (yttria-stabilized zirconia) on a silicon (100) substrate by an ion beam sputtering technique using a YSZ oxide target consisting of $ZrO_2$ having $Y_2O_3$ added thereto. Also the above-cited Japanese Journal of Applied Physics, Vol. 27, No. 8, L1404–05 (1988), to be referred to as a second prior art reference, hereinafter, describes to form an epitaxial film of YSZ on a silicon (100) substrate by an evaporation technique of evaporating a YSZ pellet in an oxygen-admitted vacuum chamber by means of an electron beam gun. Further, Appl. Phys. Lett., Vol. 57, No. 11, pp. 1137–39 (1990), to be referred to as a third prior art reference, hereinafter, describes to form an epitaxial film of YSZ on a silicon (100) substrate by a laser ablation technique using a YSZ target. Furthermore, Thin Solid Films, 299, 17–23 (1993), to be referred to as a fourth prior art reference, hereinafter, describes to form an epitaxial film of YSZ on a silicon (100) substrate by a reactive magnetron sputtering technique using a target of metallic zirconium having yttrium chips rested thereon.

As mentioned above, the YSZ film is mainly used as a buffer film for allowing a functional film to epitaxially grow thereon. In order to produce a functional film of quality, not only a matching between the lattice constants of the buffer film and the functional film is necessary, but the buffer film must also have improved crystallinity and surface properties. The crystallinity of the buffer film can be determined by the half-value width of a rocking curve of a reflection peaks in X-ray diffraction (XRD) or an image or pattern of reflection high energy electron diffraction (sometimes abbreviated as RHEED, hereinafter). The surface properties can be determined by the streakiness of a RHEED image and a surface roughness (ten point mean roughness) as measured by means of an atomic force electron microscope (sometimes abbreviated as AFM, hereinafter).

Nevertheless, the following problems arise when the above-mentioned prior art techniques are industrially applied. When a YSZ target is used in a sputtering technique as in the first prior art reference, a Zr/Y composition on the surface of a new target changes with time during continuous use due to different sputtering yields of Zr and Y. The RHEED image of a YSZ film reported in the first prior art reference is streaky, but not so sharp. Although a rocking curve of a (002) reflection peak and surface properties of a YSZ film crystalwere not analyzed, it is believed that the results would not be good.

In the case of evaporation as in the second prior art reference, the YSZ pellet is exposed to electron beams and heated to a high temperature (about 2,000° C. or higher) in vacuum whereby decomposition into Zr, Y and O occurs to change the composition of the pellet with time. With a change of Zr/Y composition, the YSZ crystal mainly changes its lattice constant and additionally changes its crystallinity in accordance with a composition of Zr, Y and O. Also, a RHEED image of the resultant YSZ film is spotted, indicating poor surface properties. Although a rocking curve and surface properties were not analyzed, it is believed that the results would not be good.

With the laser ablation technique used in the third prior art reference, little change with time of composition on the target surface occurs, but YSZ cannot be formed in a satisfactory distribution on a silicon wafer of a large area (of at least 10 cm$^2$). This is because the direction of emission of evaporating material from the target by a laser is limited and the area where YSZ is uniformly formed is limited to a certain portion of the silicon substrate. The laser ablation technique brings out the same phenomenon when applied to other materials. Also, oxide targets and pellets which are generally sintered ones are unlikely to have high purity and unsuitable to form an epitaxial YSZ film of high purity. Although it is described that the resulting YSZ film has an improved rocking curve with a half-value width of 0.71° and an improved surface roughness of about 1 nm, particles which are regarded precipitates are partially observed in the surface image by AFM and the relevant portion has asperities of more than 2 nm. These particles are often found in films prepared by laser ablation and it is believed that since a target is evaporated by a high energy laser, large clusters deposit on a film. No reference is made to other characteristics such as RHEED.

A sputtering technique using a metal target as in the fourth prior art reference minimizes the above-mentioned compositional change, but the thin film surface is exposed to a plasma of sputtering gases Ar and $O_2$ so that its crystallinity is disordered. The resulting YSZ film shows a dull RHEED image and has an inferior rocking curve with a half-value width of 1.6°. No reference is made to other characteristics of YSZ film.

Appl. Phys., 58 (6), 15 Sep. 1985, page 2407 and Appl. Phys., 63 (2), 15 Jan. 1988, page 581 report that "$ZrO_2$ can be epitaxially grown on a single crystal silicon substrate." It is described that this crystal is not a unidirectionally oriented film, but contains other crystal faces. As a general rule, bulk $ZrO_2$ is a cubic crystal above 2,500° C., a tetragonal crystal at 2,500° C. to nearly 1,000° C., and a monoclinic crystal at nearly 1,000° C. to room temperature. In general, high symmetry cubic crystals are likely to occur in epitaxial thin films. This is because cubic crystals contain more equivalent crystal faces than tetragonal and monoclinic crystals. Since tetragonal and monoclinic materials contain more non-equivalent crystal faces than cubic materials, different crystal faces are concomitantly developed in addition to the intended orientation face. Therefore, no unidirectionally oriented epitaxial film of $ZrO_2$ has been obtained because $ZrO_2$ is a monoclinic material at room temperature.

The above-cited Appl. Phys., 58 (6), 15 Sep. 1985, page 2407 describes that a monoclinic $ZrO_2$ film is obtained at a deposition temperature of lower than 800° C. and a tetragonal $ZrO_2$ film is obtained at 800° C. It is shown that these $ZrO_2$ films contain crystal faces (111), (11–1), and (200) in addition to (002) orientation plane of $ZrO_2$, and no unidirectionally oriented film of $ZrO_2$ has been obtained. There are known no reports about successful formation of a, unidirectionally oriented film of $ZrO_2$. It is described in the evaluation of a crystal surface of a $ZrO_2$ film by reflection high energy electron diffraction (sometimes abbreviated as RHEED, hereinafter) that the RHEED image is spotty, indicating that the surface contains considerable asperities. As mentioned above, an epitaxial film of $ZrO_2$ having good crystallinity and surface properties has never been produced heretofore. While semiconductor devices using a $ZrO_2$ film have never been fabricated or evaluated, the $ZrO_2$ film will contain a grain boundary at the interface between different orientation planes if the film is not of unidirectional orientation as mentioned above, and the interface between the film and the overlying electrode or semiconductor will be disordered if the film has poor surface properties. Accordingly, the disturbance of physical Quantities at the grain boundary and the interface can detract from insulation and interface properties and makes it difficult to provide satisfactory device characteristics.

As understood from the foregoing prior art examples, if a YSZ film as a buffer layer is not satisfactory in any one of rocking curve half-value width, surface roughness, and RHEED image streakiness, it is impossible to form a functional film of high quality thereon by epitaxial growth.

On the surface of a silicon single crystal, an oxide film of $SiO_2$ spontaneously forms in air. The presence of this spontaneous oxide film prevents the crystal information of the silicon substrate from being transmitted to a film to be overlaid so that epitaxial growth is impossible.

Then the above-mentioned methods first carry out treatment for providing a clean silicon surface.

The procedure involves etching while rotating the substrate. The substrate is rotated in a nitrogen atmosphere and rinsed with high purity alcohol. Thereafter, it is etched by adding dropwise a solution (1:10:1) of HF, ethanol and pure water, all of high purity, thereto. The substrate is placed in a glove box containing a nitrogen atmosphere for transfer and quickly mounted in a film depositing apparatus. The vacuum chamber is evacuated to a high vacuum of $1\times10^{-6}$ Torr or higher ($\leq 10^{-6}$ Torr) and heated to a temperature for deposition. In this step, the vacuum chamber is kept as clean as possible in order to prevent contamination of the substrate surface. In the above-mentioned procedure, epitaxial growth is carried out using the silicon substrate which has been carefully prepared, and the steps involved therein are very complex. Another procedure is disclosed in Japanese Journal of Applied Physics, Vol. 30, L1415–1417 (1991) as comprising the step of interposing an interface control layer to derive the silicon crystal information at the initial of film growth. This procedure also lacks reproducibility because the treating conditions are sensitive and complex and epitaxial growth of oxide is possible only with optimum treatment.

Over the recent past, attention has been paid to $ZrO_2$ as a substitute oxide for $SiO_2$ as reported in Appl. Phys., 58 (6), 15 Sep. 1985, page 2407 and Appl. Phys., 63 (2), 15 Jan. 1988, page 581. It is described that $ZrO_2$ can be epitaxially grown on a single crystal silicon substrate and that the resulting crystal is not a unidirectionally oriented film, but contains other crystal faces. As a general rule, bulk $ZrO_2$ is a cubic crystal above 2,500° C., a tetragonal crystal at 2,500° C. to nearly 1,000° C., and a monoclinic crystal at nearly 1,000° C. to room temperature. In general, high symmetry cubic crystals are likely to occur in epitaxial thin films. This is because cubic crystals contain more equivalent crystal faces than tetragonal and monoclinic crystals. Since tetragonal and monoclinic materials contain more non-equivalent crystal faces than cubic materials, different crystal faces are concomitantly developed in addition to the intended orientation face. Therefore, no unidirectionally oriented epitaxial film of $ZrO_2$ has been obtained because $ZrO_2$ which is a monoclinic material at room temperature.

The fabrication and evaluation of a MIS structure using the above-mentioned YSZ are reported in Appl. Phys. Lett., 61 (26), 28 Dec. 1992, page 3184. Evaluating 2 C-V curve which is most fundamental among MOS or MIS characteristics, this article reports that the C-V curve exhibited noticeable hysteresis, failing to achieve satisfactory MOS or MIS characteristics.

When YSZ whose C-V curve exhibits noticeable hysteresis as mentioned above is used to fabricate a MISFET, the resulting FET is impractical because the presence of C-V hysteresis in the gate region of the FET induces a substantial variation of the transistor's threshold value.

As mentioned above, although the epitaxial YSZ film formed on a silicon single crystal is quite promising as a $SiO_2$-substitute dielectric film for silicon from the standpoint of dielectric constant, it cannot be utilized as MIS capacitors for silicon devices because its C-V curve which is most fundamental among MOS or MIS characteristics contains hysteresis, which means failure to achieve satisfactory MOS or MIS characteristics.

Furthermore, as a replacement of the high capacity magnetic memory, a flash memory capable of electrically writing and erasing data is on the verge of practical use. At present, there is a stronger demand for increased integration and endurance. As opposed to hard disks which endure more than $10^7$ cycles of rewriting, the flash memory can endure only about $10^5$ cycles. The flash memory includes basic cells of floating gate avalanche injection MOS (FAMOS) structure. The endurance is limited to about $10^5$ cycles because a tunnel oxide film ($SiO_2$) used in conventional memory cells is deteriorated.

In conventional memory cells, a high voltage is applied across the tunnel oxide film of $SiO_2$ upon writing and erasing. One method used for writing is to generate hot electrons and inject electrons with energy into the floating gate through the tunnel oxide film. Another method used for writing is to inject electrons by using Fowler-Nordheim current generated in the tunnel oxide film with a high electric field applied. For erasing, Fowler-Nordheim electron injection is mainly utilized. Repetition of writing and erasing in this way is nothing but repeated application of a high voltage across a $SiO_2$ film. Since hot electrons under a high electric field create pairs of electrons and holes, holes are injected into the $SiO_2$ film along with electrons. The thus injected holes cause a drop of the current gain of respective cells, leading to a drop in the injection efficiency of electrons into the floating gate and an increase of leakage current in the tunnel oxide film of $SiO_2$. The application of a high electric field across $SiO_2$ causes the $SiO_2$ film to be stressed. As the high electric field-induced stress increases, there occurs a phenomenon that the leak current increases by merely applying a low voltage. In this way, the $SiO_2$ film is deteriorated by a high electric field to disable memory operation.

Accordingly, a tunnel oxide film made of a material which does not deteriorate under a high electric field and having improved film quality must be furnished before highly reliable memory cells capable of enduring repeated data rewriting can be produced.

Also, with the recent progress of the semiconductor technology, a number of semiconductor devices designed for higher integration and methods for preparing the same have been proposed.

Heretofore, the silicon-on-sapphire (SOS) structure has been used to form semiconductor elements on an insulating substrate. This technology is to form a semiconductor thin film on a single crystal sapphire substrate.

In this technology, however, it sometimes happens upon formation of a semiconductor thin film that aluminum and oxygen which constitute part of sapphire are taken into the semiconductor thin film to deteriorate the electrical properties thereof as impurities. Also, when it is desired to epitaxially grow a semiconductor thin film to produce a silicon film of quality, much defects are introduced due to a mismatch of lattice constant between silicon and the substrate sapphire, resulting in a semiconductor thin film of reduced crystallinity. Moreover, sapphire substrates are expensive and unsuitable for mass production of devices.

Then in order to avoid the problems of sapphire substrates, JP-A 15442/1988, 97401/1994, 5567/1990, and 85264/1994 propose a silicon-on-insulator (SOI) structure comprising an insulating layer formed on a single crystal silicon substrate and a functional layer or silicon semiconductor layer formed thereon.

This SOI structure enables higher integration by incorporating semiconductor elements into the single crystal silicon substrate having an integrated circuit formed therein and the semiconductor thin film formed thereon through the intervening insulating layer. As a general rule, wiring dimensions inevitably shrink as the integration of LSIs increases. In such wiring, wire resistance, wire-to-wire capacitance, wire-to-substrate capacitance, and the capacitance of a transistor itself constitute a CR distributed parameter circuit, giving rise to the problems of signal delay and attenuation. The semiconductor elements formed on an insulating substrate, because of this structure, allow the wire-to-substrate capacitance to be reduced, which will increase device speed.

By providing on such a SOI structure FETs, CMOS transistors, and bipolar transistors utilizing a MOS structure or a structure intrinsic to semiconductor such as a pn junction, there can be obtained SOI devices including display devices, high voltage devices, three-dimensional circuit elements, and solar cells.

However, since the SOI structures disclosed in the above-cited patent gazettes use an insulating layer which is deemed unsatisfactory in quality, that is, crystallinity and surface property, it is presumed difficult to derive full ability from a functional layer in the form of a silicon film formed on the insulating layer. It is noted that JP-A 15442/1988 cited above discloses a technique of forming a silicon film on a single crystal stabilized zirconia film which has been formed on a single crystal silicon substrate. This single crystal stabilized zirconia film is formed by conventional methods commonly used for oxide formation, such as sputtering and can be epitaxially grown, but a stabilized zirconia film featuring high crystallinity, high surface flatness and good insulation is not obtained. For device application, it is necessary to have a thin film featuring high crystallinity, high surface flatness and good insulation.

Moreover, although the silicon film formed on the single crystal stabilized zirconia film is also an epitaxial film, it is presumed difficult to derive full semiconductor ability from the silicon film when the silicon film is used as a functional layer because, due to the poor crystallinity and surface flatness of the single crystal stabilized zirconia film, the silicon film has poor crystallinity, the stabilized zirconia/silicon interface is disordered and the stabilized zirconia film has insufficient insulation.

DISCLOSURE OF THE INVENTION

Therefore, a first object of the present invention is to provide an epitaxial oxide thin film composed mainly of $ZrO_2$ having improved crystallinity and surface properties, a substrate for use in electronic devices having the oxide thin film, and a method for forming the oxide thin film.

A second object of the present invention is to provide a silicon substrate which upon epitaxial growth of an oxide thereon, offers a stable surface structure in the film forming temperature region and plays the role of transmitting the crystal structure information to an oxide film to be grown, and is reproducible and suitable for mass production, and a method for surface treating the silicon substrate.

A third object of the present invention is to provide a MIS semiconductor device exhibiting a C-V curve free of hysteresis and improved MIS characteristics.

A fourth object of the present invention is to provide a floating gate type non-volatile semiconductor memory device ensuring high reliability operation using an oxide thin film of a least deteriorating material as a tunnel oxide film of basic cells thereof.

A fifth object of the present invention is to provide an SOI device ensuring high reliability operation using an insulating layer of quality.

These and other objects are attained by the present invention which is defined below as (1) to (53).

(1) An oxide thin film in the form of a unidirectionally oriented epitaxial film consisting essentially of zirconium oxide formed on a single crystal substrate of silicon.

(2) The oxide thin film of (1) wherein said unidirectionally oriented epitaxial film contains at least 93% of Zr based on the amount of only constituent elements of the film excluding oxygen.

(3) The oxide thin film of (1) wherein a rocking curve of reflection on a (002) or (111) plane of said unidirectionally oriented epitaxial film has a half-value width of up to 1.5°.

(4) The oxide thin film of (1) wherein said unidirectionally oriented epitaxial film has a ten point mean roughness Rz of up to 2 nm across a reference length of 500 nm over at least 80% of its surface.

(5) The oxide thin film of (1) wherein said single crystal silicon substrate is a surface treated silicon substrate whose surface has a 1×1 surface structure formed of metallic zirconium and oxygen.

(6) The oxide thin film of (1) wherein said single crystal substrate is a silicon single crystal whose (100) or (111) plane is made the substrate surface.

(7) The oxide thin film of (1) which has an area of at least 10 square centimeter.

(8) An oxide thin film in the form of a unidirectionally oriented epitaxial film of the composition: $Zr_{1-x}R_xO_{2-\delta}$ wherein R is a rare earth metal inclusive of yttrium, x is a number of 0 to 0.75, and $\delta$ is a number of 0 to 0.5, formed on a single crystal silicon substrate wherein a rocking curve of reflection on a (002) or (111) plane of said film has a half-value width of up to 1.5°, and said film has a ten point mean roughness Rz of up to 0.60 nm across a reference length of 500 nm over at least 80% of its surface.

(9) The oxide thin film of (8) wherein said epitaxial film is a unidirectionally oriented epitaxial film.

(10) The oxide thin film of (8) wherein said single crystal silicon substrate is a surface treated silicon substrate whose surface has a 1×1 surface structure formed of metallic zirconium and oxygen.

(11) The oxide thin film of (8) wherein said single crystal silicon substrate is a silicon single crystal whose (100) or (111) plane is made the substrate surface.

(12) The oxide thin film of any one of (1) to (7) which has an area of at least 10 square centimeter.

(13) A substrate for use in electronic devices comprising a single crystal silicon substrate and an oxide thin film in the form of a unidirectionally oriented epitaxial film consisting essentially of $ZrO_2$ formed on the single crystal silicon substrate.

(14) A substrate for use in electronic devices comprising a single crystal silicon substrate and an oxide thin film in the form of an epitaxial film of the composition: $Zr_{1-x}R_xO_{2-\delta}$ wherein R is a rare earth metal inclusive of yttrium, x is a number of 0 to 0.75, and $\delta$ is a number of 0 to 0.5, formed on the single crystal silicon substrate wherein a rocking curve of reflection on a (002) or (111) plane of said film has a half-value width of up to 1.5°, and said film has a ten point mean roughness Rz of up to 0.60 nm across a reference length of 500 nm over at least 80% of its surface.

(15) The substrate for use in electronic devices of claim 14 wherein said epitaxial film is a unidirectionally oriented epitaxial film.

(16) A method for forming an oxide thin film in the form of an epitaxial film of the composition: $Zr_{1-x}R_xO_{2-\delta}$ wherein R is a rare earth metal inclusive of yttrium, x is a number of 0 to 0.75, and $\delta$ is a number of 0 to 0.5 on a single crystal substrate of silicon, comprising the steps of:

initially evacuating a vacuum chamber to a vacuum of $\leq 1 \times 10^{-5}$ Torr, heating a single crystal substrate of silicon to a predetermined temperature in the evacuated condition, then evaporating at least zirconium among metal elements including zirconium and at least one rare earth metal (inclusive of yttrium) concurrently from distinct evaporation sources at a controlled ratio of Zr and the rare earth metal, thereby supplying the metal(s) to the surface of the single crystal substrate, introducing an oxidizing gas into said vacuum chamber at the same time as the supply of the metal(s) or after a predetermined delay time from the supply of the metal (s), thereby setting at least the atmosphere in proximity to the single crystal substrate in the vacuum chamber at a pressure of $1 \times 10^{-4}$ to $1 \times 10^{-2}$ Torr, and allowing an oxide thin film to form on the surface of said single crystal substrate by epitaxial growth.

(17) The method for forming an oxide thin film of (16) wherein said epitaxial film is a unidirectionally oriented epitaxial film.

(18) The method for forming an oxide thin film of (16) wherein the predetermined delay time from the supply of the metal(s) by evaporation to the introduction of the oxidizing gas is a time corresponding to 5 nm or less as expressed by the thickness of a metal thin film formed on said single crystal substrate.

(19) The method for forming an oxide thin film of (16) wherein zirconium and rare earth metal (inclusive of yttrium) are concurrently evaporated from evaporation sources at a controlled molar ratio of rare earth metal to Zr of 0/1 to 3/1.

(20) The method for forming an oxide thin film of (16) wherein zirconium and rare earth metal (inclusive of yttrium) are concurrently evaporated from evaporation sources at a controlled molar ratio of rare earth metal to Zr of 0.25/1 to 1.0/1.

(21) The method for forming an oxide thin film of (16) wherein a silicon single crystal is used as said single crystal silicon substrate such that its (100) or (111) plane is made the substrate surface.

(22) The method for forming an oxide thin film of (16) wherein an oxidizing gas is injected toward the surface of said single crystal silicon substrate from the proximity thereof, thereby creating only in the vicinity of said single crystal substrate an atmosphere having a higher oxidizing gas partial pressure than the remainder.

(23) The method for forming an oxide thin film of (16) wherein said single crystal silicon substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

(24) The method for forming an oxide thin film of (16) wherein said single crystal silicon substrate is heated to at least about 750° C. during formation of the epitaxial film.

(25) A method for forming an oxide thin film in the form of a unidirectionally oriented epitaxial film of the composition: $Zr_{1-x}R_xO_{2-\delta}$ wherein R is a rare earth metal inclusive of yttrium, x is a number of 0 to 0.75, and $\delta$ is a number of 0 to 0.5 on a single crystal silicon substrate, comprising the steps of:

carrying out in a vacuum chamber heating of a single crystal silicon substrate, introduction of an oxidizing gas into the vacuum chamber, and supply of zirconium or zirconium and at least one rare earth metal (inclusive of yttrium) to the surface of the single crystal substrate by evaporation, and allowing an oxide thin film to form on the surface of said single crystal substrate by epitaxial growth for forming a unidirectionally oriented epitaxial film of said composition.

(26) The method for forming an oxide thin film of (25) wherein said single crystal silicon substrate used is a surface treated silicon substrate whose surface has a 1×1 surface structure formed of zirconium or zirconium and at least one rare earth metal (inclusive of yttrium) and oxygen.

(27) The method for forming an oxide thin film of (25) wherein said surface treated silicon substrate used is a single crystal silicon substrate which has been pre-treated by forming a silicon oxide layer of 0.2 to 10 nm thick on the substrate surface, setting the substrate at a temperature of 600° to 1,200° C. and introducing an oxidizing gas into the vacuum chamber for establishing an atmosphere of $1\times10^{-4}$ to $1\times10^{-1}$ Torr at least in the vicinity of the substrate, and supplying in this condition zirconium or zirconium and at least one rare earth metal (inclusive of yttrium) by evaporation to the surface of the substrate having the silicon oxide layer formed thereon.

(28) The method for forming an oxide thin film of (25) wherein the step of forming a silicon oxide layer includes heating the single crystal silicon substrate in the vacuum chamber having the oxidizing gas introduced therein to a temperature of 300° to 700° C. and establishing an atmosphere having an oxygen partial pressure of $\leq 1\times10^{-4}$ Torr at least in the vicinity of the substrate in the vacuum chamber for forming a silicon oxide layer.

(29) The method for forming an oxide thin film of (25) wherein a silicon single crystal is used as said single. crystal silicon substrate such that its (100) or (111) plane is made the substrate surface.

(30) The method for forming an oxide thin film of (25) wherein an oxidizing gas is injected toward the surface of said single crystal silicon substrate from the proximity thereof, thereby establishing only in the vicinity of said single crystal substrate an atmosphere having a higher oxidizing gas partial pressure than the remainder.

(31) The method for forming an oxide thin film of (25) wherein said single crystal silicon substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

(32) The method for forming an oxide thin film of (25) wherein said single crystal silicon substrate is heated to at least 751° C. during formation of the epitaxial film.

(33) A silicon substrate of single crystal silicon whose surface has a 1×1 surface structure formed of at least one metal selected from the group consisting of an alkaline earth metal, rare earth metal (inclusive of scandium and yttrium), zirconium, and hafnium and oxygen.

(34) A method for the surface treatment of a silicon substrate comprising the steps of forming a silicon oxide layer on the surface of a single crystal silicon substrate, and thereafter heating the substrate in vacuum and supplying to the surface at least one metal selected from the group consisting of an alkaline earth metal, rare earth metal (inclusive of scandium and yttrium), zirconium, and hafnium and an oxidizing gas, for thereby converting the substrate surface to a 1×1 surface structure formed of at least one metal selected from the group consisting of an alkaline earth metal, rare earth metal (inclusive of scandium and yttrium), zirconium, and hafnium and oxygen.

(35) The method for the surface treatment of a silicon substrate according to claim 34 wherein the step of forming a silicon oxide layer includes heating the single crystal silicon substrate in the vacuum chamber having the oxidizing gas introduced therein to a temperature of 310° to 700° C. and establishing an atmosphere having an oxygen partial pressure of $\leq 1\times10^{-4}$ Torr at least in the vicinity of the substrate in the vacuum chamber for forming a silicon oxide layer of 0.2 to 10 nm thick.

(36) The method for the surface treatment of a silicon substrate according to claim 34 wherein the supply of the metal is carried out by evaporating the selected metal, during which the single crystal silicon substrate is set at a temperature of 600° to 1,200° C., and the oxidizing gas is introduced in this condition to establish an atmosphere having a pressure of $1\times10^{-4}$ to $1\times10^{-1}$ Torr at least in the vicinity of the single crystal silicon substrate in the vacuum chamber.

(37) The method for the surface treatment of a silicon substrate according to claim 34 wherein said single crystal silicon substrate is used such that its (100) plane is made the substrate surface.

(38) A semiconductor device comprising a single crystal silicon substrate and an insulating layer formed on said substrate, characterized in that said insulating layer is a unidirectionally oriented epitaxial film composed mainly of $ZrO_2$.

(39) The semiconductor device of (38) wherein said insulating layer contains at least 93 mol % of Zr based on the amount of only its constituent elements excluding oxygen.

(40) The semiconductor device of (38) wherein a rocking curve of reflection on a (002) or (111) plane of the epitaxial film forming said insulating layer has a half-value width of up to 1.5°.

(41) The semiconductor device of (38) wherein the epitaxial film forming said insulating layer has a ten point mean roughness Rz of up to 2 nm across a reference length of 500 nm over at least 80% of its surface.

(42) The semiconductor device of (38) wherein said single crystal silicon substrate is a surface treated silicon substrate whose surface has a 1×1 surface structure formed of metallic zirconium and oxygen.

(43) The semiconductor device of (38) wherein a silicon single crystal is used as said single crystal substrate such that its (100) or (111) plane is made the substrate surface.

(44) The semiconductor device of (38) which is a MIS capacitor wherein said insulating layer serves as a dielectric layer.

(45) The semiconductor device of (38) which functions as a MISFET wherein said insulating layer serves as a gate oxide layer.

(46) The semiconductor device of (38) which functions as a non-volatile semiconductor memory wherein said insulating layer serves as a floating gate.

(47) The semiconductor device of (38) wherein the oxide thin film constructing said tunnel oxide film has the composition: $Zr_{1-x}R_xO_{2-\delta}$ wherein R is a rare earth metal inclusive of yttrium, x is a number of 0 to 0.75, and $\delta$ is a number of 0 to 0.5.

(48) The semiconductor device of (38) wherein said floating gate electrode is constructed by an epitaxial film of metallic silicon.

(49) The semiconductor device of (38) which functions as SOI device wherein said oxide thin film serves as an insulating layer on which a silicon film is formed.

(50) The semiconductor device of (49) having a thin film transistor structure wherein a gate electrode is formed on the silicon film with a gate insulating film intervening therebetween.

(51) The semiconductor device of (38) wherein said silicon film is constructed by epitaxial silicon.

(52) The semiconductor device of (51) wherein said silicon film is constructed by polycrystalline silicon.

(53) The semiconductor device of (51) wherein said silicon film is constructed by amorphous silicon.

FUNCTION AND BENEFIT

The invention provides an oxide thin film in the form of an epitaxial film of the composition: $Zr_{1-x}R_xO_{2-\delta}$ wherein R is a rare earth metal inclusive of Y, x=0 to 0.75, preferably x=0.20 to 0.50, formed on a surface of a single crystal silicon substrate. A rocking curve of the film has a half-value width of up to 1.50°. The film has a ten point mean roughness Rz of up to 0.60 nm across a reference length of 500 nm. An epitaxial film of the composition $ZrO_2$ is constructed by unidirectionally oriented crystals. When a functional film is to be formed on the oxide thin film serving as a buffer film, an adequately epitaxially grown functional film of quality is available.

Particularly when the single crystal substrate is rotated within its plane, an oxide thin film of uniform high quality having an area as large as 10 cm² or more is obtained.

It is to be noted that JP-A 258700/1990 discloses a technique of forming a perovskite type oxide ($BaTiO_3$) single crystal film on a single crystal oxide substrate by co-deposition wherein distinct evaporation sources are used to control a compositional ratio, the oxygen pressure is increased only in the proximity of the substrate, and the substrate used has a specific orientation plane. Since the technique disclosed in JP-A 258700/1990, however, does not address a $Y_2O_3$-doped $ZrO_2$ single crystal film, but relates to a technique of forming an oxide film on an oxide substrate, an oxidizing gas (oxygen gas) is admitted in a preparatory stage for film formation or a substrate heating step. In contrast, the present invention relates to a technique for forming an oxide film on a non-oxide substrate. If an oxidizing gas (oxygen gas) is admitted in a preparatory stage for film formation as in JP-A 258700/1990, the single crystal silicon substrate is oxidized on the surface to form an oxide thin film (e.g., $SiO_2$), that is, the substrate surface is deteriorated. According to the present invention, at least zirconium among zirconium and rare earth metals inclusive of yttrium is evaporated in a preparatory stage for film formation without admitting an oxidizing gas, thereby first feeding the metal to the substrate surface and thereafter an oxidizing gas is admitted concurrently or a little later for forming an oxide film on the substrate surface. The second method of the present invention has solved the prior art problems of JP-A 258700/1990 by using a method of treating a silicon surface. The above-cited JP-A 258700/1990 refers nowhere to this characterizing step at all. Additionally, the technique of JP-A 258700/1990 does not address or suggest a substrate having a surface area as large as 10 cm² or more. In fact, JP-A 258700/1990 contains only one example wherein the substrate has an area of 2.25 cm² (about 15×15 mm²). The present invention enables the use of a substrate having a surface area of 10 cm² or more by rotating the substrate in the substrate plane.

By taking into account that a silicon surface is highly reactive and unstable, the present invention provides a silicon substrate wherein the substrate surface has a 1×1 surface structure formed of at least one metal of alkaline earth metals, rare earth metals (inclusive of Sc and Y), zirconium, and hafnium and oxygen so that the crystal surface of silicon is not exposed. This surface gives a flat crystal surface having good periodicity, keeps the stable structure in the film formation temperature region during epitaxial growth of oxide and effectively transmits the crystal structure information to an oxide film to be grown. Using this substrate, it becomes possible to prepare an epitaxial film of oxide having improved crystallinity and surface properties in a reproducible manner. Especially for an oxide epitaxial film crystal, since the surface structure of a substrate deemed to appear upon scission of a bulk crystal structure is a 1×1 structure, it becomes possible from this aspect too to allow for satisfactory epitaxial growth.

The MIS semiconductor devices of the invention, for example, MIS capacitors and MISFETs have improved MIS characteristics since their most fundamental C-V curve is not hysteretic due to their structure including a single crystal silicon substrate and a unidirectionally oriented epitaxial film composed mainly of $ZrO_2$ formed on the single crystal silicon substrate as a dielectric layer. It is believed that the YSZ used in the prior art exhibits a hysteretic C-V, curve since it contains rare earth additives in $ZrO_2$ and has poor crystallinity and surface properties. The present invention substantially eliminates hysteresis since $ZrO_2$ of high purity is formed to high crystallinity and surface property.

The non-volatile semiconductor memory device of the present invention affords satisfactory memory capability without leakage under repetitive application of a high electric field when a FAMOS structure is constructed by a cell structure comprising a single crystal silicon substrate and an epitaxial film of the composition: $Zr_{1-x}R_xO_{2-\delta}$ formed on the single crystal silicon substrate as a tunnel oxide film. The present invention substantially eliminates leakage under repetitive application of a high electric field since $ZrO_2$ of high purity is formed to high crystallinity and surface property.

Moreover, since epitaxial silicon can be grown on the tunnel oxide film in the form of an epitaxial film of the composition: $Zr_{1-x}R_xO_{2-\delta}$, the non-volatile semiconductor memory device of the present invention can further improve its performance and durability by using the epitaxial silicon as a floating gate electrode.

By establishing a structure including a single crystal silicon substrate, an insulating layer in the form of an epitaxial film of the composition: $Zr_{1-x}R_xO_{2-\delta}$ formed on the single crystal silicon substrate, and a silicon film formed on the insulating layer, the present invention provides an SOI device such as a thin film transistor. The epitaxial film of the composition: $Zr_{1-x}R_xO_{2-\delta}$ is stable at elevated temperatures and is not chemically reduced at elevated temperatures to contaminate the overlying silicon film as is sapphire. Due to its high insulating property, it can provide a complete insulation between the silicon film and the silicon substrate. Since its lattice constant is approximate to that of silicon, the silicon semiconductor thin film is improved in crystallinity. Moreover the epitaxial film of the composition: $Zr_{1-x}R_xO_{2-\delta}$ has a flat surface as examined on the molecular level, ensuring more continuity of the silicon film formed thereon. Additionally found was a reduction of the residual stresses which are probably attributable to the difference in coefficient of thermal expansion between the single crystal silicon substrate and the epitaxial film of the composition: $Zr_{1-x}R_xO_{2-\delta}$. Although the mechanism is not well understood, the fact that this benefit becomes outstanding with a film of a composition wherein x is approximate to 0 suggests that the residual stresses associated with silicon are reduced by a phase transition of $ZrO_2$.

As mentioned above, the SOI devices of the invention improve their performance in their respective applications.

ILLUSTRATIVE CONSTRUCTION

Figure 1:
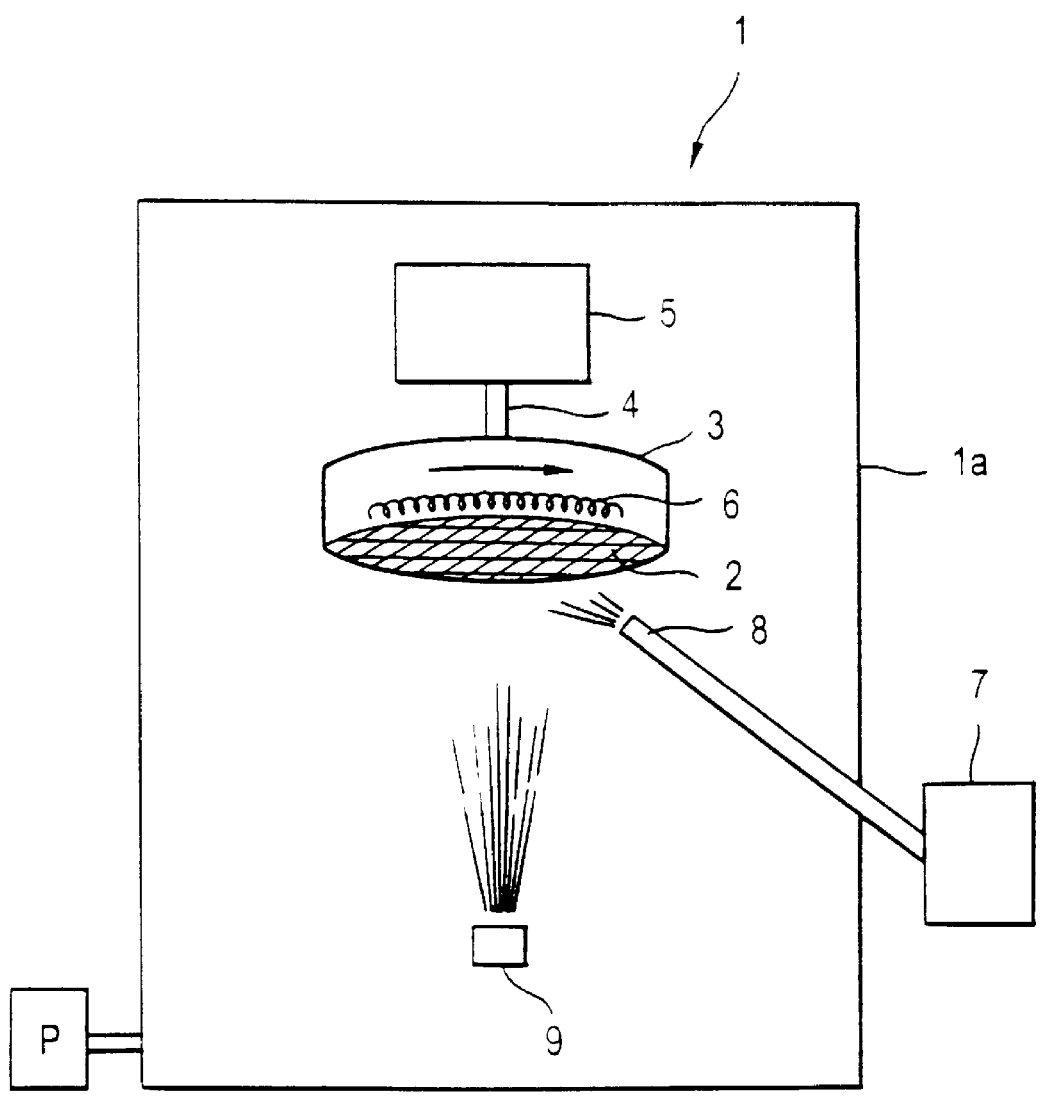
FIG. 1 is a view illustrating one exemplary evaporation apparatus used in a method for preparing a substrate for electronic devices according to the invention.

The present invention provides an oxide thin film in the form of a unidirectionally oriented epitaxial film consisting essentially of zirconium oxide or rare earth metal-stabilized zirconium oxide, typically of the composition: $Zr_{1-x}R_xO_{2-\delta}$ wherein R is a rare earth metal inclusive of yttrium and x is a number of 0 to 0.75, preferably 0.2 to 0.50, formed on a single crystal silicon substrate.

It is noted that the term "epitaxial film" used herein means that crystals are oriented in alignment in all the directions of X, Y, and Z axes, provided that the film's substrate surface is a X-Y plane and the film's thickness direction is Z axis, and in X-ray or electron-ray diffraction measured in the respective directions, the intensity of reflection other than the objective reflection is up to 5% of the maximum intensity on the objective plane. In the case of a (001) epitaxial film or c plane epitaxial film, for example, if a film as analyzed by 2θ-θ X-ray diffraction has an intensity of reflection other than on (00 l) plane which is up to 5% of the maximum peak intensity of reflection on (00 l) plane and as analyzed by RHEED exhibits a spotty or streaky pattern, then this film is regarded to be a (001) epitaxial film. The same applies to a (111) epitaxial film.

It is also noted that the term "unidirectionally oriented film" designates a crystallized film in which the objective crystal face is aligned parallel to the substrate surface. In the case of a (001) unidirectionally oriented or c plane unidirectionally oriented film, for example, it is a film which has an intensity of reflection other than on (00 l) plane which is up to 5% of the maximum peak intensity of reflection on (00 l) plane as analyzed by 2θ-θ X-ray diffraction. Similarly, a (111) unidirectionally oriented film is a film having an intensity of reflection other than on (lll) plane which is up to 5% of the maximum peak intensity of reflection on (lll) plane.

The crystallinity of the oxide epitaxial film depends on the range of x. In general, $Zr_{1-x}R_xO_{2-\delta}$ takes the form of a tetragonal crystal in the region of small x where x is less than 0.2, but a cubic crystal in the larger x region. In order that the oxide thin film be used as a buffer layer, for example, it should desirably possess single crystallinity as mentioned above. Especially, the cubic crystal is superior as the buffer layer since its crystal symmetry is more than the tetragonal crystal. The reason is probably that since crystals at the buffer layer surface are more regularly arranged in the cubic system than in the tetragonal system, a functional film having higher crystallinity can be formed thereon.

In the region where x exceeds 0.75, the film is of cubic crystals, with crystal faces other than the objective crystal face being co-present. For example, an attempt to form a (100) epitaxial film of $Zr_{1-x}R_xO_{2-\delta}$ entails formation of (111) crystals in this x region.

More specifically, the ranges where tetragonal and cubic crystals are formed and the range where the objective crystal face is obtained suggest that an epitaxial film which is superior as the buffer layer is obtained from $Zr_{1-x}R_xO_{2-\delta}$ when x ranges from 0 to 0.75, preferably from 0.2 to 0.50.

The type of rare earth metal is selected such that the oxide thin film may have a lattice constant which well matches with the lattice constant of a functional film to be formed on the oxide film. For example, $Zr_{0.7}R_{0.3}O_{2-\delta}$ where the rare earth metal used is yttrium has a lattice constant of 0.515 nm. This value can change with the value of x. When a YBCO film (lattice constant 0.386 nm) is formed on the oxide film as a functional film as will be described later, lattice matching is achievable by rotating the YBCO film 45° relative to the lattice at the surface of the $Zr_{0.7}R_{0.3}O_{2-\delta}$ film with such matching being adjustable with the value of x. However, the adjustable matching range is limited if it is under the control of x. Then matching is achievable by changing the type of rare earth metal. For example, rare earth Pr is used instead of Y whereby the lattice constant of $Zr_{1-x}R_xO_{2-\delta}$ can be increased. By suitably selecting the type and amount of rare earth metal in this way, the oxide thin film can be matched with the lattice of a functional film.

Note that zirconium oxide free of oxygen defects is represented by the chemical formula: $ZrO_2$ while the composition of the oxide thin film of the invention is represented by the chemical formula: $Zr_{1-x}R_xO_{2-\delta}$ using δ because zirconium oxide having a rare earth element (inclusive of yttrium) added thereto varies its oxygen amount depending on the type, amount and valence of the metal element added. Generally, δ ranges from 0 to about 0.5.

The oxide thin film of the invention is such that a rocking curve of reflection on a (002) or (111) plane of the film has a half-value width of up to 1.50° and the film has a surface roughness (ten point mean roughness Rz) of up to 0.60 nm across a reference length of 500 nm over at least 80%, preferably at least 90%, especially at least 95% of its surface as measured by AFM. The percentage is a value obtained by carrying out measurement at arbitrary 10 or more points evenly distributed over the entire surface of the $ZrO_2$ thin film. An RHEED image of the oxide thin film is streaky. That is, the RHEED image contains many sharp streaks. These facts prove that the oxide thin film of the invention is improved in both crystallinity and surface properties. Accordingly, on the surface of the oxide thin film of the invention, a functional epitaxial film of quality can be formed. It is noted that no particular lower limit is imposed on the half-value width of a rocking curve and the ten point mean roughness Rz across a reference length of 500 nm and the lower the better they are. At present, the lower limit values are about 0.7° for the half-value width of a rocking curve and about 0.10 nm for the ten point mean roughness Rz across a reference length of 500 nm.

Also where the oxide thin film is an epitaxial film of a high purity $ZrO_2$ composition containing at least 93 mol % of Zr based on the amount of only constituent elements excluding oxygen, although the prior art failed to produce such a unidirectionally oriented film as previously mentioned, the present invention first succeeded in producing a $ZrO_2$ thin film in the form of a unidirectionally oriented epitaxial film of high purity containing at least 93 mol % of Zr based on the amount of only constituent elements excluding oxygen.

The $ZrO_2$ thin film should preferably contain at least 93 mol %, more preferably at least 95 mol %, especially at least 98 mol %, further especially at least 99.5 mol % of Zr, based on the amount of only constituent elements excluding oxygen. The higher the purity, the higher is the insulating resistance and the less is the leakage current. Then the film is suitable for use as an insulating substrate.

The upper limit of the Zr content is 99.99% at present.

The oxide thin film may contain less than 7 mol % of impurities such as rare earth alloys and phosphorus.

Desirably the $ZrO_2$ thin film contains crystals having only a single orientation plane and has a ten point mean roughness Rz of up to 2 nm across a reference length of 500 nm over at least 80%, preferably at least 90%, especially at least 95% of its surface. As mentioned above, the film possessing only a single orientation plane and improved surface properties affords a good interface with a functional film to be formed thereon. Therefore, the film improves interfacial properties, maintains satisfactory insulating properties, and ensures good device characteristics. The half-value width of a rocking curve is the same as mentioned above.

An RHEED image of the $ZrO_2$ thin film is very highly streaky. That is, the RHEED image contains many sharp streaks. These facts prove that the $ZrO_2$ thin film is a single crystal film and exerts good function on use as a dielectric layer for MIS capacitors due to the eliminated disturbance of physical quantities by grain boundary.

Although the thickness of the oxide thin film varies with its application, it is preferably about 5 to 500 nm, more preferably about 50 to 150 nm thick as the buffer layer. As the buffer layer, the oxide thin film should preferably have a thickness of the order that does not detract from its crystallinity and surface properties. Where the oxide thin film is used as an oxide layer for semiconductor devices, for example, a dielectric layer of a MIS capacitor and a gate oxide layer of MISFET, it is preferably 0.5 to 50 nm, especially 1 to 30 nm thick.

On the oxide thin film is formed a functional film which is an epitaxial film mainly having a perovskite structure. Examples are high-temperature superconducting films such as bismuth series oxide superconducting films and $YBa_2Cu_3O_{7-\delta}$ (YBCO) superconducting films, ferroelectric films such as $BaTiO_3$, $PbTiO_3$, PZT, PLZT, other lead series perovskite compounds, bismuth series perovskite compounds, and bismuth layer compounds, and conductive films of oxides such as $La_{1-x}Sr_xCoO_3$ and $La_{1-x}Sr_xCa_xRuO_3$. The oxide thin film is also suitable as a substrate on which a film is grown such as (Sn doped) $In_2O_3$, other oxide conductive films, semiconductors and metals such as Pt, Si, Ge, and GaAs.

The substrate for use in electronic devices according to the invention is a large area substrate with a uniform oxide thin film, which may have an area of at least 10 $cm^2$, for example. This renders quite inexpensive not only the substrate itself, but also an electronic device manufactured using the substrate, compared to the prior art. No particular upper limit need be imposed on the substrate area while the substrate area may accommodate the current mainstream semiconductor process using silicon wafers of 2 to 8 inches, typically 6 inches.

Next, the method for forming an oxide thin film according to the present invention is described in detail.

In the practice of the method of the invention, an evaporation apparatus as shown in FIG. 1 is desirably used.

The evaporation apparatus 1 includes a vacuum chamber 1a in which a holder 3 for holding a single crystal substrate 2 at a lower side thereof is disposed. The holder 3 is connected to a motor 5 through a rotating shaft 4 so that the motor 5 may drive the holder 3 to rotate the single crystal substrate 2 within its plane. A heater 6 is built in the holder 3 for heating the single crystal substrate 2.

The evaporation apparatus 1 also includes an oxidizing gas supply 7 having an oxygen gas supply port 8 disposed immediately below the holder 3. Then an oxidizing gas is supplied so as to establish a high partial pressure in the proximity of the single crystal substrate 2. Disposed below the holder 3 is a zirconium evaporation section 9 and a rare earth metal evaporation section 10. These zirconium evaporation section 9 and rare earth metal evaporation section 10 include respective metal sources and energy supply means for supplying evaporating energy to the metal sources, such as electron beam emitters. Note that P in FIG. 1 designates a vacuum pump.

Now a first method for forming an oxide thin film is described and a second method is then described.

In the first method according to the invention, a single crystal substrate is mounted in the holder. The single crystal substrate used herein is a single crystal substrate of silicon and its (100) or (111) surface is selected as the substrate surface on which an intended oxide thin film is to be formed. Such a choice is made in order that a functional film to be formed on the substrate surface be an epitaxially grown single crystal having an appropriate orientation. The substrate used herein is preferably a mirror finished wafer which has been cleaned by etching. Etching for cleaning is done using an aqueous solution of 40% ammonium fluoride.

Next, the vacuum chamber is evacuated to about $10^{-5}$ Torr or higher ($\leq 10^{-5}$ Torr) by means of a vacuum pump before the single crystal substrate is heated. In order to avoid oxidation of the single crystal substrate during heating, the vacuum chamber is evacuated to as high vacuum as possible. No particular upper limit is imposed on the degree of vacuum and a vacuum of about $5 \times 10^{-6}$ Torr is typically used with operation efficiency taken into account. The heating temperature is preferably 400° C. or higher for crystallization of $ZrO_2$, more preferably about 750° C. or higher for providing better crystallinity, most preferably about 850° C. or higher for providing film crystal surface flatness on the molecular level. It is noted that the upper limit of the heating temperature of the single crystal substrate is about 1,300° C.

Next, at least zirconium selected from zirconium and a rare earth metal (yttrium is typically used herein) is evaporated by heating with electron beams or the like. At this point, admission of an oxidizing gas into the vacuum chamber (to be described later) has not been started.

The time schedule of supplying Zr and Y and an oxidizing gas toward the single crystal substrate is that the supply of oxidizing gas should never be earlier. If oxidizing gas is supplied earlier, it reacts with the substrate surface to form an oxide layer. This layer prevents the crystal lattice information from being transmitted to a film composed mainly of $ZrO_2$, restraining epitaxial growth. The optimum timing of oxygen supply is after at least zirconium selected from zirconium and a rare earth metal has been supplied in such an amount that provided that all the metal elements arriving at the substrate surface form a metal thin film, the metal thin film reaches a thickness of up to 5 nm, especially 0.01 to 5 nm. The supply of zirconium and a rare earth metal is effective for reducing and removing the oxide which has been formed in a trace amount prior to film formation, allowing the substrate lattice information to be transmitted to a film composed mainly of $ZrO_2$ and hence, epitaxial growth to smoothly take place.

Reference is now made to formation of a YSZ film on a silicon substrate, for example. Metallic zirconium and metallic yttrium undergo the following oxidation reactions at 1,000K.

$Zr+O_2=ZrO_2$ $4/3Y+O_2=2/3Y_2O_3$

ΔG=–187.6 kcal/mol
ΔG=–227.1 kcal/mol

In both the cases, the free energy change is negative and of great magnitude. This indicates that Zr and Y are liable to oxidation and act as a reducing agent. Assume solid phase reaction with $SiO_2$ on the silicon substrate surface.

$SiO_2+Zr=ZrO_2+Si$
ΔG=–43.129 kcal/mol

It is presumed from ΔG that $SiO_2$ is reduced by Zr. This is also true for Y. This reaction enables removal of an oxide coating from the substrate surface immediately before film formation. That is, by supplying metallic Zr+Y prior to formation of YSZ film and thereafter supplying oxygen, Zr, and Y to grow YSZ, satisfactory epitaxial growth of YSZ can be accomplished. Understandably, if the substrate surface has an acceptable degree of non-oxidation, the supply of metals to the substrate by evaporation and the supply of oxidizing gas may be concurrent.

Next, metallic zirconium, a rare earth metal (which is typically yttrium in the following description) and an oxidizing gas are supplied to the single crystal substrate to form a thin film composed mainly of $ZrO_2$ thereon. The film deposition rate is preferably 0.05 to 1.0 nm/s, more preferably 0.100 to 0.500 nm/s for the reason that a slower rate will invite oxidation of the substrate and a faster rate will result in a thin film having poor crystallinity and an irregular surface. Accordingly, an optimum value of film deposition rate is determined by the amount of oxygen introduced. Then, prior to deposition of a thin film composed mainly of $ZrO_2$, the amounts per unit time of Zr and Y metals evaporated to form Zr, Y, $ZrO_2$, and $Y_2O_3$ deposited films as a function of the power applied to the respective evaporation sources are previously determined and calibrated for each of the metals using a film gage disposed near the substrate within the vacuum chamber. The oxidizing gas used herein may be oxygen, ozone, atomic oxygen, and $NO_2$. The embodiment using oxygen is described hereinafter. While the vacuum evaporation chamber is continuously evacuated by the vacuum pump, oxygen is continuously injected at a rate of 2 to 50 cc/min., preferably 5 to 25 cc/min. through a nozzle disposed within the chamber to establish an oxygen atmosphere of the order of $10^{-4}$ to $10^{-2}$ Torr at least in the proximity of the single crystal substrate in the chamber. Since the optimum oxygen amount depends on the size of the chamber, the rate of evacuation of the pump and other factors, an appropriate flow rate is previously determined. The upper limit of the oxygen gas pressure is set at $10^{-2}$ Torr in order that the metal source in the evaporation source in the vacuum chamber be evaporated at a constant rate without deteriorating the metal source. Oxygen gas may be introduced into the vacuum evaporation chamber by injecting oxygen gas toward the surface of the single crystal substrate from the vicinity thereof to establish an atmosphere of a high oxygen partial pressure only in the proximity of the single crystal substrate whereby reaction on the substrate can be more promoted with a smaller amount of oxygen introduced. Since the vacuum chamber is continuously evacuated, the majority of the vacuum chamber is at a low pressure of $10^{-4}$ to 10–6 Torr. On a region of the single crystal substrate as narrow as about 1 cm², oxidation reaction on the single crystal substrate can be promoted by this procedure. In order to form a film on a large single crystal substrate having an area of at least 10 cm², for example, an area of 2 inches in diameter, the substrate is rotated as shown in FIG. 1 and oxygen under a high partial pressure is supplied to the entire surface of the substrate. Film deposition over a large area is then possible. In this regard, the substrate is preferably rotated at 10 rpm or higher. At slower revolution, compositional distributions of Zr, Y, and O are created in both film thickness and in-plane directions. The upper limit is not particularly imposed on the revolution of the substrate although it is about 120 rpm because of the mechanical restriction of the vacuum apparatus.

The addition of a rare earth metal (inclusive of Y) to $ZrO_2$ has the following benefits.

A $ZrO_2$ bulk body undergoes a phase transition of cubic →tetragonal→monoclinic crystal as the temperature descends from high temperature to room temperature. Adding a rare earth metal (inclusive of Y) to $ZrO_2$ in order to stabilize its cubic crystal results in stabilized zirconia. In order that $ZrO_2$ be utilized as a buffer layer for perovskite crystal growth, it is preferred to use a cubic crystal film having high symmetry. Therefore, metal elements, zirconium and rare earth metal (inclusive of Y) are concurrently evaporated from distinct evaporation sources at a controlled ratio of zirconium/rare earth metal to co-deposit on the single crystal substrate. In this regard, the molar ratio of rare earth metal (inclusive of Y) to zirconium from the evaporation sources should preferably from 0/1 to 3.0/1, preferably 0.25/1 to 1.0/1. Then an oxide thin film having the preferred compositional ratio mentioned above is obtained.

Next the second formation method is described. In this method, a single crystal substrate is first mounted on the holder. The single crystal substrate used herein is a single crystal substrate of silicon and its (100) or (111) face is selected as the substrate surface on which an intended oxide thin film is to be formed. Such a choice is made in order that a functional film to be formed on the substrate surface be an epitaxially grown single crystal having an appropriate orientation. The substrate used herein is preferably a mirror finished wafer which has been cleaned by etching. Etching for cleaning is done using an aqueous solution of 40% ammonium fluoride or the like. The single crystal substrate of silicon used for the fabrication of an MIS capacitor according to the present invention may have a substrate area of 10 cm² or more, for example. Then the MIS capacitor can be quite inexpensive compared to conventional ones. The upper limit of the substrate area is not particularly limited although it is about 400 cm² under the current circumstances. The substrate area of this order may accommodate the current mainstream semiconductor process using silicon wafers of 2 to 8 inches, typically 6 inches.

Since the single crystal silicon substrate as cleaned is highly reactive, it is treated on the surface for the purposes of protecting the substrate surface and allowing a satisfactory epitaxial film composed mainly of $ZrO_2$ to grow.

First the single crystal silicon substrate as cleaned on its surface is placed in a vacuum chamber and heated while introducing an oxidizing gas, thereby forming a silicon oxide layer on the surface of the single crystal silicon substrate. The oxidizing gas used herein may be oxygen, ozone, atomic oxygen, and $NO_2$. Since the cleaned surface of the single crystal silicon substrate is highly reactive as mentioned above, the silicon oxide layer is used as a protective film for protecting the single crystal silicon substrate's surface from rearrangement and contamination. The silicon oxide layer is preferably about 0.2 to 10 nm thick. A layer of less than 0.2 nm thick provides incomplete protection of the silicon surface. The reason for the upper limit of 10 nm is described later.

The heating of the substrate includes holding at 300° to 700° C. for 0 to about 10 minutes. The heating rate is about 30° to 70° C./min. With higher temperatures or quicker heating rates, formation of a silicon oxide film is insufficient.

Conversely, with lower temperatures or longer holding times, a silicon oxide film becomes too thick.

Introduction of an oxidizing gas is preferably carried out, where oxygen is used as the oxidizing gas, for example, by first evacuating the vacuum chamber to a vacuum of about $1\times10^{-7}$ to $1\times10^{-4}$ Torr and introducing the oxidizing gas to establish an atmosphere having an oxygen partial pressure of $1\times10^{-4}$ Torr at least in the proximity of the single crystal silicon substrate. The oxygen partial pressure of the atmosphere reaches the upper limit where pure oxygen is used, although air may also be used. An oxygen partial pressure of about 1×10–1 Torr or lower ($\leq 1\times10^{-1}$ Torr) is especially preferred.

After the above-mentioned step, the substrate is heated in vacuum. Since the silicon surface crystals are protected by the protective film, any contamination, for example, formation of a SiC Film by reaction with the residual gas, hydrocarbon is avoided.

Preferably the heating temperature is 600° to 1,200° C., especially 700° to 1,100° C. At temperatures below 600° C., a 1×1 structure to be described later is not available on the surface of the single crystal silicon substrate. At temperatures above 1,200° C., the protective film provides insufficient protection to the silicon surface crystals, allowing the single crystal silicon substrate to be disordered in crystallinity.

Next, zirconium and an oxidizing gas or zirconium, a rare earth metal (inclusive of Y), and an oxidizing gas are supplied to the surface. In this step, the metals including zirconium function to reduce the protective film of silicon oxide formed in the preceding step and extinguish it. At the same time, zirconium and oxygen or zirconium, rare earth metal (inclusive of Y) and oxygen form a 1×1 surface structure on the thus exposed surface of the silicon surface crystals. In the practice of the invention, at least one metal selected from alkaline earth metals, rare earth metals (inclusive of Sc and Y), zirconium, and hafnium may be used instead of the above-mentioned zirconium.

More particularly, the silicon substrate of the invention is of silicon single crystal and its surface has substantially a 1×1 surface structure formed of at least one metal selected from alkaline earth metals, rare earth metals (inclusive of Sc and Y), zirconium, and hafnium and oxygen.

Figure 2:
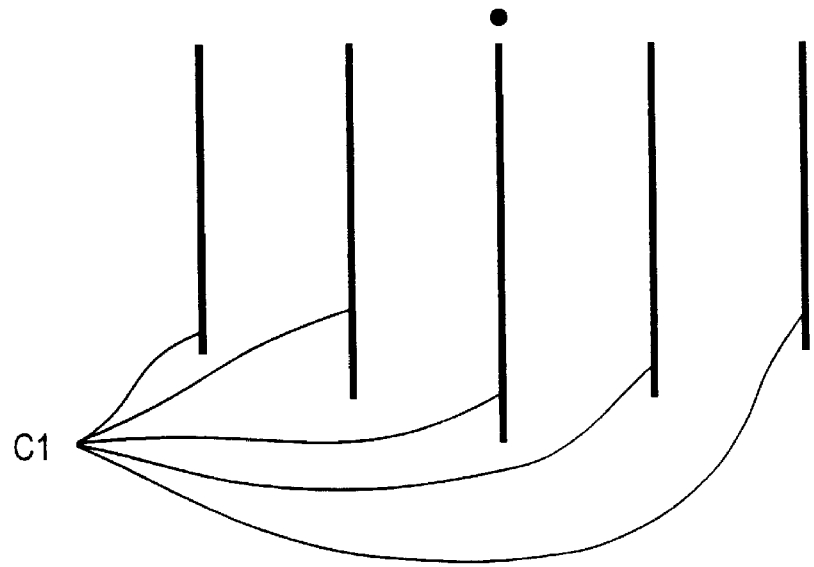
FIG. 2(a) is a diagram showing a RHEED pattern of a 1×1 surface structure.
FIG. 2(b) is a diagram showing a RHEED pattern of a 2×1, 1×2 or mixed surface structure.
Figure 2:
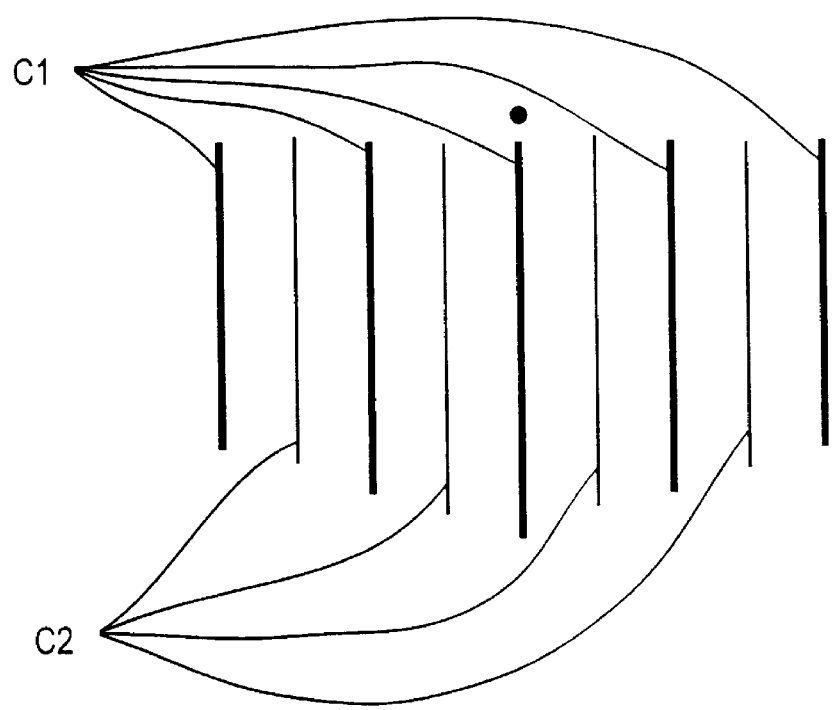

The surface structure can be examined by observing an image pattern by reflection high energy electron diffraction (to be referred to as RHEED, hereinafter). In the case of the 1×1 surface structure the present invention addresses, for example, a pattern of complete streaks having a factor one periodicity C1 as shown in FIG. 2(a) is obtained for electron beam incident direction [110]. The same pattern is obtained for incident direction [1-10]. On the other hand, the cleaned surface of the single crystal substrate has a surface structure of 1×2, 2×1 or a mixture of 1×2 and 2×1. In this case, the pattern of a RHEED image is a pattern having a one factor periodicity C1 and a two factor periodicity C2 as shown in FIG. 2(b) for either one or both of electron beam incident directions [110] and [1-10]. In the RHEED pattern of the 1×1 surface structure according to the invention, the two factor periodicity C2 as shown in FIG. 2(b) is not observed in both electron beam incident directions [110] and [1-10].

The cleaned silicon surface sometimes shows a 1×1 structure. It was observed several times in our experiments. The conditions under which a 1×1 structure is available are indefinite, and it is impossible under the current circumstances to produce a 1×1 structure on the cleaned silicon surface in a consistent reproducible manner.

A cleaned silicon surface of a 1×2, 2×1 or 1×1 structure is susceptible to contamination in vacuum at high temperature and especially reacts with hydrocarbons in the residual gas to form SiC on the surface, whereby the crystals on the substrate surface are disordered. This is the reason why it has been impossible to consistently produce a 1×1 structure suitable for crystal growth of an oxide film on a silicon substrate.

The surface exhibiting a 1×1 surface structure according to the present invention is formed by interaction of at least one metal M selected from alkaline earth metals, rare earth metals (inclusive of Sc and Y), zirconium, and hafnium, oxygen, and silicon. This surface is free from contamination in vacuum, stable and suitable as a substrate on which an oxide crystal is grown.

When two or more metals M are used, their ratio is not critical.

It is understood that the alkaline earth metals include calcium Ca, strontium Sr, barium Ba, radium Ra, beryllium Be, and magnesium Mg. Also the rare earth metals include yttrium Y, lanthanum La, cerium Ce, praseodymium Pr, neodymium Nd, promethium Pm, samarium Sm, europium Eu, gadolinium Gd, terbium Tb, dysprosium Dy, holmium Ho, erbium Er, thulium Tm, ytterbium Yb, lutetium Lu, and scandium Sc.

The silicon substrate of the invention allows an epitaxial film to effectively grow on its surface, the film being of the composition: $Zr_{1-x}R_xO_{2-\delta}$ wherein R is a rare earth metal inclusive of Y, x is a number of 0 to 0.75, preferably 0.2 to 0.50, and δ is usually a number of 0 to 0.5, and perovskite.

Examples of the epitaxial film of the perovskite structure include high-temperature superconducting films such as bismuth series oxide superconducting films and $YBa_2Cu_3O_{7-\delta}$ (YBCO) superconducting films, ferroelectric films such as $BaTiO_3$, $PbTiO_3$, PZT, PLZT, other lead series perovskite compounds, bismuth series perovskite compounds, and bismuth layer compounds, and conductive films of oxides such as $La_{1-x}Sr_xCoO_3$ and $La_{1-x}Sr_xCa_xRuO_3$. The substrate is also suitable as a substrate on which films such as (Sn doped) $In_2O_3$, other oxide conductive films, semiconductors and metals such as Pt, Si, Ge, and GaAs are grown.

Next, a method for surface treating a silicon substrate according to the present invention is described.

First a silicon oxide layer is formed on a single crystal silicon substrate. The silicon oxide layer is preferably formed by a so-called thermal oxidation technique involving placing a single crystal silicon substrate whose surface has been cleaned in a vacuum chamber and heating the substrate while introducing an oxidizing gas. Since the cleaned surface of the single crystal silicon substrate is highly reactive as previously mentioned, the silicon oxide layer is used as a protective film for protecting the single crystal silicon substrate's surface from rearrangement and contamination. The surface of the single crystal silicon substrate used is preferably a (100) face. The silicon oxide layer is preferably about 0.2 to 10 nm thick, especially 0.5 to 10 nm thick. A layer of less than 0.2 nm thick provides incomplete protection of the silicon surface. The reason for the upper limit of 10 nm is described later.

With respect to the step of forming a silicon oxide layer, the silicon oxide layer should be thin because it is removed in a subsequent step and be continuous because it must protect the silicon substrate crystals.

For this reason, the above-mentioned technique is desirable. Other techniques, for example, a spontaneous oxidation technique and a sputtering technique of forming silicon oxide sometimes provide incomplete protection of silicon substrate crystals because a film can be formed in an island pattern when it is thin.

The oxidizing gas used herein may be oxygen, ozone, atomic oxygen, and $NO_2$. Where oxygen is used as the oxidizing gas, for example, introduction of oxygen is preferably carried out by first evacuating the vacuum chamber to a vacuum of about $1 \times 10^{-7}$ to $1 \times 10^{-4}$ Torr and introducing oxygen to establish an atmosphere having an oxygen partial pressure of $1 \times 10-4$ Torr or higher ($\leq 1 \times 10^{-4}$ Torr) at least in the proximity of the single crystal silicon substrate. The upper limit of oxygen partial pressure of the atmosphere is not critical, pure oxygen or air may be used, and an oxygen partial pressure of about $1 \times 10^{-1}$ Torr or lower is preferred.

The heating of the substrate preferably includes holding at 300° to 700° C., especially 500° to 700° C. for 0 to about 10 minutes. The heating rate is preferably about 30° to 70° C./min. With higher temperatures or quicker heating rates, formation of a silicon oxide film is insufficient. Conversely, with lower temperatures or longer holding times, a silicon oxide film becomes too thick.

Beside the above-mentioned thermal oxidation technique, formation of a silicon oxide layer can be carried out by a sputtering technique using a $SiO_2$ target, an evaporation technique or the like while a thin continuous protective film is preferred as previously mentioned.

After the above-mentioned step, the substrate is heated at a predetermined temperature in vacuum. Since the silicon surface crystals are protected by the protective film, any contamination, for example, formation of a SiC film by reaction with the residual gas, hydrocarbon is avoided.

Desirably the heating temperature is 600° to 1,200° C., especially 700° to 1,100° C. At temperatures below 600° C., a 1×1 structure to be described later is sometimes not available. At temperatures above 1,200° C., the protective film and silicon would evaporate to disorder the silicon crystals.

Next, at least one metal selected from alkaline earth metals, rare earth metals (inclusive of Sc and Y), zirconium, and hafnium and an oxidizing gas are supplied to the surface. In this step, the metal functions to reduce the protective film of silicon oxide formed in the preceding step and extinguish it. At the same time, at least one metal selected from alkaline earth metals, rare earth metals (inclusive of Sc and Y), zirconium, and hafnium and oxygen form a 1×1 surface structure on the thus exposed surface of the silicon surface crystals. The oxidizing gas used herein may be selected from the above-mentioned ones.

The amount of metal fed is preferably about 0.3 to 10 nm, especially about 3 to 7 nm per unit area calculated as an oxide of an alkaline earth metal, rare earth metal (inclusive of Sc and Y), zirconium or hafnium. Less than 0.3 nm would not fully exert the effect of reducing silicon oxide. With amounts of more than 10 nm, asperities as observed at the atomic level tend to develop at the surface and such asperities deprive the surface crystal arrangement of the 1×1 structure. The upper limit of the thickness of the silicon oxide layer is 10 nm because above 10 nm, there is a possibility that the metal do not fully reduce the silicon oxide layer even when the metal is fed as above.

Introduction of an oxidizing gas is preferably carried out, where oxygen is used as the oxidizing gas, for example, so as to establish an atmosphere having an oxygen partial pressure of about $1 \times 10^{-4}$ to $1 \times 10^{-1}$ Torr at least in the proximity of the substrate. The optimum amount of oxygen fed is determined by the size of the vacuum chamber, evacuation rate of the vacuum pump and other factors. It is recommended to previously determine an optimum flow rate, which is preferably about 2 to 50 cc/min.

The above-mentioned surface treatment of a silicon substrate has the following advantages.

The surface structure covering several atom layers at the crystal surface possess is generally different from the atom arrangement structure of an imaginary surface obtained when a bulk crystal (three-dimensional large crystal) structure is sectioned. Since the surrounding situation of atoms exposed at the surface is changed by the removal of crystals on one side, the exposed atoms accordingly tend to assume a lower energy stable state. As a general rule, this structural change results in a mere relaxation of atom positions in some cases and induces atom recombination to form a rearrangement structure in other cases. The former occurs on most crystal surfaces. The latter generally forms a superlattice structure at the surface. Provided that a and b are the magnitudes of unit vectors of a bulk surface structure, if a superlattice structure having magnitudes ma and nb is created, it is referred to as a mxn structure. The cleaned silicon (100) surface becomes a complex superstructure having a large unit mesh of a 1×2 or 2×1 structure, and the cleaned silicon (111) surface becomes a complex superstructure having a large unit mesh of a 7×7 or 2×8 structure. These cleaned silicon surfaces are highly reactive and especially at the temperature at which an oxide thin film is epitaxially formed (at least 700° C.), tend to react with the residual gases in vacuum, typically hydrocarbons to form SiC at the surface to contaminate the substrate surface and disorder the surface crystals.

In order that oxide epitaxially grow on a silicon substrate, the structure of the silicon surface must be stable and play the role of transmitting the crystal structure information to an oxide film to be grown. For oxide epitaxial film crystals, the atom arrangement structure seemed to appear when a bulk crystal structure is sectioned is a 1×1 structure. Then for the surface structure of a substrate on which an oxide is to be epitaxially grown, a complex superstructure having a large unit mesh of a 1×2, 2×1, 7×7 or 2×8 structure is unfavorable and a stable 1×1 structure is necessary. Since epitaxial growth is carried out at a temperature of 700° C. or higher, it is necessary to protect a reactive silicon surface.

Then, a unidirectionally oriented epitaxial film composed mainly of $ZrO_2$ is formed using a silicon single crystal substrate which has been surface treated as mentioned above.

In forming a unidirectionally oriented epitaxial film composed mainly of $ZrO_2$, a silicon single crystal substrate which has been surface treated is first heated. The heating temperature for film formation is desirably at least 400° C. for crystallization of $ZrO_2$, more desirably at least about 750° C. for improved crystallinity, most desirably at least 850° C. for achieving film crystal surface flatness on the molecular level. The upper limit of the heating temperature of the single crystal substrate is about 1,300° C.

Thereafter, zirconium is heated and evaporated by electron beams or the like. Metallic zirconium and an oxidizing gas are supplied to the single crystal substrate. If necessary, a rare earth metal (inclusive of Y) is similarly supplied. A film composed mainly of $ZrO_2$ is obtained in this way. At this point, the film deposition rate is desirably 0.05 to 1.00 nm/s, especially 0.100 to 0.500 nm/s for the reason that slower rates allow oxidation of the substrate whereas faster rates result in a thin film having poor crystallinity and an irregular surface. Therefore, an optimum value of film deposition rate is determined in accordance with the amount of oxygen introduced. Then, prior to evaporation of a $ZrO_2$ thin film, the amounts per unit time of metallic zirconium and a rare earth metal (inclusive of Y) evaporated to form metal and metal oxide deposited films as a function of the power applied to the respective evaporation sources are previously determined and calibrated for each of the metals using a film gage disposed near the substrate within the vacuum evaporation chamber. The oxidizing gas used herein may be oxygen, ozone, atomic oxygen, and $NO_2$. The embodiment using oxygen is described hereinafter. While the vacuum evaporation chamber is continuously evacuated by the vacuum pump, oxygen is continuously injected at a rate of 2 to 50 cc/min., preferably 5 to 25 cc/min. through a nozzle disposed within the chamber to establish an oxygen atmosphere of the order of about $10^{-3}$ to $10^{-1}$ Torr at least in the proximity of the single crystal substrate in the chamber. Since the optimum oxygen amount depends on the size of the chamber, the rate of evacuation of the pump and other factors, an appropriate flow rate is previously determined. The upper limit of the oxygen gas pressure is set at 10 Torr in order that the metal source in the evaporation source in the vacuum chamber be evaporated at a constant rate without deteriorating the metal source. Oxygen gas may be introduced into the vacuum evaporation chamber by injecting oxygen gas toward the surface of the single crystal substrate from the vicinity thereof to establish an atmosphere of a high oxygen partial pressure only in the proximity of the single crystal substrate whereby reaction on the substrate can be more promoted with a smaller amount of oxygen introduced. Since the vacuum chamber is continuously evacuated, the majority of the vacuum chamber is at a low pressure of $10^{-4}$ to $10^{-6}$ Torr.

On a region of the single crystal substrate as narrow as about 1 cm², oxidation reaction on the single crystal substrate can be promoted by this procedure. In order to form a film on a large single crystal substrate having an area of at least 10 cm², for example, an area of 2 inches in diameter, the substrate is rotated as shown in FIG. 1 and oxygen under a high partial pressure is supplied to the entire surface of the substrate. Film deposition over a large area is then possible. In this regard, the substrate is preferably rotated at 10 rpm or higher. At slower revolution, a film thickness distribution is created in the substrate plane. The upper limit is not particularly imposed on the revolution of the substrate although it is about 120 rpm because of the mechanical restriction of the vacuum apparatus.

While the preparation method has been described in detail, this preparation method is suitable for producing an end product of high completeness to a large area in a reproducible manner because it can be carried out in an atmosphere where no impurities are involved and under easily controllable conditions as will become evident from a comparison with conventional vacuum evaporation, sputtering and laser ablation techniques. When the same method is carried out using a MBE apparatus, an end thin film can be similarly produced.

The thus obtained substrate for use in electronic devices can be processed by a semiconductor process, without modifying its structure, and constructed as a capacitor and gate for DRAM by substituting for the conventional $SiO_2$. By forming silicon on the substrate as a functional film, it can be applied as a SOI device. By forming a functional film of ferroelectric or superconducting material on the substrate, it can be applied as non-volatile memory, infrared sensors, optical modulators, optical switch OEIC, SQUID, Josephson devices, superconducting transistors, electromagnetic sensors, and superconducting wire LSIs.

The silicon substrate of the invention allows an epitaxial film to effectively grow on its surface, the film being of the composition: $Zr_{1-x}R_xR^x{}_yO_{2-\delta}$ wherein R is a rare earth metal inclusive of yttrium, x is a number of 0 to 0.75, preferably 0.2 to 0.50, and $\delta$ is usually a number of 0 to 0.5, and perovskite.

Examples of the epitaxial film of the perovskite structure include high-temperature superconducting films such as bismuth series oxide superconducting films and $YBa_2Cu_3O_{7-\delta}$ (YBCO) superconducting films, ferroelectric films such as $BaTiO_3$, $PbTiO_3$, PZT, PLZT, other lead series perovskite compounds, bismuth series perovskite compounds, and bismuth laminar compounds, and conductive films of oxides such as $La_{1-x}Sr_xCoO_3$ and $La_{1-x}Sr_xCa_xRuO_3$. The substrate is also suitable as a substrate on which films such as (Sn doped) $In_2O_3$, other oxide conductive films, semiconductors and metals such as Pt, Si, Ge, and GaAs are grown.

In the present invention, the MIS semiconductor device designates a semiconductor device having a metal oxide insulating layer on a silicon single crystal substrate. Exemplary MIS semiconductor devices are MIS capacitors and MISFETs.

Figure 3:
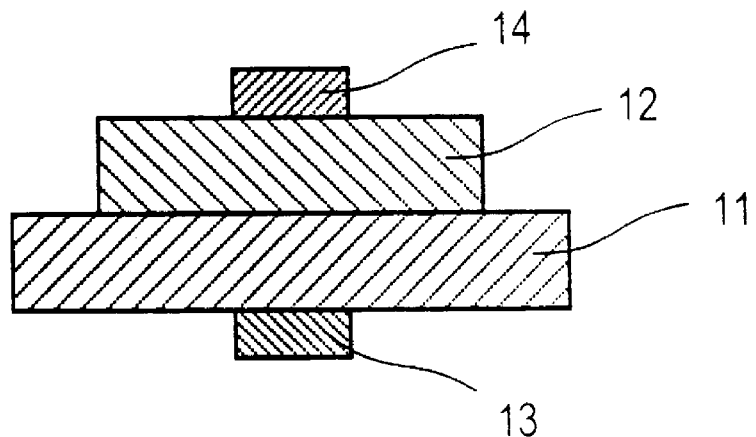
FIG. 3 is a cross-sectional view showing the basic structure of a MIS capacitor.

The MIS capacitor according to the invention is shown in FIG. 3 as comprising a silicon single crystal substrate 11, a dielectric layer 12 in the form of a $ZrO_2$ thin film formed on the single crystal substrate 11, and a pair of electrodes 13 and 14. That is, the MIS capacitor uses a metal oxide insulating layer as the dielectric layer.

Figure 4:
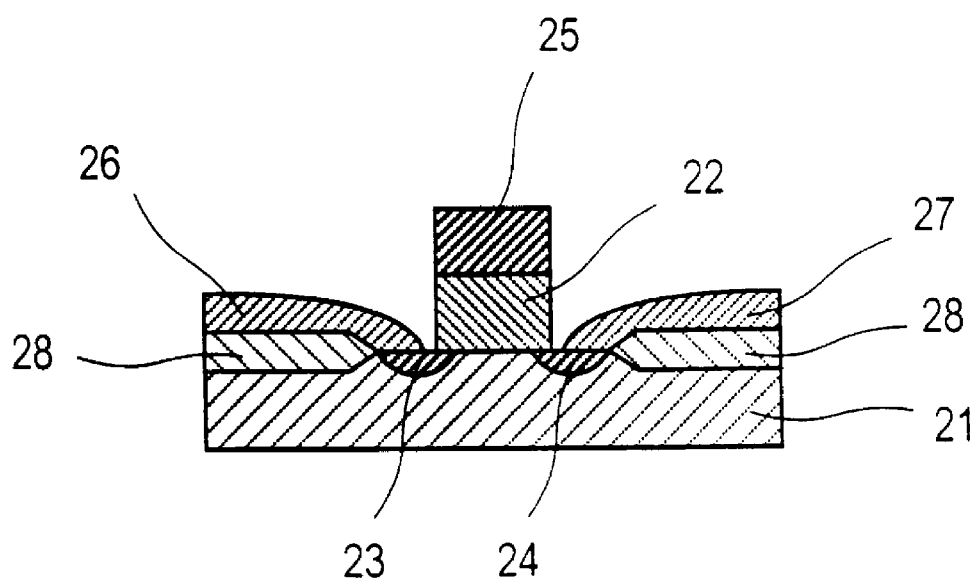
FIG. 4 is a cross-sectional view showing the basic structure of a MISFET.

The MISFET according to the invention is shown in FIG. 4 as comprising a silicon single crystal substrate 21, a gate oxide layer 22 in the form of a $ZrO_2$ thin film formed on the single crystal substrate 21, source and drain 23 and 24, a gate electrode 25, source and drain electrodes 26 and 27, and an insulating layer 28. That is, the MISFET uses a metal oxide insulating layer as the gate oxide layer.

In the present invention, the composition and crystal structure of a $ZrO_2$ thin film itself are common among MIS capacitors and MISFETs.

The $ZrO_2$ thin film is a unidirectionally oriented epitaxial film which is composed mainly of $ZrO_2$ and preferably contains at least 93 mol %, especially at least 95 mol %, more preferably at least 98 mol %, most preferably at least 99.5 mol % of Zr based on the amount of constituent elements of the film excluding oxygen. It was empirically found that the higher the purity, the less hysteresis the C-V curve develops and the higher the insulating resistance of $ZrO_2$ is, and the lower the leakage current is. When an MIS capacitor is applied to a semiconductor circuit, the increased leakage current not only produces noise, but disables circuit operation. This is also true for MISFET. Particularly when MISFET is used in DRAM, the memory holding capacity is aggravated.

The upper limit of the Zr content is 99.99% at present. The oxide thin film may contain less than 7 mol % of impurities such as rare earth metals and phosphorus.

Desirably the $ZrO_2$ thin film contains crystals having only a single orientation plane and has a ten point mean roughness Rz of up to 2 nm across a reference length of 500 nm over at least 80%, preferably at least 90%, especially at least 95% of its surface. As mentioned above, the film possessing only a single orientation plane and improved surface properties affords a good interface with an electrode or semiconductor to be formed thereon. Therefore, the film improves interfacial properties, maintains satisfactory insulating properties, and ensures good device characteristics. The percentage is a value obtained by carrying out measurement at arbitrary 10 or more points evenly distributed over the entire surface of the $ZrO_2$ thin film.

The $ZrO_2$ thin film preferably has a thickness of 0.5 to 50 nm, especially 1 to 30 nm. A $ZnO_2$ thin film of thinner than 0.5 nm tends to cause leakage when a device is constructed thereon because of an increased likelihood of pinholes occurring in the film. A too thick film would result in a reduced MIS capacity.

A reflection high energy electron diffraction (sometimes referred to as RHEED, hereinafter) image of the $ZrO_2$ thin film is highly streaky. That is, the RHEED image contains many sharp streaks. These facts prove that the $ZrO_2$ thin film is a single crystal film and exerts good function on use as a dielectric layer for MIS capacitors due to the eliminated disturbance of physical quantities by grain boundary.

In the MIS capacitors and MISFETs according to the invention, the substrate surface of a silicon single crystal substrate, that is, the surface on which a thin film is to be formed may be oxidized to a shallow extent (e.g., up to about 5 nm) to form a layer of $SiO_2$, etc. This is because oxygen in the $ZrO_2$ thin film can diffuse toward the surface of the silicon single crystal substrate. Some particular film forming techniques allow a silicon oxide layer to be left on the surface of the silicon substrate during formation of a $ZrO_2$ thin film. This $SiO_2$ layer resulting from shallow oxidation may be formed in not only the MIS capacitors and MISFETs, but also the thin films and substrates.

The MIS capacitors according to the invention yield little hysteresis in their C-V curve because highly pure $ZrO_2$ is formed to high crystallinity. Even if hysteresis is contained, it is less than 0.3 V as expressed by the width of voltage at a half value of C value (referred to as hysteresis value, hereinafter). The insulator in a metal-insulator-semiconductor (MIS) structure can have an apparent dielectric constant as large as about 20. The above-mentioned MIS capacitor can be a MISFET for DRAM by using the unidirectionally oriented epitaxial film of the above-mentioned $ZrO_2$ composition as a gate oxide layer and forming source and drain by a semiconductor process. As compared with prior art MIS capacitors using an insulating layer of $SiO_2$, the MIS capacitor of the invention can further increase the degree of integration which is approaching to the limit in the state of the art because the insulating layer has a 5 to 10 times greater dielectric constant of 10 to 20 than the prior art.

Figure 5:
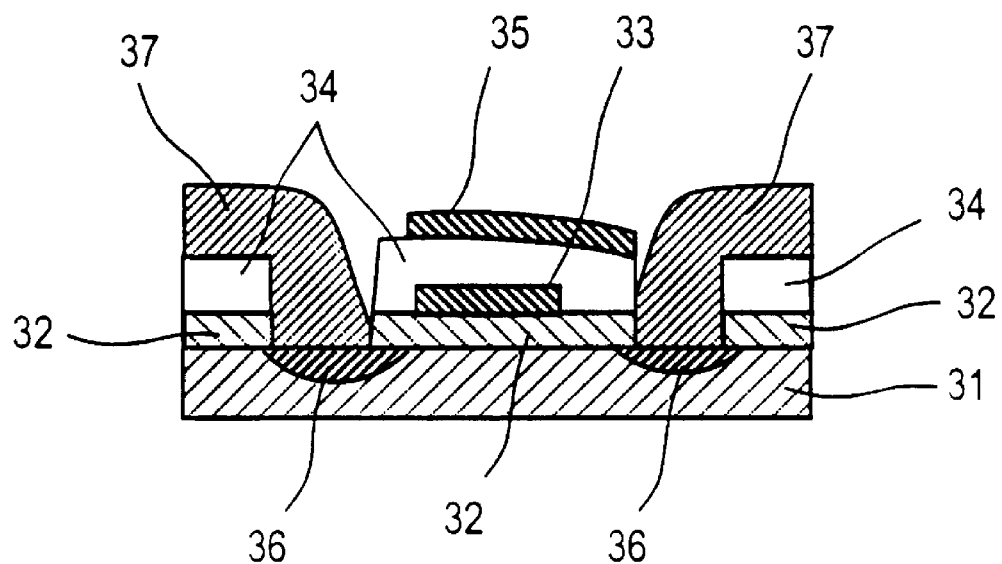
FIG. 5 is a cross-sectional view schematically showing the basic cell structure of a non-volatile semiconductor memory device according to the invention.

The non-volatile semiconductor memory device of the present invention may have a structure as shown in FIG. 5, for example. The non-volatile semiconductor memory device M of the invention include as a basic structure a single crystal silicon substrate 31, a tunnel oxide film 32 formed on the single crystal silicon substrate 31, a floating gate electrode 33 formed on the tunnel oxide film 32, an insulating film 34, a control electrode 35, source and drain regions 36, and metallization 37 connected to the control electrode 35 and source and drain regions 36 (the metallization connected to the control electrode 35 is not shown in the figure). It is noted that conventional semiconductor processes use aluminum for the control electrode 35 and metallization 37.

The tunnel oxide film in the non-volatile semiconductor memory device of the invention is constructed by an epitaxial film of the composition: $Zr_{1-x}R_xO_{2-\delta}$ wherein R is a rare earth metal inclusive of Y and x is a number of 0 to 0.75, preferably 0.2 to 0.50, formed on the single crystal silicon substrate, that is, the oxide thin film defined herein. This epitaxial film should preferably be a unidirectionally oriented one and the oxide thin film defined herein is used.

When an epitaxial film of the composition: $Zr_{1-x}R_xO_{2-\delta}$ defined herein is used as a tunnel oxide film in the non-volatile semiconductor memory device of the invention, good performance is exerted due to the eliminated disturbance of physical quantities by grain boundary.

That is, since the tunnel oxide film of the invention has an arrangement of high crystallinity, uniform crystals, upon application of a high electric field, a uniform electric field stress is imposed to the crystals without local application of the electric field because of the absence of grain boundaries. Then deterioration can be minimized.

Also upon application of a high electric field, it concentrates at angular portions of the electrode configuration at the tunnel oxide film interface. Since the surface of the tunnel oxide film of the invention is flat on the molecular level and the electrode-semiconductor interface contains no angular portions due to surface asperities, the electric field is applied uniformly. Therefore, deterioration of the tunnel oxide film by an applied high electric field is prevented.

Particularly when the composition is of highly pure $ZrO_2$, least impurities are contained and insulation is high. Containment of impurities has a risk that upon repetition of electron injection under a high electric field, trapping by the impurities in $ZrO_2$ would lead to conduction and leakage.

The floating gate electrode formed on the oxide thin film which is the tunnel oxide film mentioned above is preferably a silicon electrode. In the practice of the invention, silicon of the silicon electrode is preferably epitaxial silicon. If the floating gate electrode is an epitaxial silicon film, the interface between the tunnel oxide film and the floating gate electrode is flat on the atomic level and has a structure that crystals are continuous on the atomic level. Therefore, there is obtained an interface which is not disturbed and undergoes little change with time under application of a high electric field. Although the floating gate electrode used in the prior art is polycrystalline silicon, the invention wherein the tunnel oxide film is an epitaxial film allows the floating gate electrode formed thereon to be constructed by epitaxial silicon.

The epitaxial film forming the floating gate electrode generally has a thickness of about 50 nm.

In the practice of the invention, it is especially preferred that the floating gate electrode be formed by an epitaxial silicon film. The epitaxial silicon film may be formed by any of vacuum evaporation, sputtering, laser ablation, CVD, and MBE techniques while the above-mentioned technique of forming the oxide thin film is applicable without substantial modification except for the introduction of oxidizing gas.

In this regard, the vacuum chamber is made ultra-high vacuum of lower than $10^{-9}$ Torr ($\leq 10^{-9}$ Torr) with which conventional MBE growth conditions may be employed as such. A vacuum of about $10^{-7}$ Torr may be used although it is then necessary that the substrate temperature be as high as about 1,000° C. and the film deposition rate be as slow as about 0.05 nm/sec.

Figure 6:
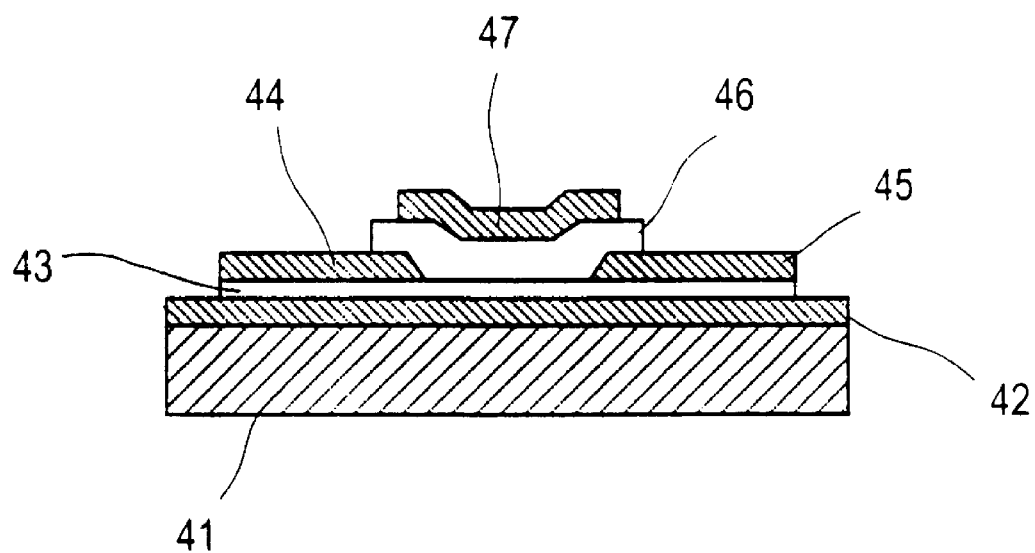
FIG. 6 is a cross-sectional view schematically showing the basic cell structure of a TFT as one exemplary SOI device according to the invention.

The SOI device of the invention is applicable to a thin film transistor (TFT), for example. Its basic structure is shown in FIG. 6. This TFT includes a single crystal silicon substrate 41, an insulating layer 42 formed thereon, a silicon semiconductor thin film 43 formed on the insulating layer 42, source and drain electrodes 44 and 45, a gate insulating layer 46, and a gate electrode 47 formed on the gate insulating layer 46.

The insulating layer in the SOI device of the invention is constructed by the oxide thin film defined herein, that is, an epitaxial film consisting essentially of $ZrO_2$ or rare earth metal-stabilized $ZrO_2$, that is, $Zr_{1-x}R_xO_{2-\delta}$ wherein R is a rare earth metal inclusive of Y and x is a number of 0 to 0.75, preferably 0.2 to 0.50, formed on a single crystal silicon substrate. The epitaxial film is preferably of C plane unidirectional orientation as mentioned above.

EXAMPLE

Examples of the invention are given below by way of illustration.

Example 1

Examples of the oxide thin film according to the invention are described below.

Example 1-1

As the single crystal substrate on which an oxide thin film was to be grown, there were used (1) a silicon single crystal which was cut so as to make (100) plane a surface and mirror polished and (2) a silicon single crystal which was cut so as to make (111) plane a surface and mirror polished. After purchase, the mirror surfaces were cleaned by etching with a 40% ammonium fluoride aqueous solution. All the single crystal substrates used were disk substrates having a diameter of 2 inches.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump and the substrate was heated to 850° C. and rotated. The number of revolutions was 20 rpm.

Thereafter, metallic zirconium and yttrium were supplied from their evaporation sources in a controlled Y/Zr molar ratio to 0.45/1. No oxygen was introduced at this point. When a feed amount corresponding to a Zr+Y alloy film's thickness of 1 nm was reached, oxygen gas was introduced from a nozzle at a rate of 10 cc/min. to react with the metals to form a YSZ film of about 150 nm thick.

Figure 7:
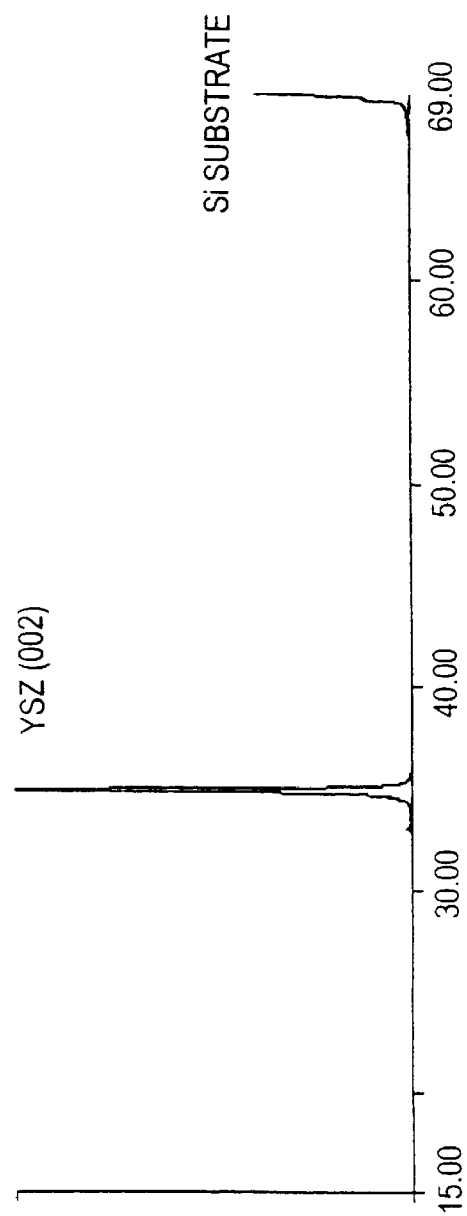
FIG. 7 is a X-ray diffraction diagram of a YSZ thin film on a single crystal substrate, FIGS. 7(a) and 7(b) using as the single crystal substrate a single crystal substrate of single crystal silicon with (100) plane and a single crystal substrate of single crystal silicon with (111) plane, respectively.
Figure 7:
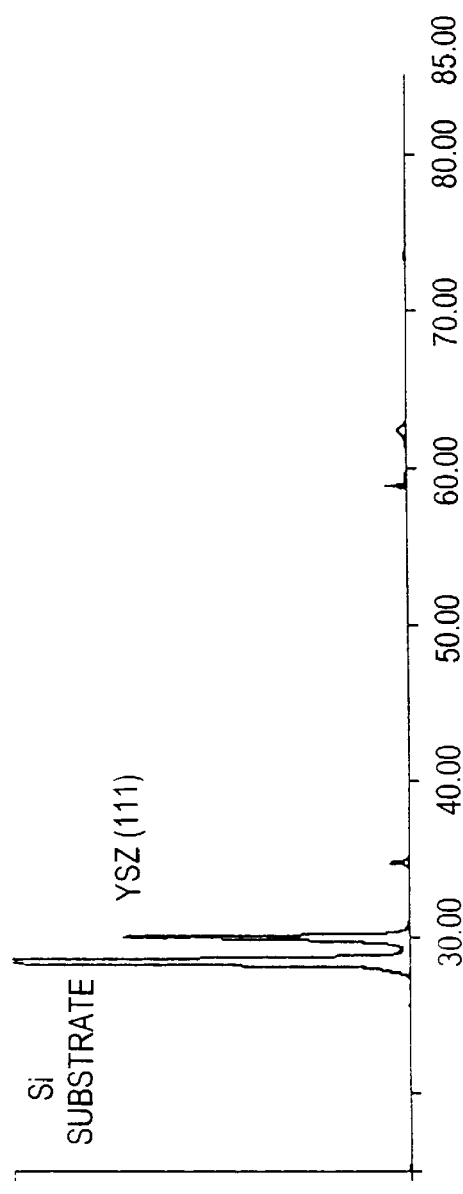

FIG. 7 shows the results of XRD (CuKa ray) analysis on the thin films obtained in this Example. FIGS. 7(a) and 7(b) are XRD diagrams obtained when substrates (1) and (2) were used, respectively. A (002) peak indicative of the fluorite structure of YSZ is clearly observed in FIG. 7(a) and a (111) peak indicative of the fluorite structure is clearly observed in FIG. 7(b), indicating that there are obtained crystal films which are intensely oriented in a direction reflecting the crystal structure and symmetry of the substrate.

Figure 8A:
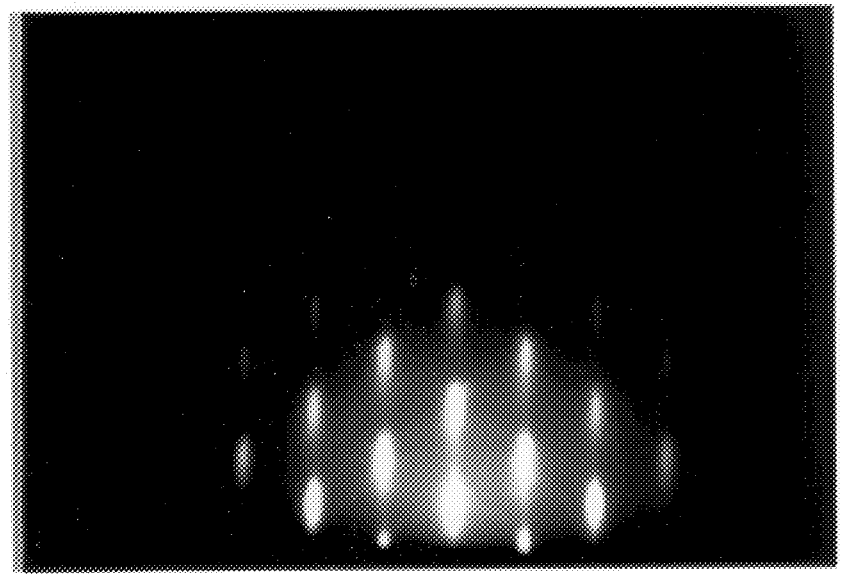
FIG. 8 is a drawing-substituting photograph of the crystal structure of a thin film illustrating a RHEED pattern of the YSZ film shown in FIG. 7(a), FIG. 8(a) being a diffraction pattern resulting from an electron beam incident on a single crystal silicon substrate from [100] direction and FIG. 8(b) being a diffraction pattern resulting from an electron beam incident on a single crystal silicon substrate from [110] direction.
Figure 8B:
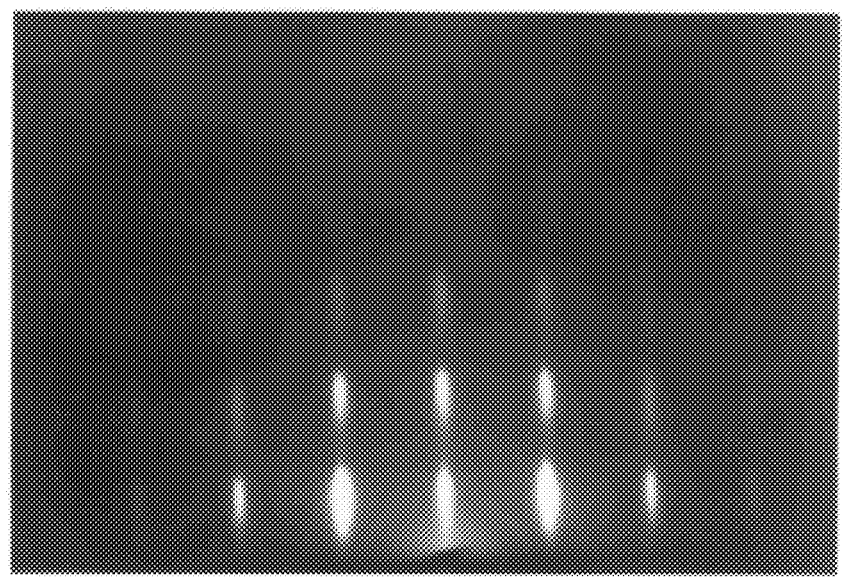
Figure 9:
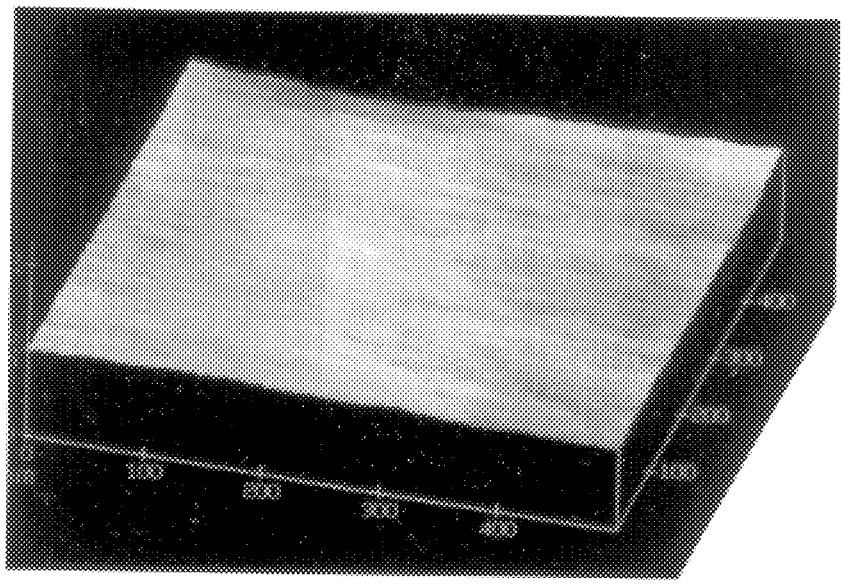
FIG. 9 is a drawing-substituting photograph of the crystal structure of a thin film illustrating the thin film surface image of the YSZ film shown in FIG. 7(a) by atomic force microscopy.
Figure 10:
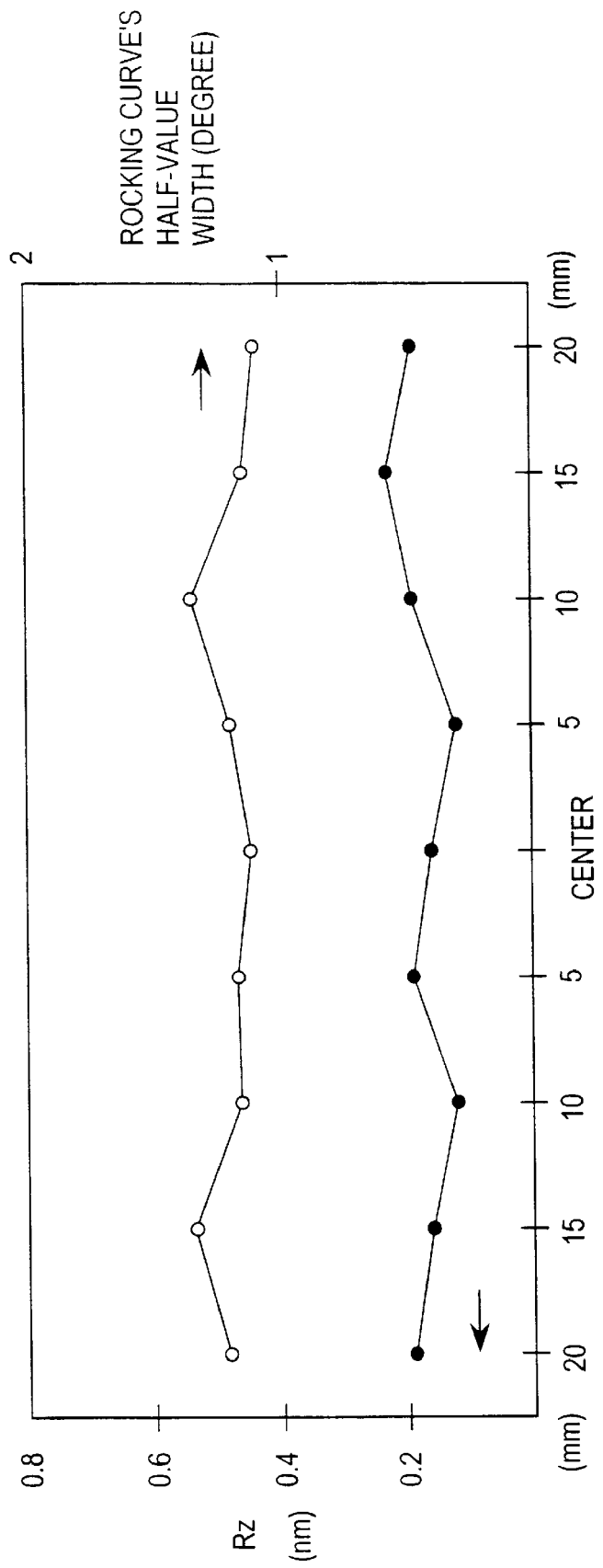
FIG. 10 is a graph showing the ten point mean roughness Rz and rocking curve's half-value width of the YSZ film of Example 1-1 along the entire diameter of a wafer.

FIG. 8 is an electron beam diffraction pattern showing the crystal structure of a thin film obtained when substrate (1) was used. FIGS. 8(a) and 8(b) are diffraction patterns obtained when electron beams are incident from [100] and [110] directions of silicon, respectively. As seen from these results, YSZ shows a sharp streaky diffraction pattern, indicating that the film is of single crystal and has a surface which is flat on the atomic level. Further, from the thin film obtained with the use of substrate (1), a sample of 5×5 mm square was cut along a straight line containing the center thereof and observed under an atomic force microscope (AFM). FIG. 9 shows a surface image of a sample from the one thin film. No grain boundary is observable, indicating that the surface is flat on the atomic level. Using thin film surface images of all the samples, a ten point mean roughness Rz according to JIS B-0610 (reference length L=500 nm) was measured to be 0.16 nm on average and 0.12 nm at minimum. The rocking curve had a half-value width of 1.2° on average and 1.07° at minimum. Crystallinity was available over the entire surface of the silicon substrate of 2 inches in diameter as seen from FIG. 10.

Next, it was examined how the crystallinity of a YSZ film depends on the amount of metals fed prior to oxygen introduction. A YSZ film was formed on a single crystal silicon substrate ((100) plane was used as the substrate surface) in the same manner as above. The amount of metals fed (calculated as a film thickness) was changed as shown in Table 1. The results of XRD (X-ray diffraction) and RHEED analysis on the thus formed YSZ films are also shown in Table 1.

TABLE 1

| Amount of metal fed prior to oxygen introduction (calculated as film thickness, nm) | Crystallinity |
|---|---|
| 0 | epitaxy |
| 0.4 | epitaxy |
| 1.0 | epitaxy |
| 2.0 | epitaxy |
| 4.0 | epitaxy |
| 7.0 | epitaxy + polycrystal |
| 10.0 | polycrystal |

As seen from Table 1, satisfactory epitaxially grown YSZ films are obtained when the amount of metals fed is less than 5 nm calculated as a film thickness.

Example 1-2

As the single crystal substrate on which an oxide thin film was to be grown, there were used (1) a silicon single crystal which was cut so as to make (100) plane a surface and mirror polished and (2) a silicon single crystal which was cut so as to make (111) plane a surface and mirror polished. After purchase, the mirror surfaces were cleaned by etching with a 40% ammonium fluoride aqueous solution. The silicon substrates used were disk substrates having a diameter of 2 inches.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump. In order to protect the cleaned surface of the substrate with silicon oxide, the substrate was rotated at 20 rpm and heated at 600° C. while introducing oxygen to the proximity of the substrate from a nozzle at a rate of 25 cc/min. A silicon oxide film was formed on the substrate surface by thermal oxidation. By this procedure, a silicon oxide film of about 1 nm thick was formed.

Figure 11:
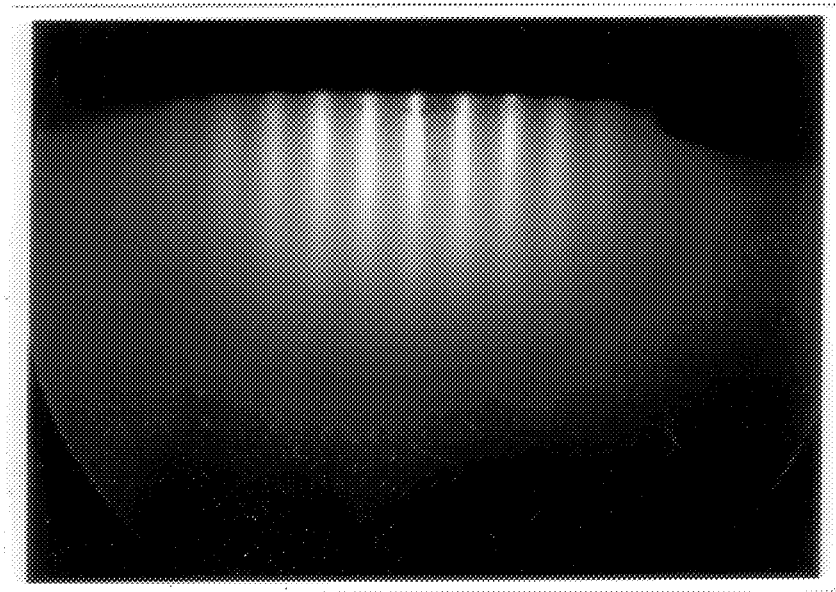
FIG. 11 is a drawing-substituting photograph of the surface structure of a silicon substrate in Example 1-2, (a), having a 1×1 surface structure formed of metallic Zr and oxygen, illustrating a RHEED pattern resulting from an electron beam incident on a single crystal silicon substrate from [110] direction.
Figure 12:
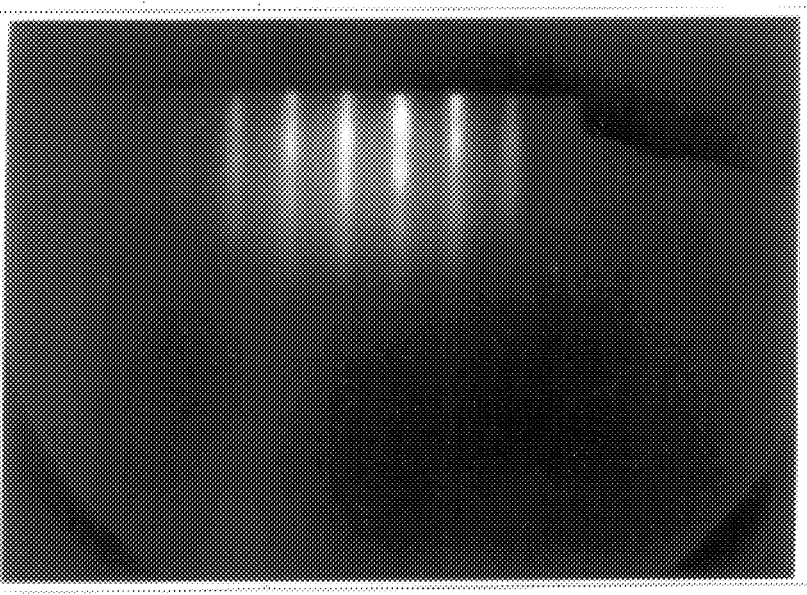
FIG. 12 is a drawing-substituting photograph of the surface structure of a silicon substrate in Example 1-2, (b), having a 1×1 surface structure formed of metallic Zr and oxygen, illustrating a RHEED pattern or diffraction pattern resulting from an electron beam incident on a single crystal silicon substrate from [110] direction.
Figure 13:
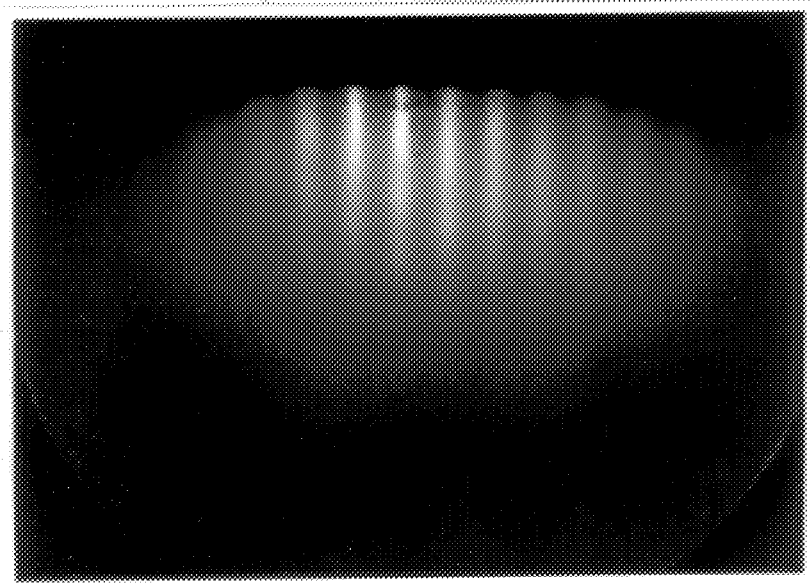
FIG. 13 is a drawing-substituting photograph of the surface structure of a silicon substrate in Example 1-2, (c), having a 1×1 surface structure formed of metallic Zr, metallic Y, and oxygen, illustrating a RHEED pattern or diffraction pattern resulting from an electron beam incident on a single crystal silicon substrate from [110] direction.

Thereafter, the substrate was heated at 900° C. and rotated. The number of revolutions was 20 rpm. At this point, oxygen was introduced from a nozzle at a rate of 25 cc/min. (a) Metallic zirconium was evaporated from its evaporation source to supply zirconium onto the above-mentioned substrate (1) in an amount corresponding to a zirconium oxide film of 5 nm thick, yielding a surface treated silicon substrate having a 1×1 surface structure. (b) Metallic zirconium was evaporated from its evaporation source to supply zirconium onto the above-mentioned substrate (2) in an amount corresponding to a zirconium oxide film of 5 nm thick, yielding a surface treated silicon substrate having a 1×1 surface structure. (c) Metallic zirconium and yttrium were evaporated at a controlled molar ratio Y/Zr of 0.22/1 to supply zirconium and yttrium onto the above-mentioned substrate (1) in an amount corresponding to an oxide film of 5 nm thick, yielding a surface treated silicon substrate having a 1×1 surface structure. These surfaces were measured by RHEED, with the resulting images shown in FIGS. 11 to 13.

These patterns resulted from measurement in incident direction [110] although exactly the same patterns were obtained with 90° rotation. It was thus acknowledged that there was provided a surface treated silicon substrate having a stable 1×1 surface structure.

By supplying metallic zirconium from its evaporation source onto the surface treated silicon substrate at a temperature of 900° C. and rotating at 20 rpm while introducing oxygen gas from a nozzle at a rate of 25 cc/min., a $ZrO_2$ film of 50 nm thick was formed on each of the treated substrates (a) and (b) mentioned above. By supplying zirconium and yttrium from their evaporation sources onto the treated substrate (c) mentioned above under the same conditions as just above, a YSZ ($Zr_{0.82}Y_{0.18}O_{2-\delta}$) film of 50 nm thick was formed.

Figure 14:
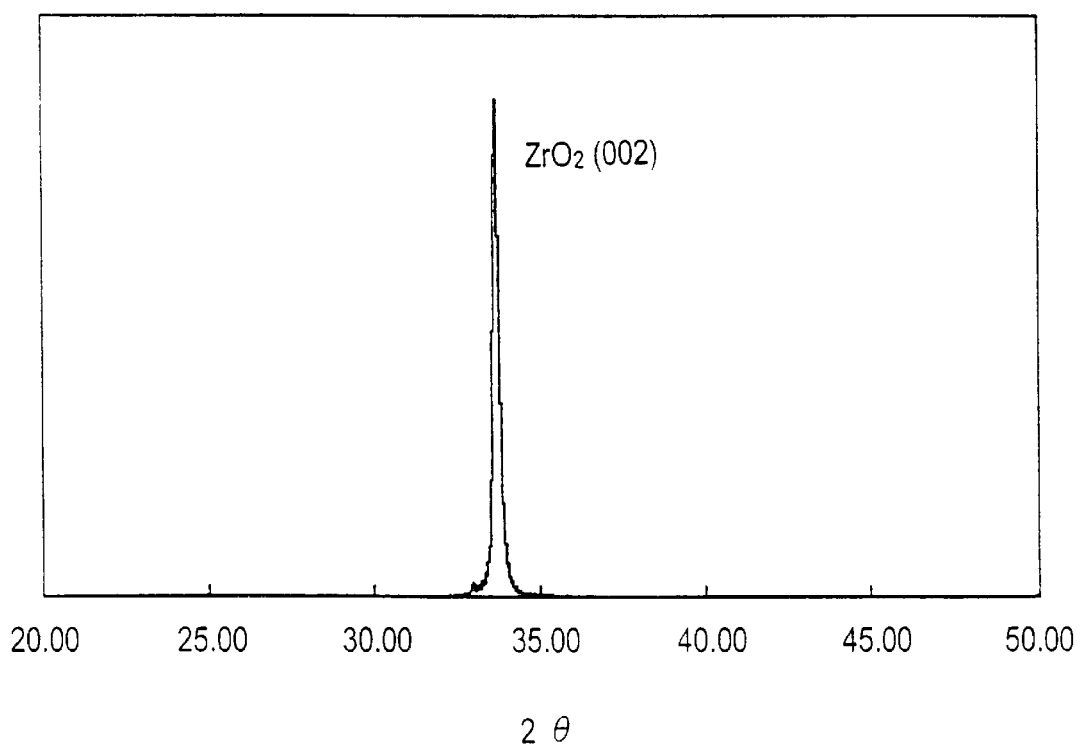
FIG. 14 is a X-ray diffraction diagram of the structure of a $ZrO_2$ film formed on a silicon (100) substrate.
Figure 15:
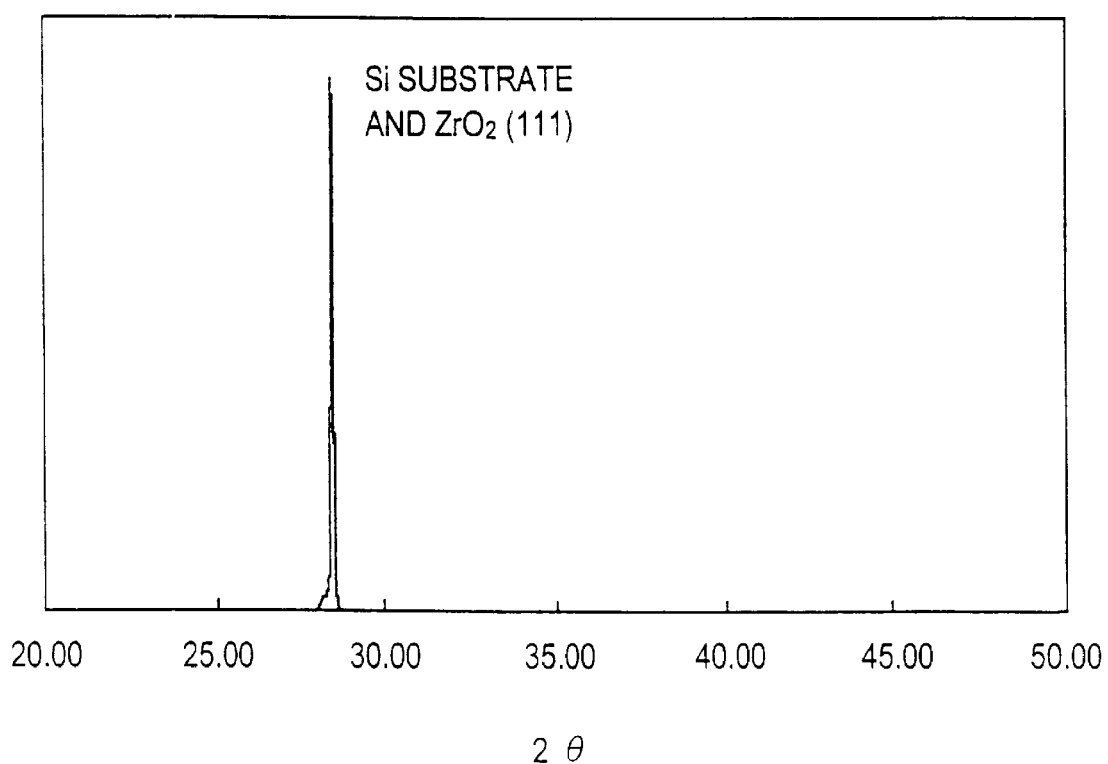
FIG. 15 is a X-ray diffraction diagram of the structure of a $ZrO_2$ film formed on a silicon (111) substrate.
Figure 16:
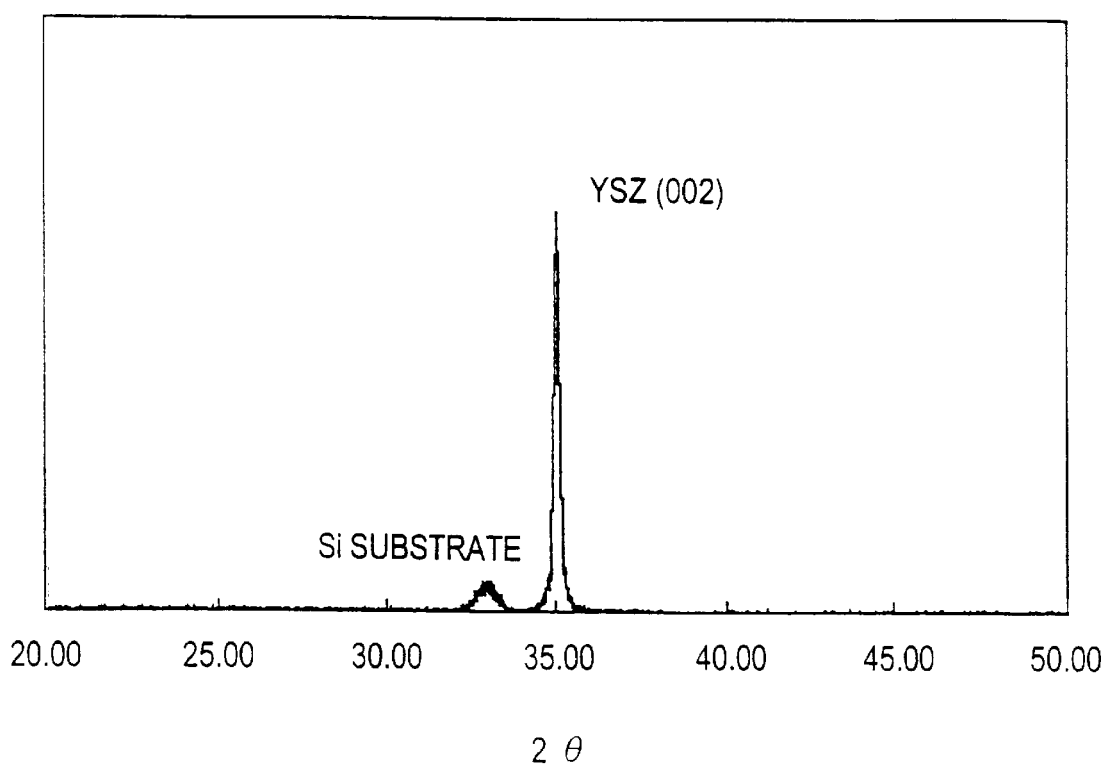
FIG. 16 is a X-ray diffraction diagram of the structure of a YSZ film formed on a silicon (100) substrate.

FIGS. 14 to 16 show the results of X-ray diffraction analysis on the resulting three thin films. In these figures, a (002) peak of $ZrO_2$ and a (002) peak of YSZ are apparently observed (in FIGS. 14 and 16). In FIG. 15, a (111) peak of $ZrO_2$ is in full overlap with a peak of the silicon substrate. It is seen that there are obtained crystal films which are intensely oriented in a direction reflecting the crystal structure and symmetry of $ZrO_2$ and YSZ. In particular, each of these peaks is reflection from only one reflecting surface. Especially, the $ZrO_2$ film is a unidirectionally oriented, high crystallinity film which was never found in the prior art. The rocking curves of these reflections had a half-value width of 0.7° (found value), 0.8° (found value), and 0.7° (found value including silicon substrate), respectively, indicating superior orientation.

Figure 17A:
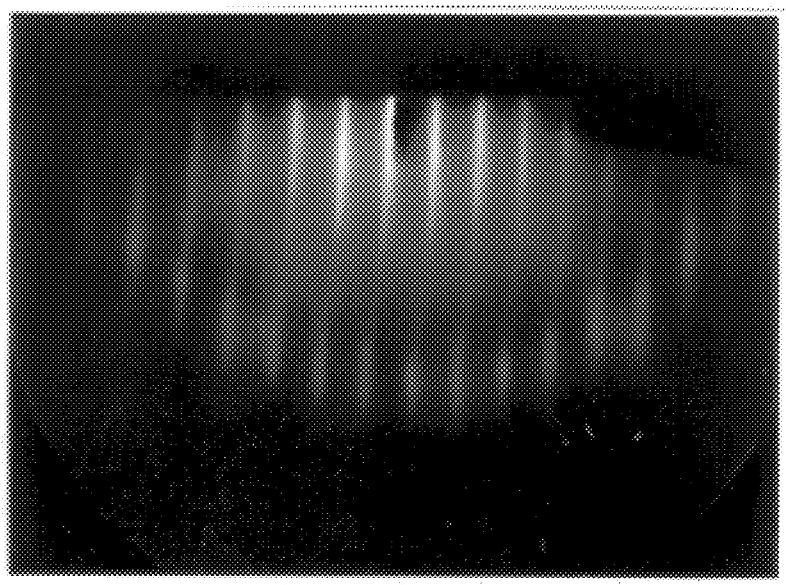
FIGS. 17(a), 17(b), and 17(c) are a drawing-substituting photograph of the crystal structure of $ZrO_2$ formed on a silicon (100) substrate, illustrating a RHEED pattern resulting from an electron beam incident on a single crystal silicon substrate from [110] direction, a drawing-substituting photograph of the crystal structure of $ZrO_2$ formed on a silicon (111) substrate, illustrating a RHEED pattern resulting from an electron beam incident on a single crystal silicon substrate from [110] direction, and a drawing-substituting photograph of the crystal structure of YSZ formed on a silicon (100) substrate, illustrating a RHEED pattern resulting from an electron beam incident on a single crystal silicon substrate from [110] direction.
Figure 17B:
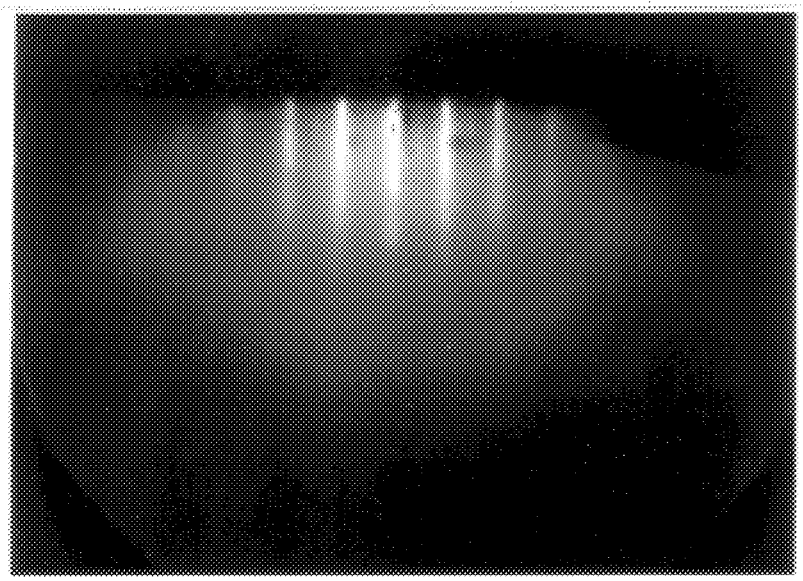
Figure 17C:
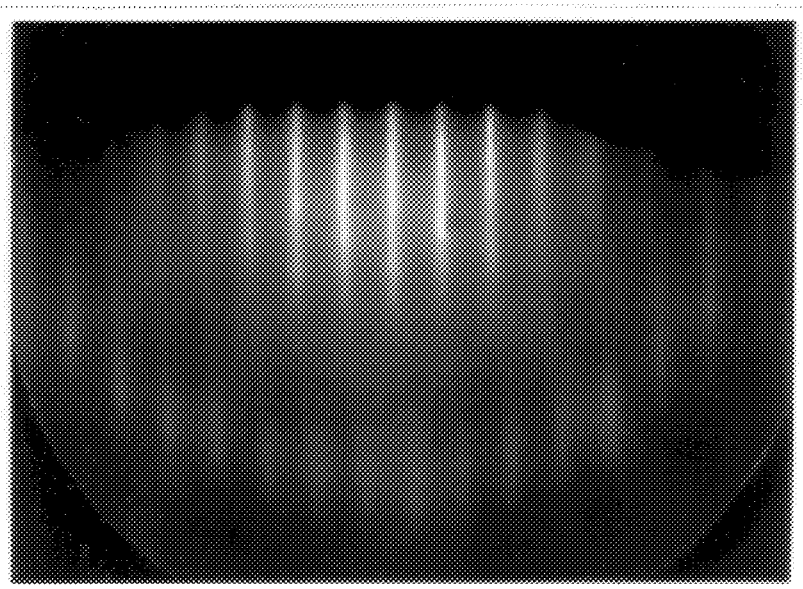
Figure 18A:
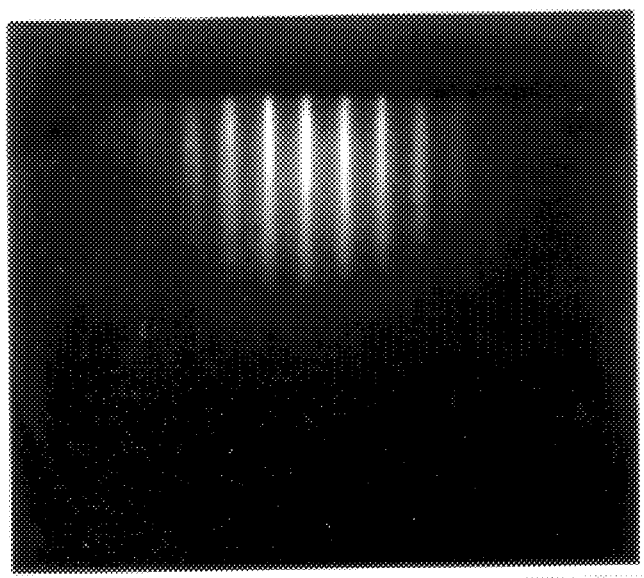
FIGS. 18(a), 18(b), 18(c), 18(d), 18(e), 18(f), 18(g), and 18(h) are drawing-substituting photographs of the crystal structure of modified YSZ's wherein Y is replaced by Pr, Ce, Nd, Gd, Tb, Dy, Ho, and Er, respectively, illustrating RHEED patterns resulting from an electron beam incident on a single crystal silicon substrate from [110] direction.
Figure 18B:
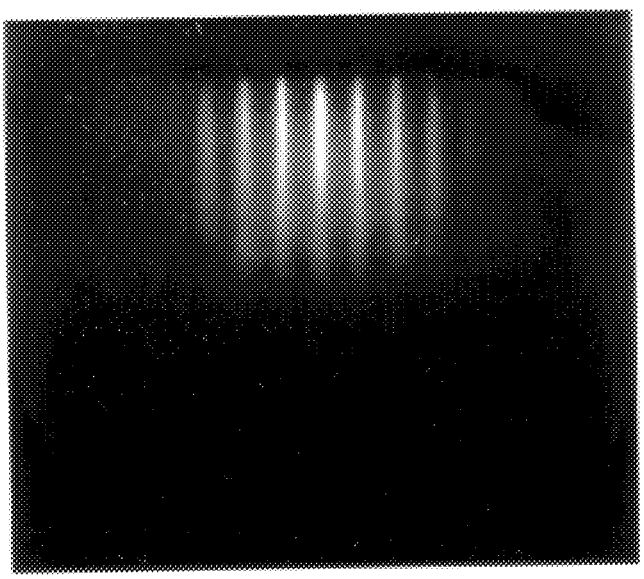
Figure 18C:
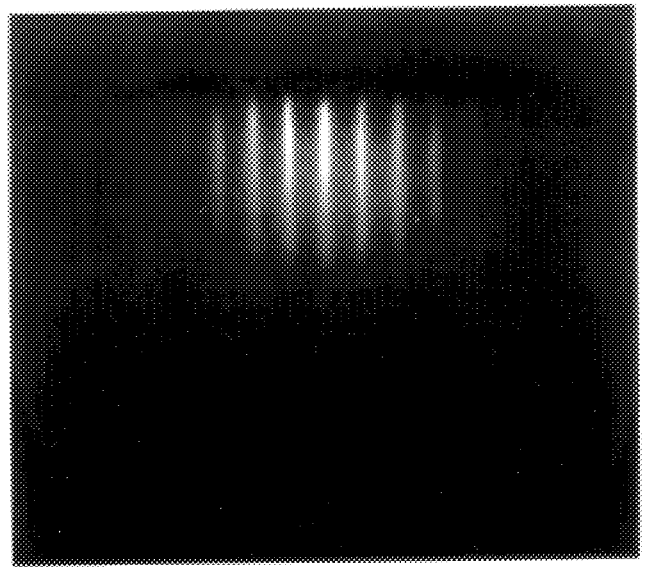
Figure 18D:
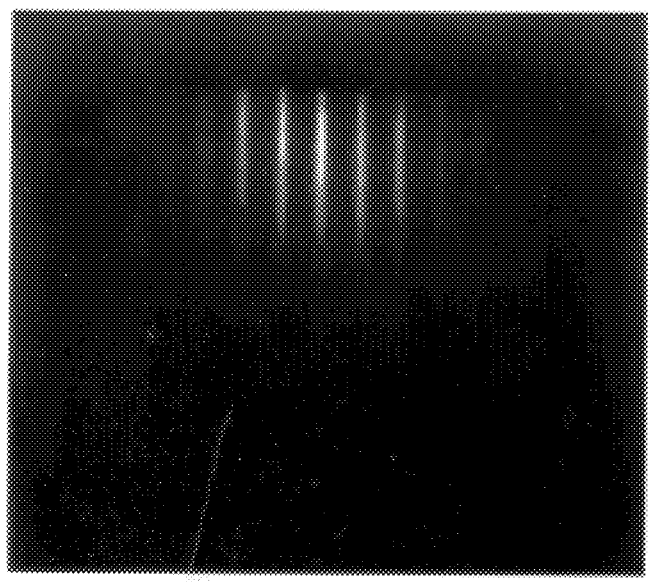
Figure 18E:
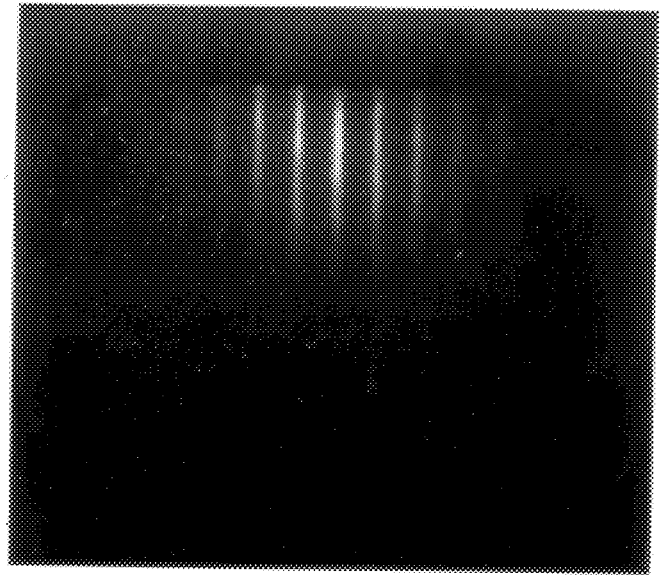
Figure 18F:
Figure 18G:
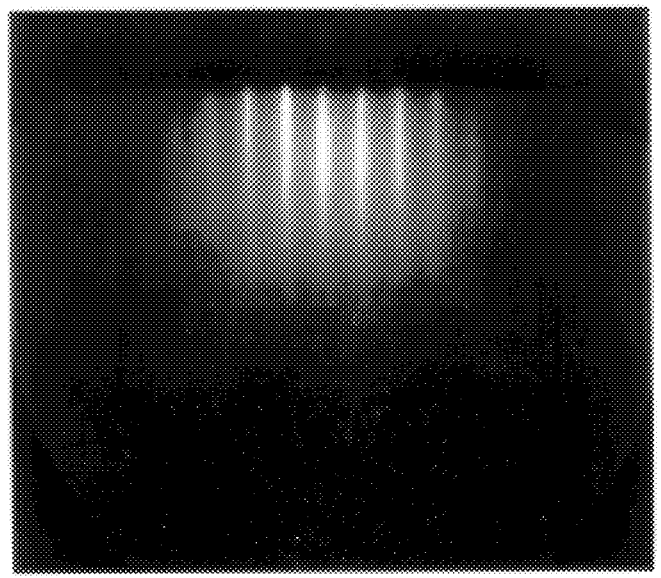
Figure 18H:
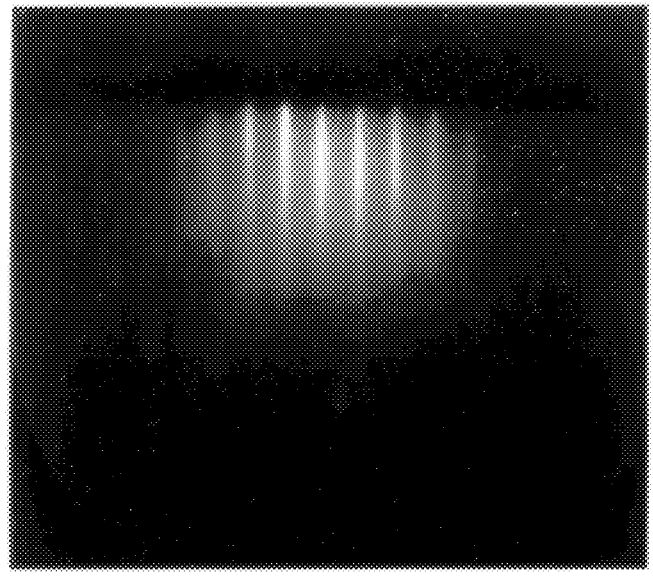

FIGS. 17(*a*), 17(*b*) and 17(*c*) show reflection high energy electron diffraction (RHEED) patterns of these thin films. The incident direction of electron beams is from [110] direction of the silicon substrate. As seen from these results, the diffraction pattern on the surface of the thin film of this structure is a completely streaky pattern and is completely different from a pattern having partially spot-like streaks as found in prior art examples. This completely streaky pattern indicates that $ZrO_2$ has superior crystallinity and surface properties. Also the $ZrO_2$ and YSZ films were measured for resistivity to find that the $ZrO_2$ film had a resistivity 5 times higher than that of YSZ, indicating superior insulation. The three films were measured for ten point mean roughness Rz according to JIS B-0610 (reference length L=500 nm) at 10 positions distributed over substantially the entire surface to find that the $ZrO_2$ film on the (100) silicon substrate had Rz of 0.70 nm on average, 0.95 nm at maximum, and 0.10 at minimum, the $ZrO_2$ film on the (111) silicon substrate had Rz of 0.80 nm on average, 1.00 nm at maximum, and 0.08 at minimum, the YSZ film on the (100) silicon substrate had Rz of 0.75 nm on average, 0.80 nm at maximum, and 0.12 at minimum, indicating that the surface was flat on the molecular level.

Films were formed by substituting Pr, Ce, Nd, Gd, Tb, Dy, Ho, Er, etc. for Y of the YSZ film, with RHEED patterns obtained therefrom being shown in FIGS. 18(*a*), 18(*b*), 18(*c*), 18(*d*), 18(*e*), 18(*f*), 18(*g*), and 18(*h*). It was confirmed that these films have superior flatness and crystallinity as well.

Figure 19:
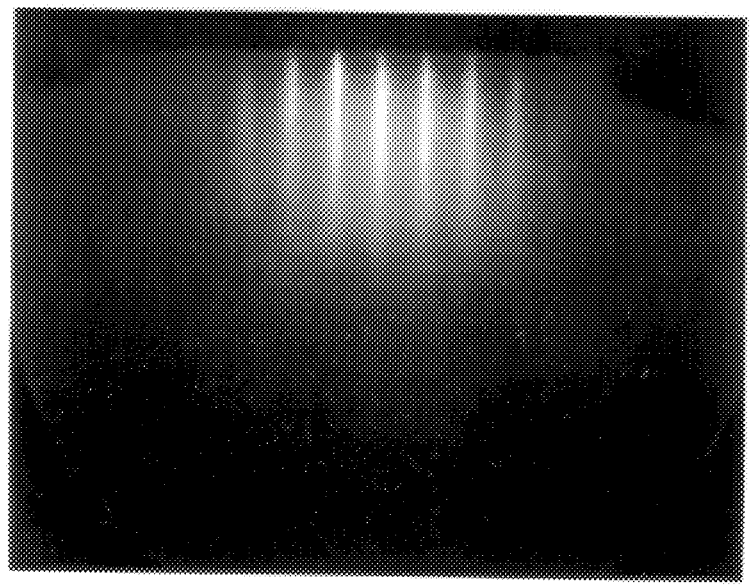
FIG. 19 is a drawing-substituting photograph of the crystal structure of YSZ having a Y content of 7 mol %, illustrating a RHEED pattern resulting from an electron beam incident on a single crystal silicon substrate from [110] direction.
Figure 20:
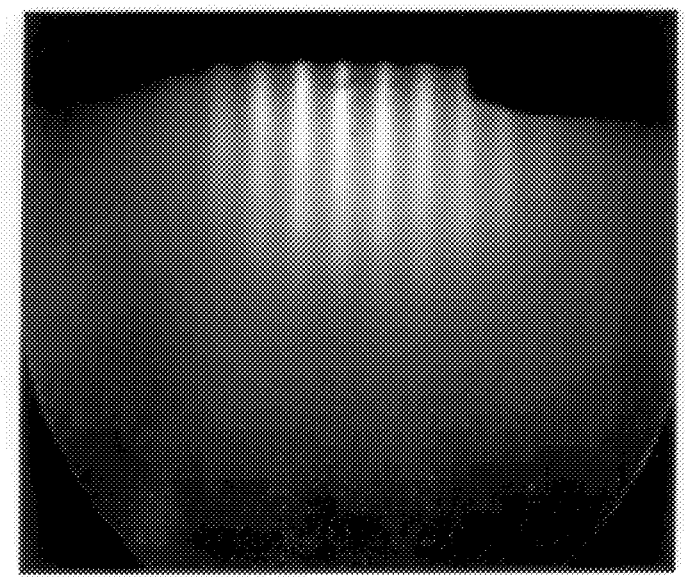
FIG. 20 is a drawing-substituting photograph of the surface crystal structure of a silicon substrate in Example 2-1, having a 1×1 surface structure formed of metallic Sr and oxygen, illustrating a RHEED pattern or diffraction pattern resulting from an electron beam incident on a single crystal silicon substrate from [110] direction.
Figure 21:
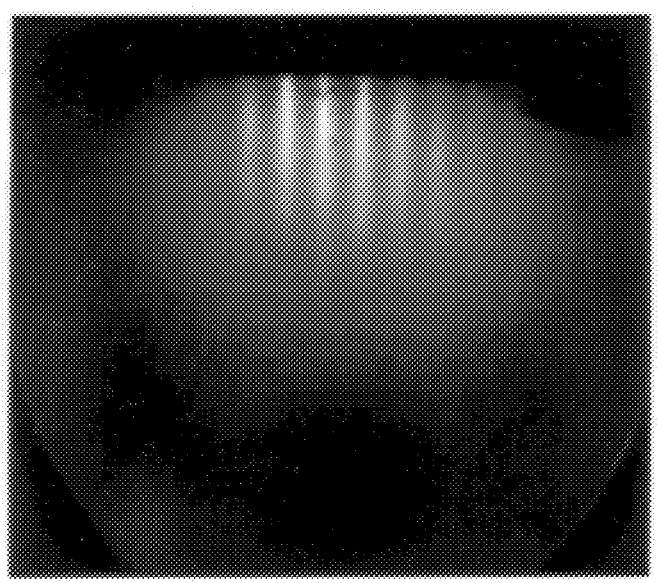
FIG. 21 is a drawing-substituting photograph of the surface crystal structure of a silicon substrate in Example 2-2, having a 1×1 surface structure formed of metallic Gd and oxygen, illustrating a RHEED pattern or diffraction pattern resulting from an electron beam incident on a single crystal silicon substrate from [110] direction.

Additionally, a YSZ film of the composition $Zr_{0.93}Y_{0.07}O_{2-\delta}$ was similarly formed, with a RHEED pattern obtained therefrom being shown in FIG. 19. It was also confirmed from the RHEED pattern that the film had satisfactory properties.

Examples of the single crystal silicon substrate according to the invention are described below.

Example 2

As the single crystal substrate, there was used a silicon single crystal which was cut so as to make (100) plane a surface and mirror polished. After purchase, the mirror surface was cleaned by etching with a 40% ammonium fluoride aqueous solution. The single crystal substrate used was a disk substrate having a diameter of 2 inches.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump. Thereafter, oxygen was introduced at a flow rate of 10 cc/min. in order to establish an atmosphere having an oxygen partial pressure of about $10^{-2}$ Torr in the proximity to the substrate. This state was maintained until the end of the process. The substrate was rotated and heated to 600° C. The number of revolutions was 20 rpm. The substrate was maintained in these conditions for 5 minutes, during which period a protective film of silicon oxide was formed on the silicon surface. The film thickness was 0.8 nm. Thereafter, the substrate was heated to a temperature of 900° C. under the same conditions. Next, by supplying Sr (alkaline earth metal) in Example 2-1, Gd (rare earth metal) in Example 2-2, metallic Zr in Example 2-3, metallic Hf in Example 2-4, and Sr and Zr in a ratio (weight ratio) of 1:1 in Example 2-5 from an evaporation source in an amount corresponding to a metal oxide film's thickness of 5 nm, surface treated silicon substrates having a 1×1 surface structure of Examples 2-1 to 2-5 were obtained.

Figure 25:
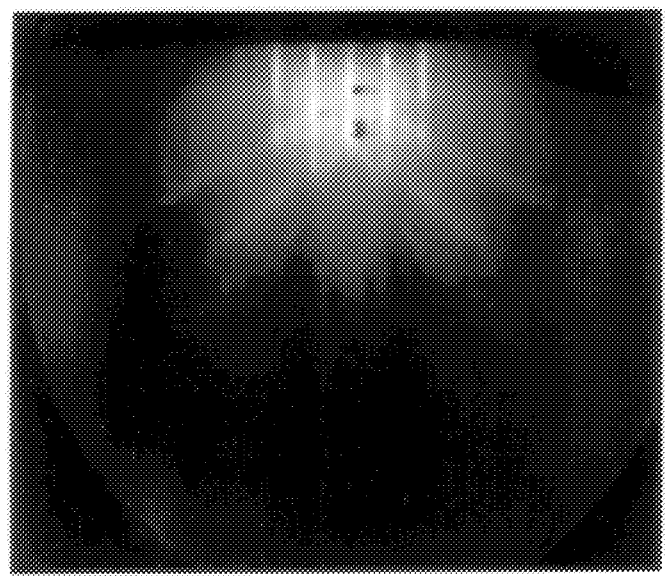
FIG. 25 is a drawing-substituting photograph of the surface crystal structure of a silicon substrate having a 2×1 surface structure in Comparative Example without the treatment of the invention, illustrating a RHEED pattern or diffraction pattern resulting from an electron beam incident on a single crystal silicon substrate from [110] direction.
Figure 26:
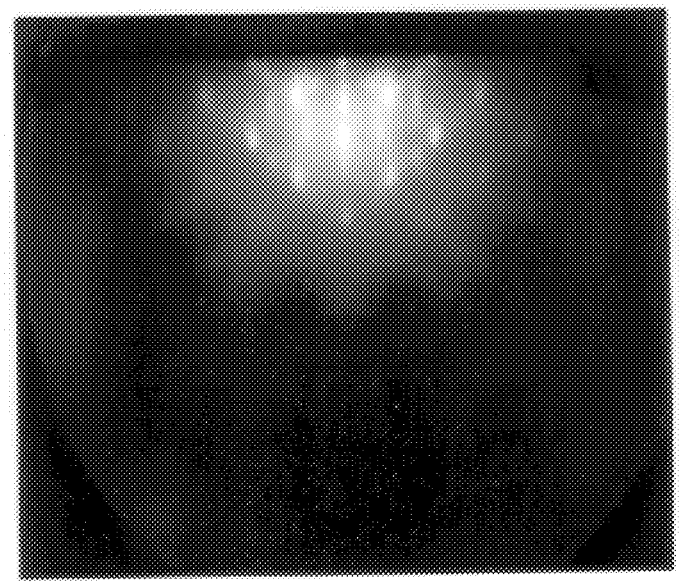
FIG. 26 is a drawing-substituting photograph of the surface crystal structure of a silicon substrate in another Comparative Example wherein silicon was formed at 200° C., which is a diffraction pattern illustrating a RHEED image of a disordered silicon surface and resulting from an electron beam incident on a single crystal silicon substrate from [110] direction.

FIGS. 20 to 24 show RHEED images measured on the surface of these surface treated silicon substrates of Examples 2-1 to 2-5. These patterns resulted from measurement in incident direction [110] although exactly the same patterns were obtained from measurement in incident direction [1–10]. For comparison purposes, FIG. 25 is a RHEED pattern of the surface of 2×1 structure silicon which was not subject to the treatment according to the invention and FIG. 26 is a RHEED pattern obtained when the heating temperature was 200° C., both being RHEED images of disordered silicon surfaces. A pattern of a complex superstructure having a large unit mesh of 2×1 appeared in FIG. 25. In FIG. 26, a reflection pattern attributable to SiC was observed, indicating that the silicon surface was contaminated and the silicon crystal surface was disordered. In the RHEED patterns of FIGS. 20 to 24 within the scope of the present invention, neither superstructure nor SiC contamination was observed, but only a streak pattern of 1×1 was observed, indicating that a surface treated silicon substrate having a stable 1×1 surface structure was obtained.

Figure 22:
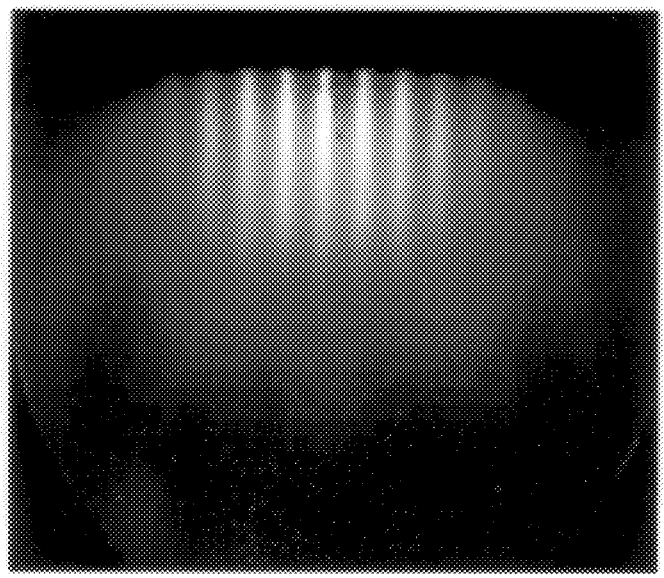
FIG. 22 is a drawing-substituting photograph of the surface crystal structure of a silicon substrate in Example 2-3, having a 1×1 surface structure formed of metallic Zr and oxygen, illustrating a RHEED pattern or diffraction pattern resulting from an electron beam incident on a single crystal silicon substrate from [110] direction.
Figure 23:
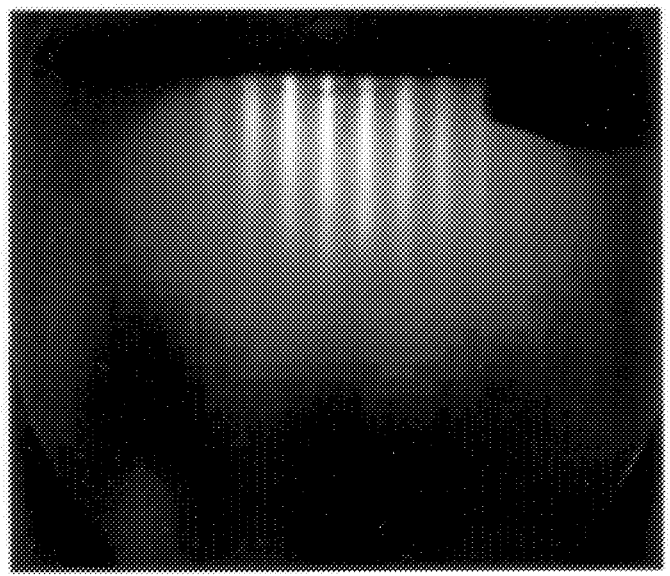
FIG. 23 is a drawing-substituting photograph of the surface crystal structure of a silicon substrate in Example 2-4, having a 1×1 surface structure formed of metallic Hf and oxygen, illustrating a RHEED pattern or diffraction pattern resulting from an electron beam incident on a single crystal silicon substrate from [110] direction.
Figure 24:
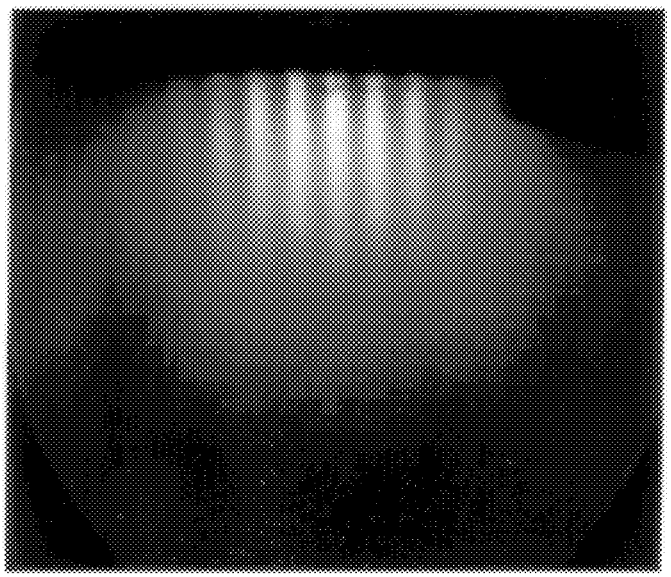
FIG. 24 is a drawing-substituting photograph of the surface crystal structure of a silicon substrate in Example 2-5, having a 1×1 surface structure formed of metallic Sr, metallic Zr, and oxygen, illustrating a RHEED pattern or diffraction pattern resulting from an electron beam incident on a single crystal silicon substrate from [110] direction.
Figure 27:
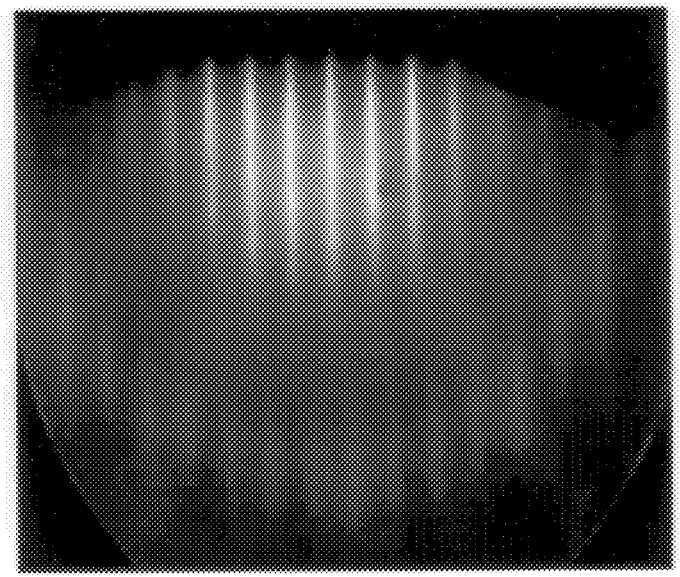
FIG. 27 is a RHEED pattern of the surface of a film of YSZ epitaxially grown as a dielectric thin film on a silicon substrate according to the invention, illustrating a diffraction pattern resulting from an electron beam incident on a single crystal silicon substrate from [110] direction.

On a surface treated silicon substrate according to the invention, for example, the silicon substrate surface treated using Zr as shown in FIG. 22, YSZ as a dielectric material was epitaxially grown by evaporation. A RHEED pattern of the film surface is shown in FIG. 27. The diffraction pattern is sharp and streaky, indicating that the YSZ dielectric film is of single crystal and has a flat surface. The streaks are extremely distinct as compared with the RHEED pattern of the YSZ epitaxy film on silicon in the above-mentioned Comparative Example. The present invention achieves substantial improvements in crystallinity and surface properties over the prior art YSZ epitaxy films. Similar experiments were done using alkaline earth metals other than strontium and rare earth metals other than gadolinium, finding that the metal and oxygen formed a 1×1 surface structure on the single crystal silicon substrate. YSZ was grown on the surface of these silicon substrates having a 1×1 surface structure and the silicon substrates of Examples 1, 2, 4, and 5, finding that satisfactory epitaxial films were obtained as well.

Examples of the MIS semiconductor device of the invention are described below.

Example 3

A MIS capacitor is described as Example 2-1.

As the single crystal substrate on which an oxide thin film was to be grown, there were used the $ZrO_2$ film-bearing substrates (1) and (2) in Example 2.

An MIS capacitor was manufactured by forming a Pt electrode film having an area of about 0.15 mm² on the surface of the $ZrO_2$ film on the substrate as an upper electrode and providing the silicon wafer with an ohmic electrode of aluminum. The silicon wafer is a p type wafer of 5 Ωcm.

Figure 28:
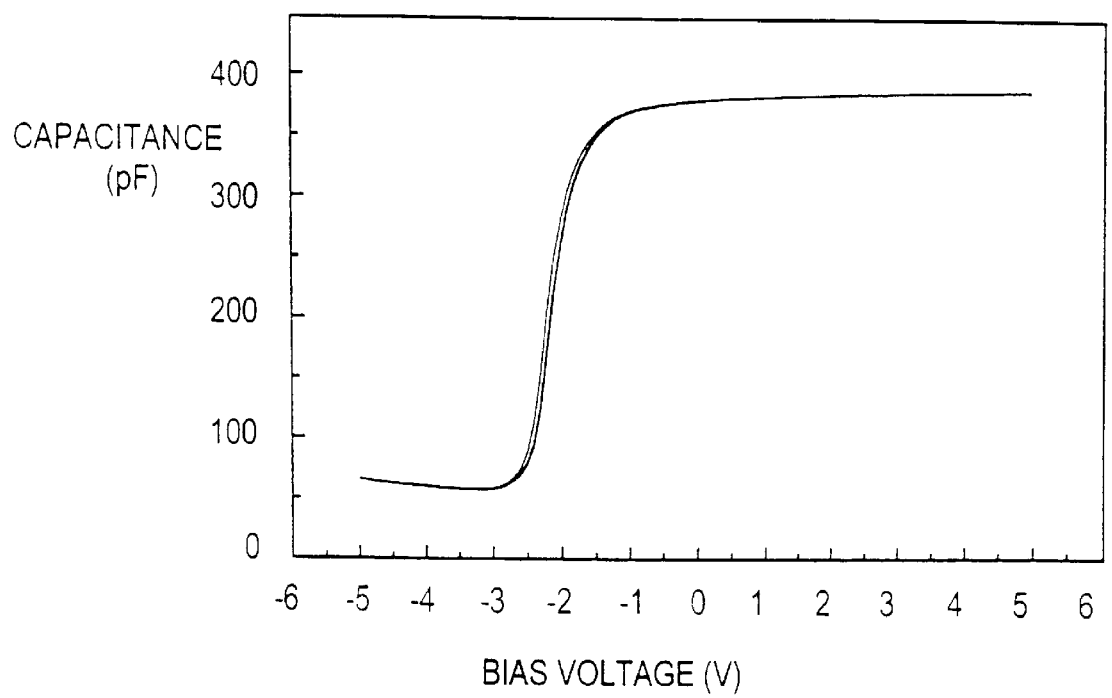
FIG. 28 is a graph showing a C-V curve of an MIS capacitor using a $ZrO_2$ film on a silicon (100) substrate in Example 3-1 of the invention.
Figure 29:
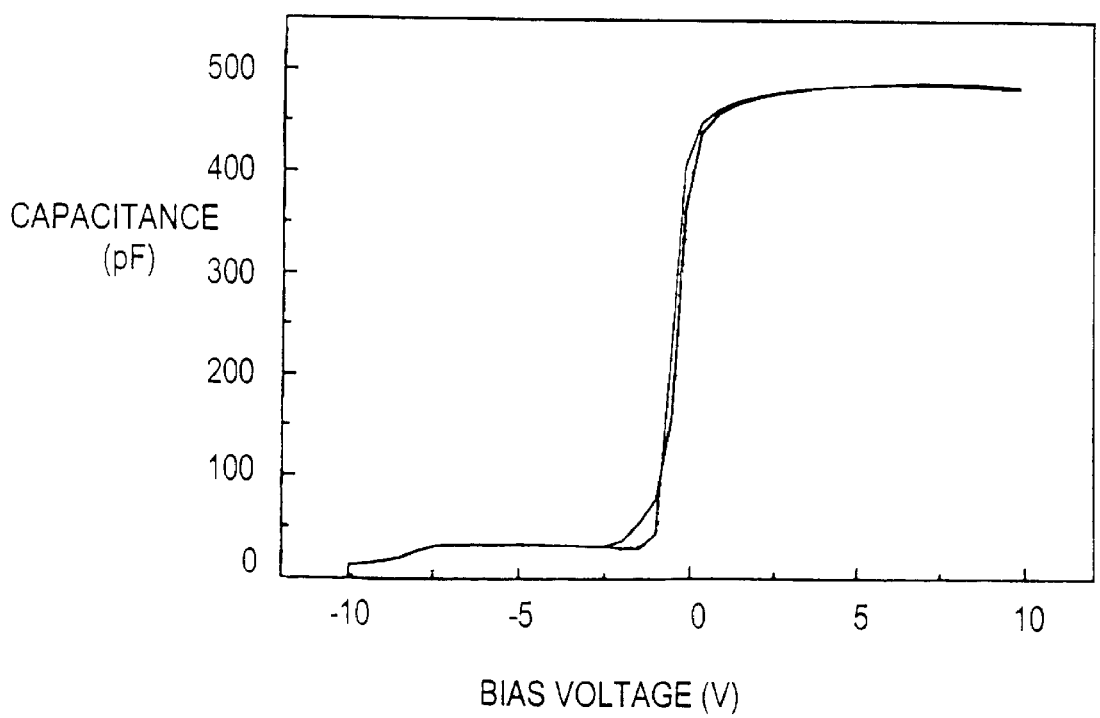
FIG. 29 is a graph showing a C-V curve of an MIS capacitor using a $ZrO_2$ film on a silicon (111) substrate in Example 3-1 of the invention.
Figure 30:
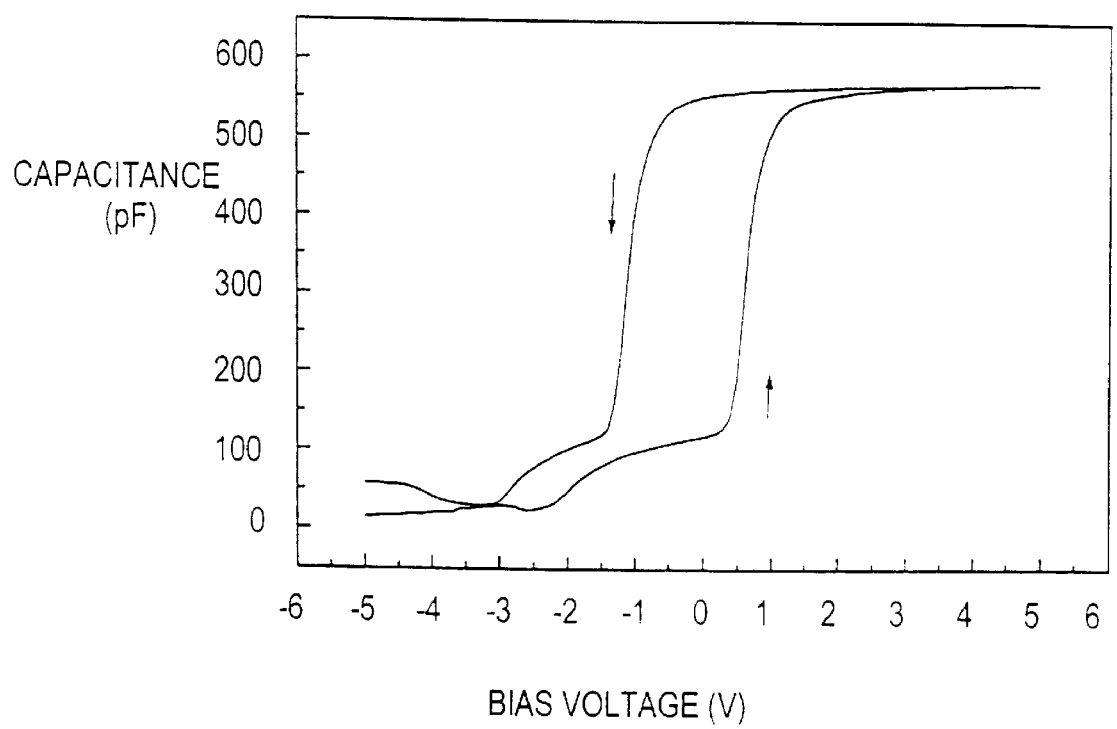
FIG. 30 is a graph showing a C-V curve of an MIS capacitor using a prior art YSZ film.

The thus manufactured MIS capacitor had C-V curves as shown in FIGS. 28 and 29. The C-V curve was measured at 1 MHz by changing the bias voltage at 0.4 V/sec. As is evident from the C-V curves shown in FIGS. 28 and 29, the sample according to the invention has a C-V curve free of hysteresis. For comparison purposes, FIG. 30 shows a C-V curve of a MIS capacitor manufactured using a prior art YSZ thin film. In FIG. 30, a considerable hysteresis width corresponding to a hysteresis value of more than about 1.5 V is observed when the biasing voltage is changed.

In contrast to a leakage current of 23 μA/cm² for YSZ, the inventive example had a leakage current of 2 μA/cm² or a more than 10-fold improvement.

Next, a MISFET is described as Example 3-2.

Figure 31:
FIGS. 31(a)–31(g) schematically illustrates how to prepare an MISFET in Example 3-2 of the invention.
Figure 31:
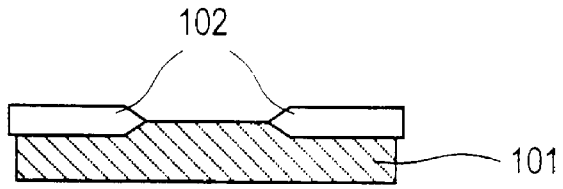
Figure 31:
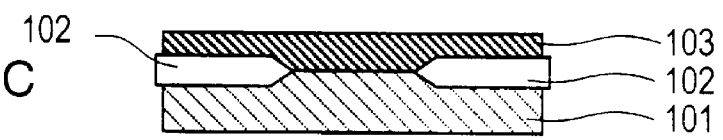
Figure 31:
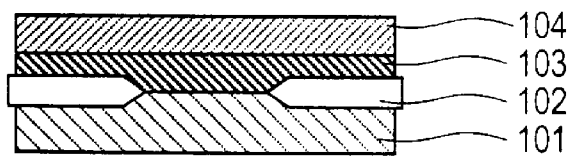
Figure 31:
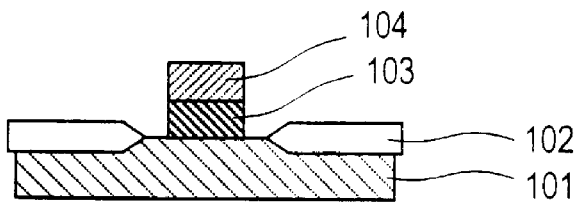
Figure 31:
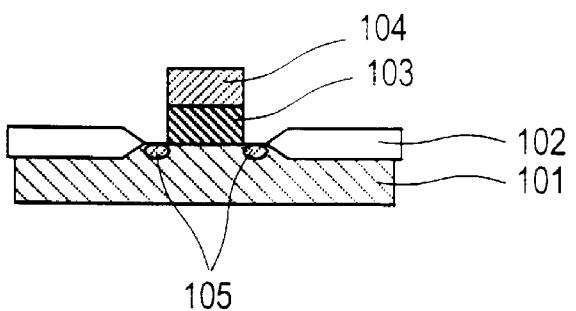
Figure 31:
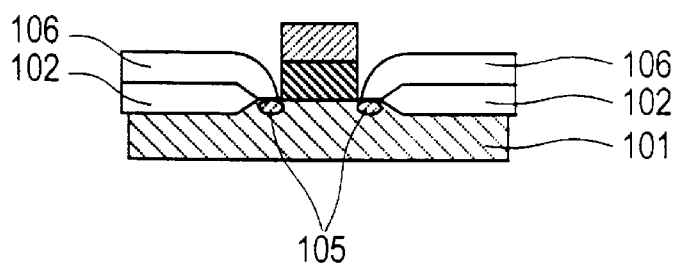

As shown in FIG. 31(*a*), a single crystal silicon wafer which was cut so as to make (100) plane a surface and mirror polished was used as the single crystal substrate. This substrate was a disk substrate wafer of p-type having a resistivity of 10 Ωcm and a diameter of 2 inches. First, the substrate 101 was isolated by a local oxidation of silicon technique (to be referred to as LOCOS technique, hereinafter) as shown in FIG. 31(*b*). The $SiO_2$ oxide film 102 used in LOCOS isolation had a thickness of 600 nm. Then the substrate 101 was cleaned by etching with a 40% ammonium fluoride aqueous solution to remove the spontaneous oxide film therefrom.

The substrate 101 was secured to a substrate holder equipped with rotating and heating mechanisms installed in a vacuum chamber. The vacuum evaporation chamber was then evacuated to a vacuum of $10^{-6}$ Torr by means of a vacuum pump. Thereafter, for protecting the cleaned substrate surface with a silicon oxide film, oxygen was introduced at a flow rate of 25 cc/min. from a nozzle to the proximity of the substrate at 600° C. to form a silicon oxide film of about 1 nm thick on the substrate surface through thermal oxidation. Next, after the vacuum evaporation chamber was evacuated to a vacuum of $10^{-6}$ Torr again, the substrate was heated at 900° C. and rotated. The number of revolutions was 20 rpm.

Thereafter, metallic zirconium was supplied from its evaporation source. At the same time, oxygen gas was introduced from a nozzle at a rate of 25 cc/min. to react with the metal to form a $ZrO_2$ film 103 of about 50 nm thick as shown in FIG. 31(*c*).

On X-ray analysis of the resulting $ZrO_2$ thin film 103, a (002) peak of $ZrO_2$ was apparently observed, indicating that there was obtained a crystal film which was intensely oriented in a direction reflecting the crystal structure and symmetry of $ZrO_2$. An observation of the $ZrO_2$ film surface by AFM confirmed its flatness on the molecular level. The film was measured for ten point mean roughness Rz according to JIS B-0610 (reference length L=500 nm) at 10 positions distributed over the entire surface, finding a Rz value of 0.60 nm on average, 1.2 nm at maximum and 0.20 nm at minimum.

The region where the $ZrO_2$ thin film was formed was examined for composition by EPMA to find that impurities are below the detection limit.

The $ZrO_2$ film had a dielectric constant of 20 which was at least 6 times higher than $SiO_2$ having a dielectric constant of 3.

Next, polycrystalline silicon 104 serving as a gate electrode was formed by CVD as shown in FIG. 31(*d*). The depositing conditions included a pressure of $5 \times 10^{-1}$ Torr and a substrate temperature of 650° C. and the deposit was formed to a thickness of 250 nm. After patterning by photolithography was done as shown in FIG. 31(*e*), reactive ion etching (RIE) was carried out to yield a MIS structure.

Thereafter, phosphorus was implanted by ion implantation to form source and drain regions 105 as shown in FIG. 31(*f*), followed by annealing at 900° C. for 20 minutes. Finally, as shown in FIG. 31(*g*), an aluminum electrode 106 was formed by sputtering and etched to form aluminum runs, completing the MISFET of Example 2-1. An MISFET of Example 2—2 was also manufactured by using a single crystal silicon substrate presenting (111) plane as its surface, forming a $ZrO_2$ thin film of about 50 nm thick thereon as a gate oxide layer in the same manner as above, and forming a gate electrode in the same manner as above.

The semiconductor device manufacturing process described so far is merely one illustrative example for producing a FET according to one embodiment of the invention and the invention is not limited thereto.

The thus obtained FETs of Examples 2-1 and 3-2 use $ZrO_2$ as a MIS capacitor. Since $ZrO_2$ has a dielectric constant of 20 which is at least 6 times greater than prior art $SiO_2$, the degree of integration of planar type devices can be increased without a need for substantial modification of the prior art FET manufacturing process. Also, since the MIS structure in the FETs of Examples 2-1 and 3-2 has a C-V curve involving little hysteresis as previously mentioned, the threshold value of FET was stabilized by the invention so as to vary only in the range of 1.8 to 2.4 V in contrast to the prior art YSZ used in a MIS structure in which the threshold value varies from −1 V to 5 V to prohibit practical use. The inventive FETs had a leakage current which is smaller by a factor of 10 than that of YSZ, offering stable transistor characteristics.

The present invention enables increase of a degree of integration and stabilization of a threshold value, achieving a substantial improvement in transistor characteristics over the prior art.

Examples of the non-volatile semiconductor memory device of the invention are described below.

Figure 32:
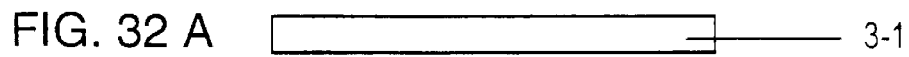
FIGS. 32(a)–(g) illustrates in cross-sectional views successive steps of preparing a non-volatile semiconductor memory device in Example 4-1 of the invention.
Figure 32:
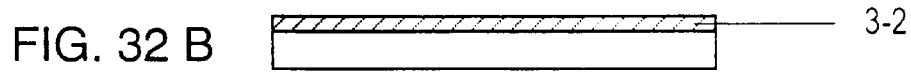
Figure 32:
Figure 32:
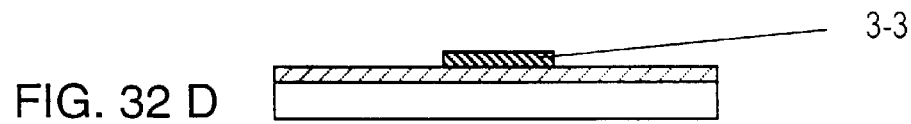
Figure 32:
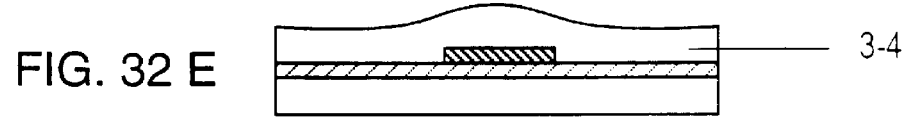
Figure 32:
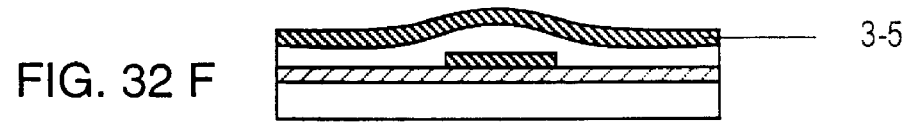
Figure 32:
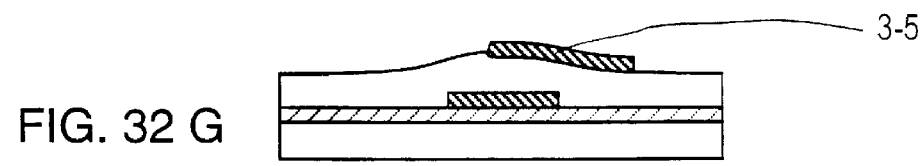
Figure 32:
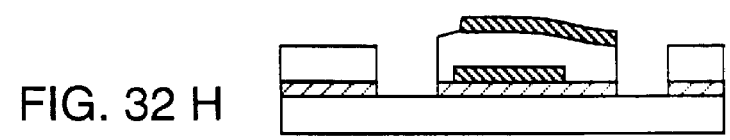
Figure 32:
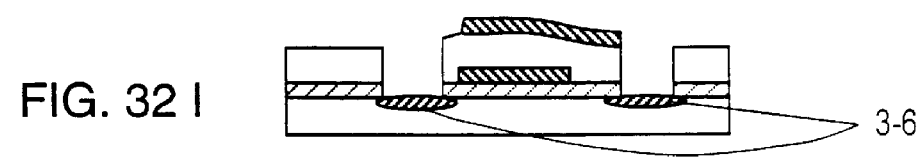
Figure 32:
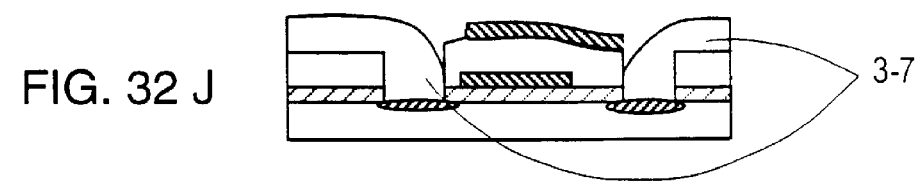

FIG. 32 includes schematic views for illustrating a process for manufacturing a non-volatile semiconductor memory device according to one embodiment of the present invention.

Example 4-1

As a single crystal substrate 3-1 as shown in FIG. 32(*a*), there were used (1) a silicon single crystal which was cut so as to make (100) plane a surface and mirror polished and (2) a silicon single crystal which was cut so as to make (111) plane a surface and mirror polished. After purchase, the mirror surfaces were cleaned by etching with a 40% ammonium fluoride aqueous solution. All the single crystal substrates used were disk substrates having a diameter of 2 inches.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump and the substrate was heated to 850° C. and rotated. The number of revolutions was 20 rpm.

Thereafter, metallic zirconium and yttrium were supplied from distinct evaporation sources in a controlled Y/Zr molar ratio to 0.45/1. No oxygen was introduced at this point. When a feed amount corresponding to a Zr+Y alloy film's thickness of 1 nm was reached, oxygen gas was introduced from a nozzle at a rate of 10 cc/min. to react with the metals to form a YSZ film or oxide thin film 3-2 of about 10 nm thick.

Figure 33:
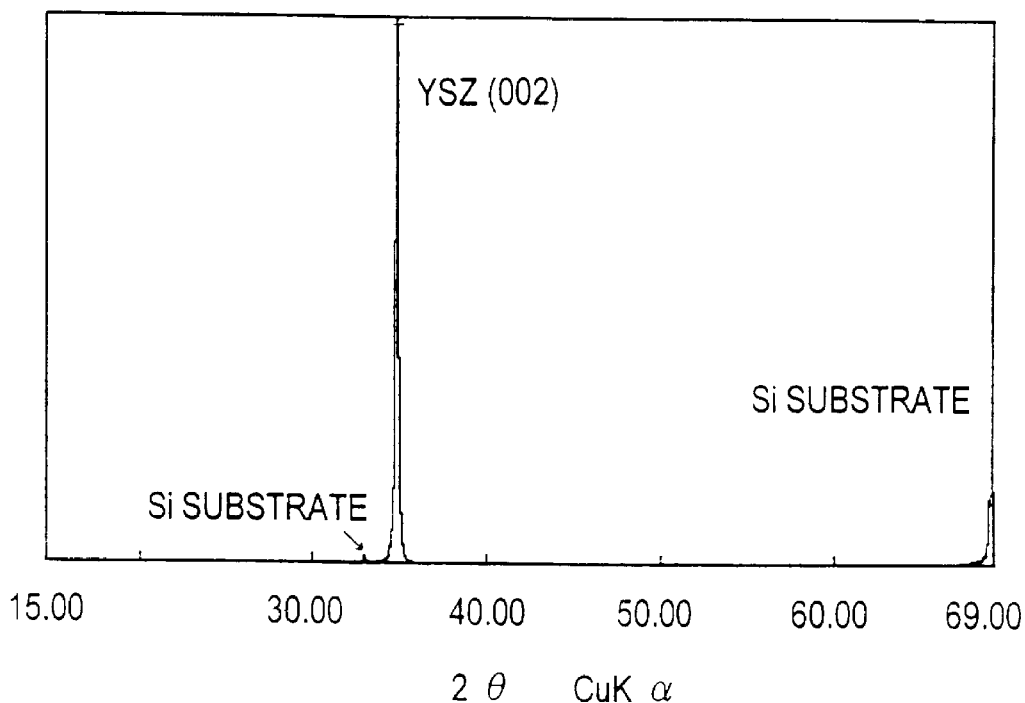
FIG. 33 is a X-ray diffraction diagram of a YSZ thin film formed on a single crystal substrate, FIGS. 33(a) and 33(b) using as the single crystal substrate a single crystal substrate of single crystal silicon with (100) plane and a single crystal substrate of single crystal silicon with (111) plane, respectively.
Figure 33:
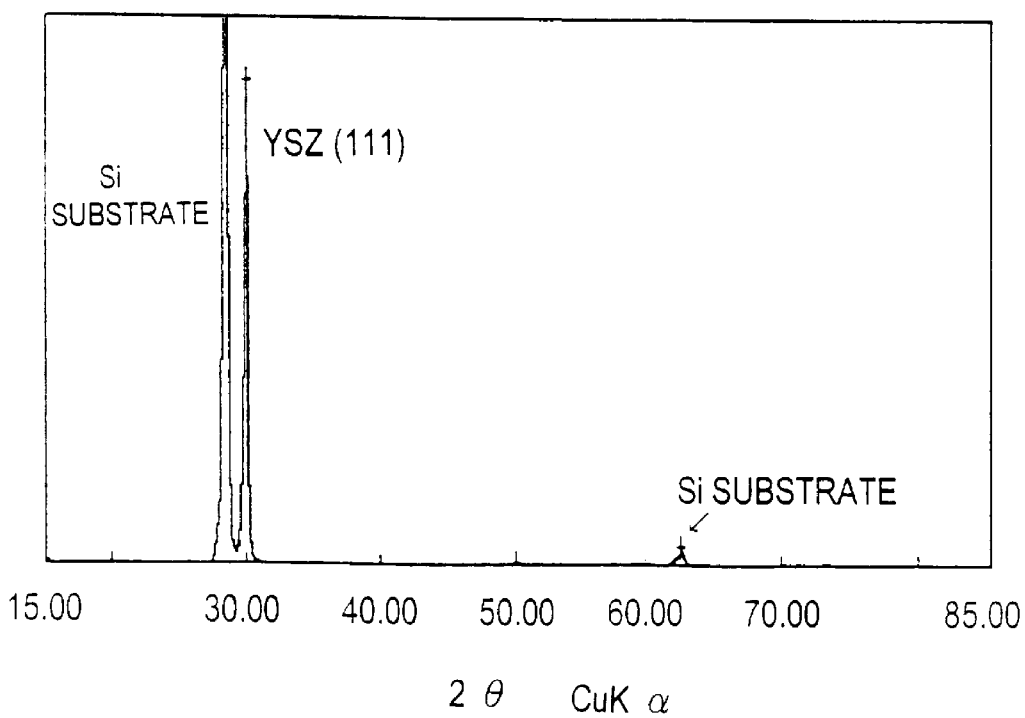

FIG. 33 shows the results of XRD (CuKx ray) analysis on the thin films 3-2 obtained in this Example. FIGS. 33(*a*) and 33(*b*) are XRD diagrams obtained when substrates (1) and (2) were used, respectively. A (002) peak indicative of the fluorite structure of YSZ is clearly observed in FIG. 33(*a*) and a (111) peak indicative of the fluorite structure is clearly observed in FIG. 33(*b*), indicating that there are obtained crystal films which are intensely oriented in a direction reflecting the crystal structure and symmetry of the substrate.

Figure 34A:
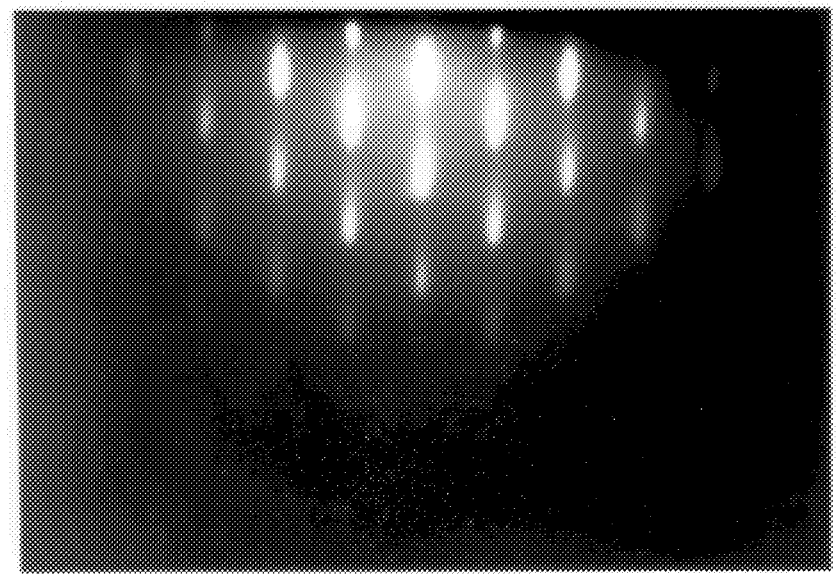
FIG. 34 is a drawing-substituting photograph of the crystal structure of a thin film illustrating the RHEED pattern of the YSZ film shown in FIG. 32(a), FIG. 34(a) being a diffraction pattern resulting from an electron beam incident on a single crystal silicon substrate from [100] direction and FIG. 34(b) being a diffraction pattern resulting from an electron beam incident on a single crystal silicon substrate from [110] direction.
Figure 34B:
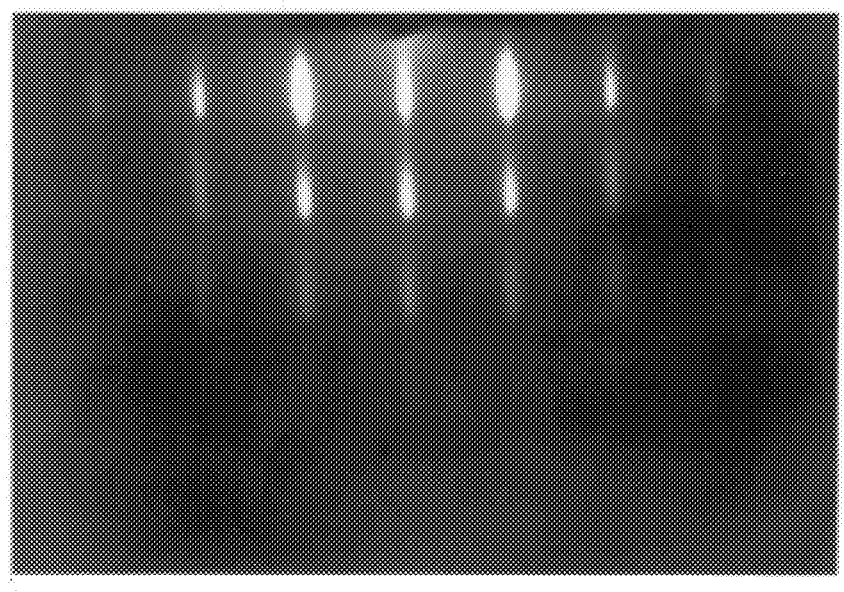
Figure 35:
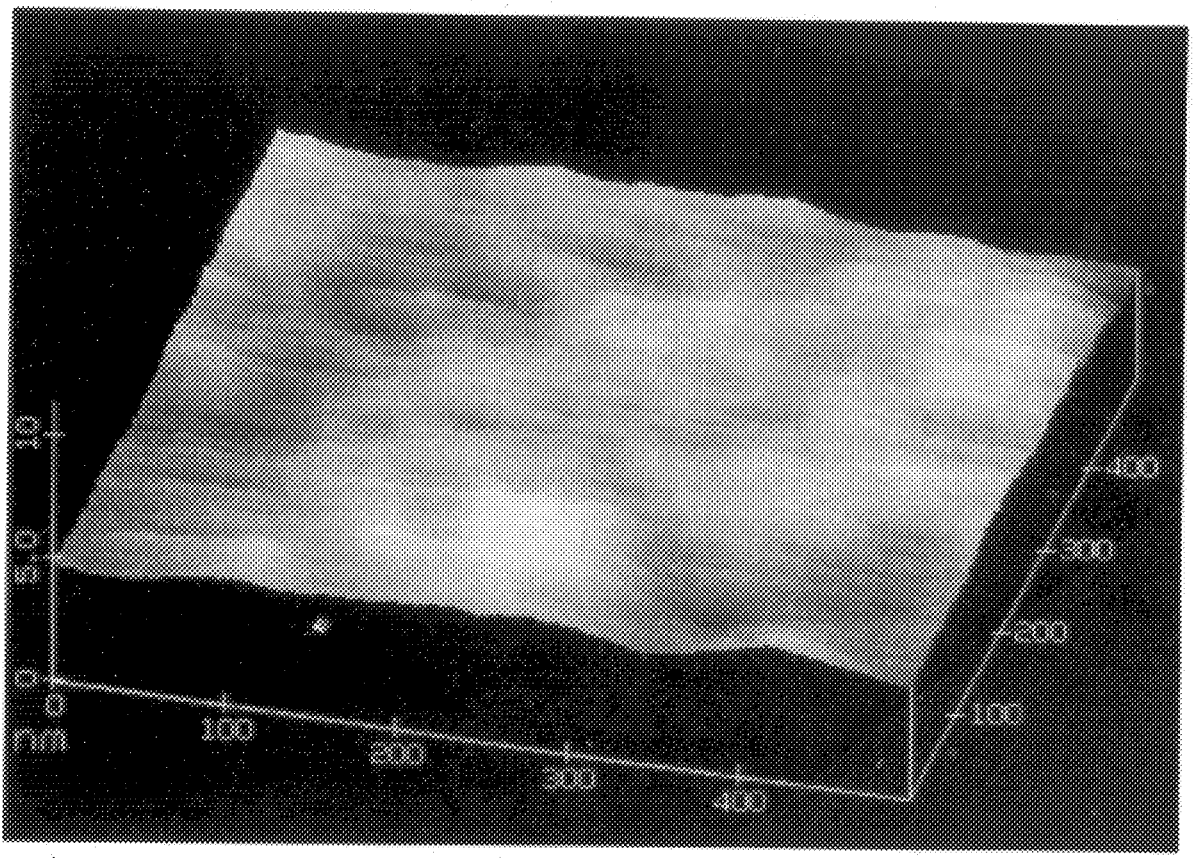
FIG. 35 is a drawing-substituting photograph of the crystal structure of a thin film illustrating a thin film surface image of the YSZ film shown in FIG. 32(a) by atomic force microscopy.

FIG. 34 is an RHEED diffraction pattern showing the crystal structure of a thin film obtained when substrate (1) was used. FIGS. 34(*a*) and 34(*b*) are diffraction patterns obtained when electron beams are incident from [100] and [110] directions of silicon, respectively. As seen from these results, YSZ shows a sharp streaky diffraction pattern, indicating that the film is of single crystal and has a surface which is flat on the atomic level. Further, from the thin film obtained with the use of substrate (1), a sample of 5×5 mm square was cut along a straight line containing the center thereof and observed under an atomic force microscope (AFM). FIG. 35 shows a surface image. No grain boundary was observable. It is also true when substrate (2) was used. It is seen that the surface is flat on the atomic level. Using thin film surface images of all the samples, a ten point mean roughness Rz according to JIS B-0610 (reference length L=500 nm) was measured to be 0.17 nm on average and 0.12 nm at minimum. The rocking curve had a half-value width of 1.00 on average and 0.9° at minimum. It was confirmed from these data that the samples had superior surface properties and crystallinity over the entire surface.

Example 4-2

As the single crystal substrate 3-1, there were similarly used (1) a silicon single crystal which was cut so as to make (100) plane a surface and mirror polished and (2) a silicon single crystal which was cut so as to make (111) plane a surface and mirror polished. After purchase, the mirror surfaces were cleaned by etching with a 40% ammonium fluoride aqueous solution. The silicon substrates used were disk substrates having a diameter of 2 inches.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump. In order to protect the cleaned surface of the substrate with silicon oxide, the substrate was rotated at 20 rpm and heated at 600° C. while introducing oxygen to the proximity of the substrate from a nozzle at a rate of 25 cc/min. A silicon oxide film was formed on the substrate surface by thermal oxidation. By this procedure, a silicon oxide film of about 1 nm thick was formed.

Figure 36:
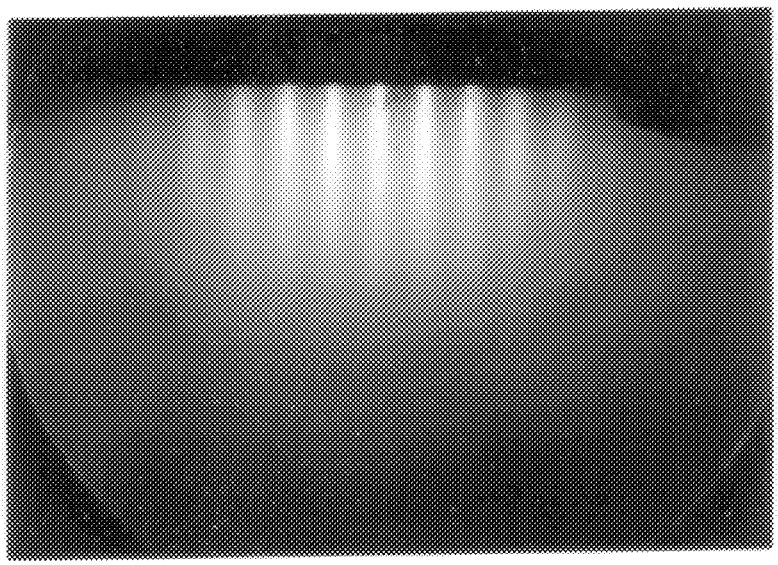
FIG. 36 is a drawing-substituting photograph of the surface structure of a silicon substrate in Example 4-2, (a), having a 1×1 surface structure formed of metallic Zr and oxygen, illustrating a RHEED pattern resulting from an electron beam incident on a single crystal silicon substrate from [110] direction.
Figure 37:
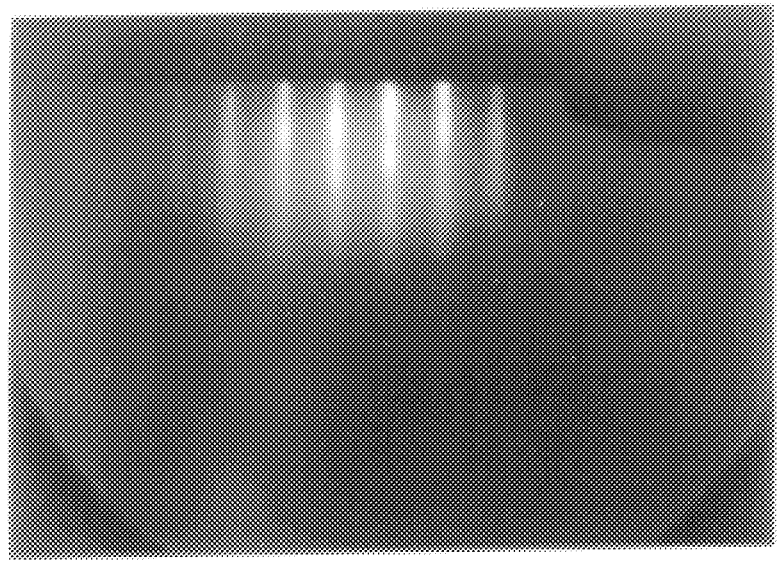
FIG. 37 is a drawing-substituting photograph of the surface structure of a silicon substrate in Example 4-2, (b), having a 1×1 surface structure formed of metallic Zr and oxygen, illustrating a RHEED pattern resulting from an electron beam incident on a single crystal silicon substrate from [110] direction.
Figure 38:
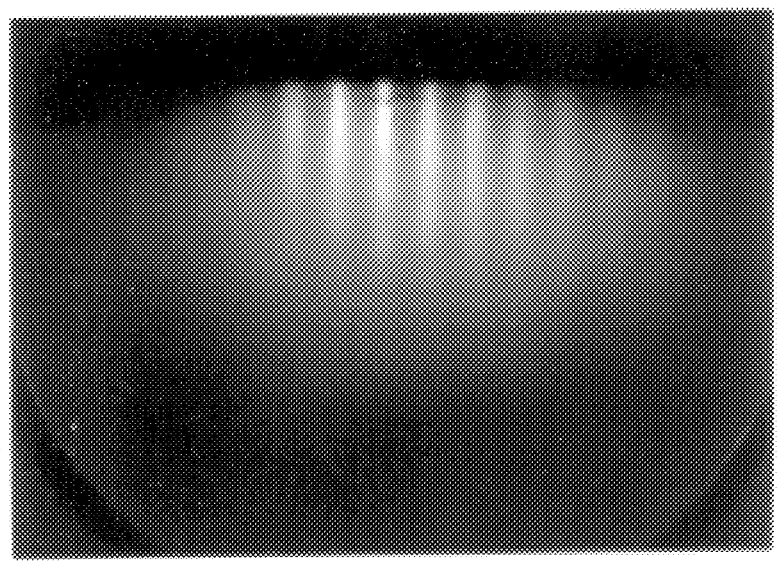
FIG. 38 is a drawing-substituting photograph of the surface structure of a silicon substrate in Example 4-2, (c), having a 1×1 surface structure formed of metallic Zr, metallic Y, and oxygen, illustrating a RHEED pattern resulting from an electron beam incident on a single crystal silicon substrate from [110] direction.

Thereafter, the substrate was heated at 900° C. and rotated. The number of revolutions was 20 rpm. At this point, oxygen was introduced from a nozzle at a rate of 25 cc/min. (a) Metallic zirconium was evaporated from its evaporation source to supply zirconium onto the above-mentioned substrate (1) in an amount corresponding to a zirconium oxide film of 5 nm thick, yielding a surface treated silicon substrate having a 1×1 surface structure. (b) Metallic zirconium was evaporated from its evaporation source to supply zirconium onto the above-mentioned substrate (2) in an amount corresponding to a zirconium oxide film of 5 nm thick, yielding a surface treated silicon substrate having a 1×1 surface structure. (c) Metallic zirconium and yttrium were evaporated at a controlled molar ratio Y/Zr of 0.22/1 to supply zirconium and yttrium onto the above-mentioned substrate (1) in an amount corresponding to an oxide film of 5 nm thick, yielding a surface treated silicon substrate having a 1×1 surface structure. These surfaces were measured by RHEED, with the resulting images shown in FIGS. 36 to 38.

These patterns resulted from measurement in incident direction [110] although exactly the same patterns were obtained with 90° rotation. It was thus acknowledged that there was provided a surface treated silicon substrate having a stable 1×1 surface structure.

By supplying metallic zirconium from its evaporation source onto the surface treated silicon substrate at a temperature of 900° C. and rotating at 20 rpm while introducing oxygen gas from a nozzle at a rate of 25 cc/min., a ZrO film of 10 nm thick was formed on each of the treated substrates (a) and (b) mentioned above. By supplying zirconium and yttrium from their evaporation sources onto the treated substrate (c) mentioned above under the same conditions as just above, a YSZ ($Zr_{0.82}Y_{0.18}O_{2-\delta}$) film of 10 nm thick was formed.

Figure 39:
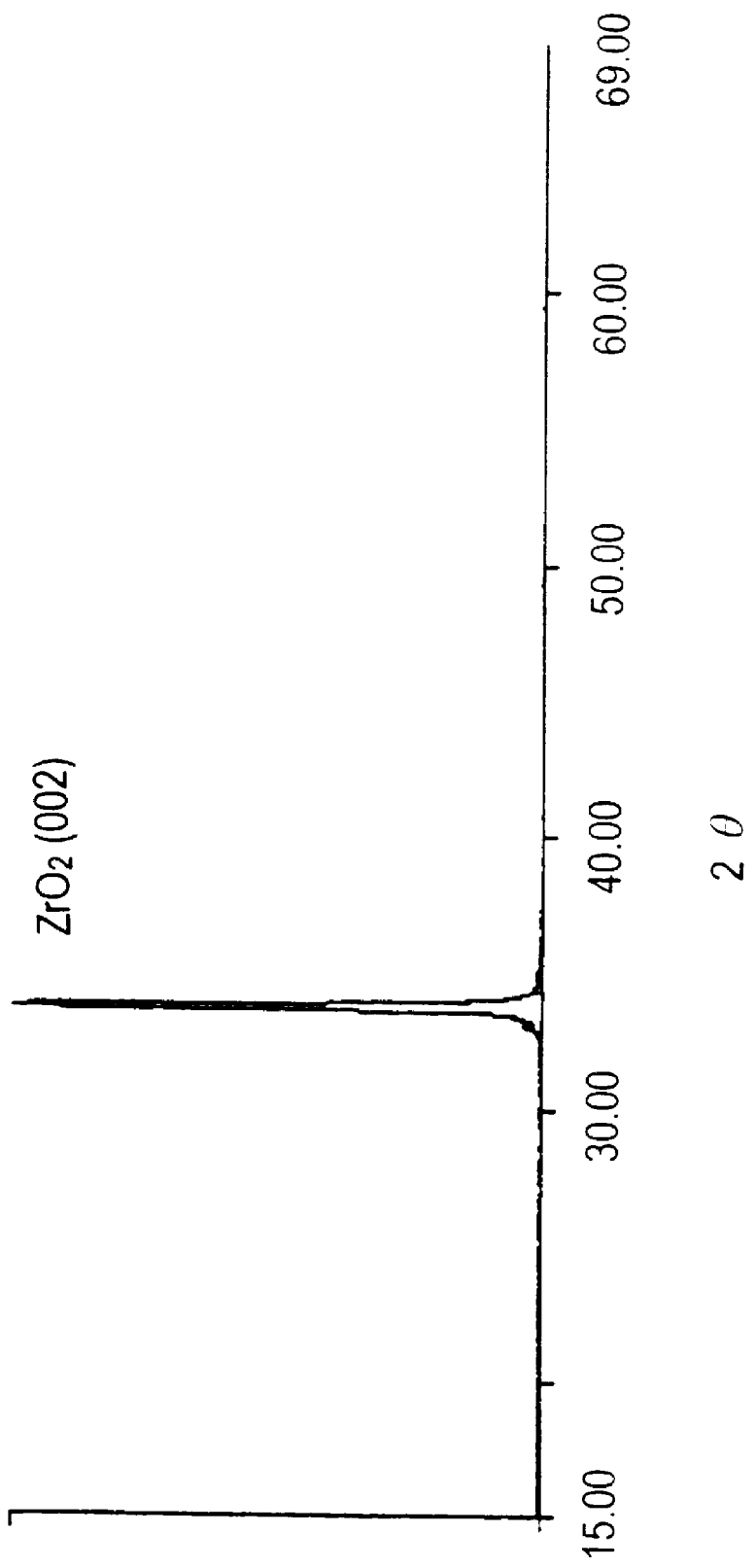
FIG. 39 is a X-ray diffraction diagram of the structure of a $ZrO_2$ film formed on a silicon (100) substrate.
Figure 40:
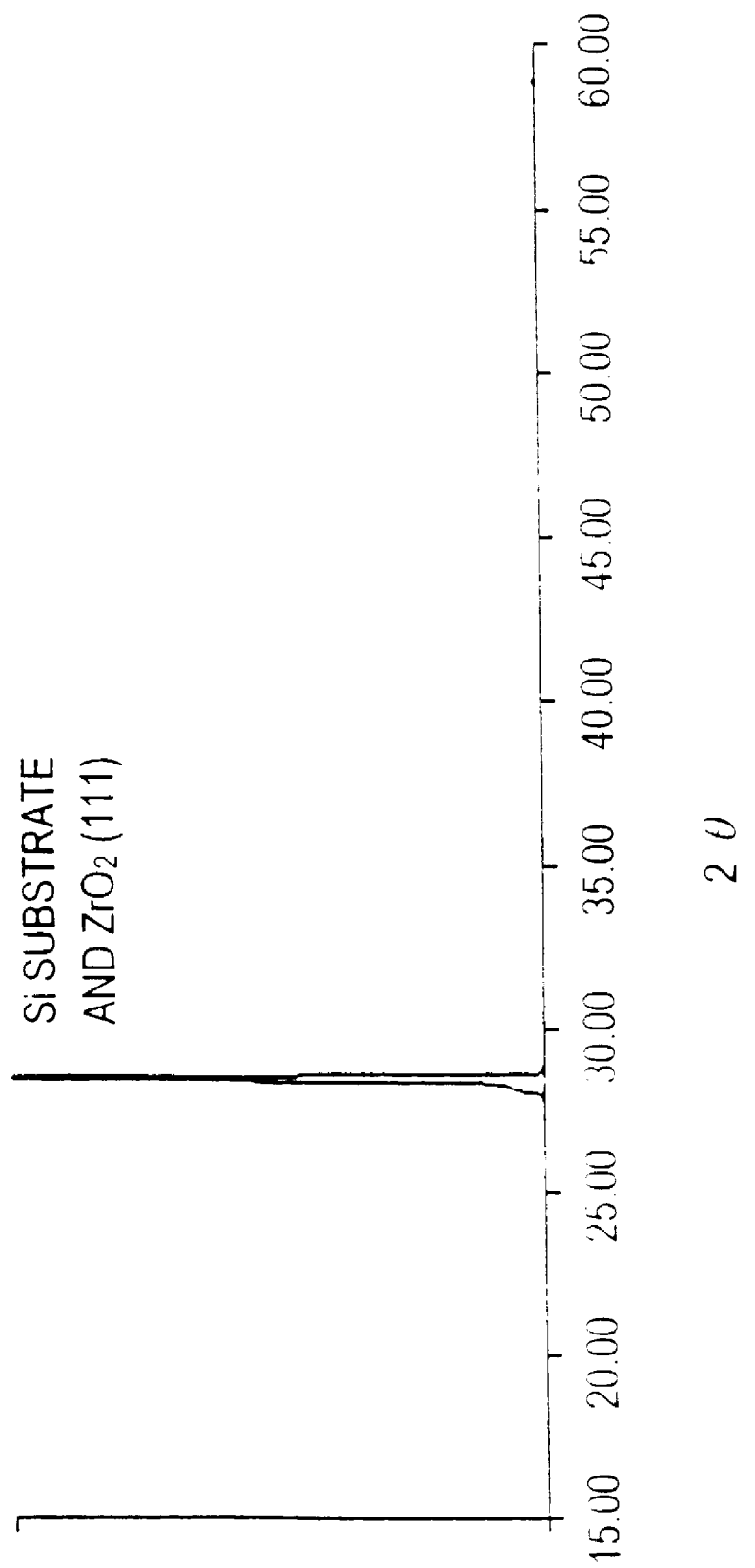
FIG. 40 is a X-ray diffraction diagram of the structure of a $ZrO_2$ film formed on a silicon (111) substrate.
Figure 41:
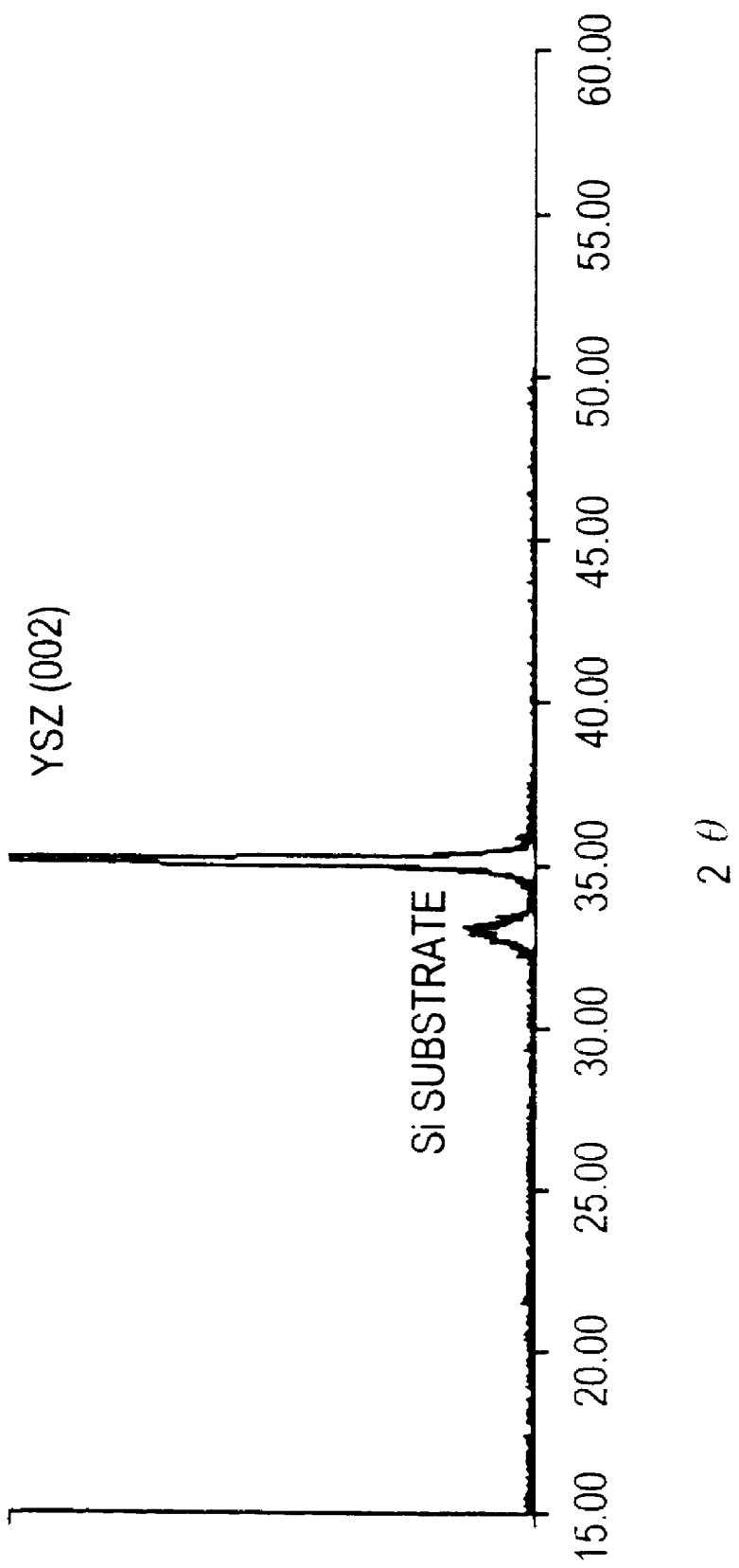
FIG. 41 is a X-ray diffraction diagram of the structure of a YSZ film formed on a silicon (100) substrate.

FIGS. 39 to 41 show the results of X-ray diffraction analysis on the resulting three thin films. In these figures, a (002) peak of $ZrO_2$ and a (002) peak of YSZ are apparently observed (in FIGS. 39 and 41). In FIG. 40, a (111) peak of $ZrO_2$ is in full overlap with a peak of the silicon substrate. It is seen that there are obtained crystal films which are intensely oriented in a direction reflecting the crystal structure and symmetry of $ZrO_2$ and YSZ. In particular, each of these peaks is reflection from only one reflecting surface. Especially, the $ZrO_2$ film is a unidirectionally oriented, high crystallinity film which was never found in the prior art. The rocking curves of these reflections had a half-value width of 0.8° (found value), 0.9° (found value), and 0.8° (found value including silicon substrate), respectively, indicating superior orientation.

Figure 42:
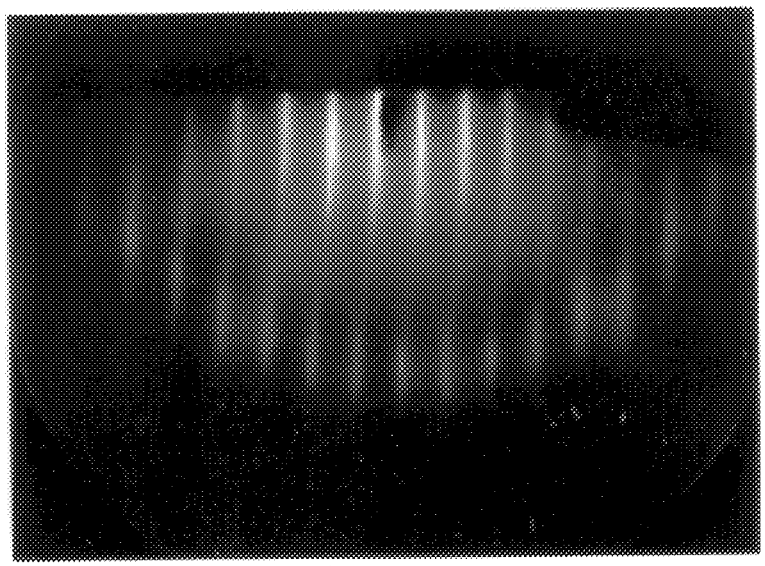
FIG. 42 is a drawing-substituting photograph of the crystal structure of $ZrO_2$ formed on a silicon (100) substrate, illustrating a RHEED pattern resulting from an electron beam incident on a single crystal silicon substrate from [110] direction.
Figure 43:
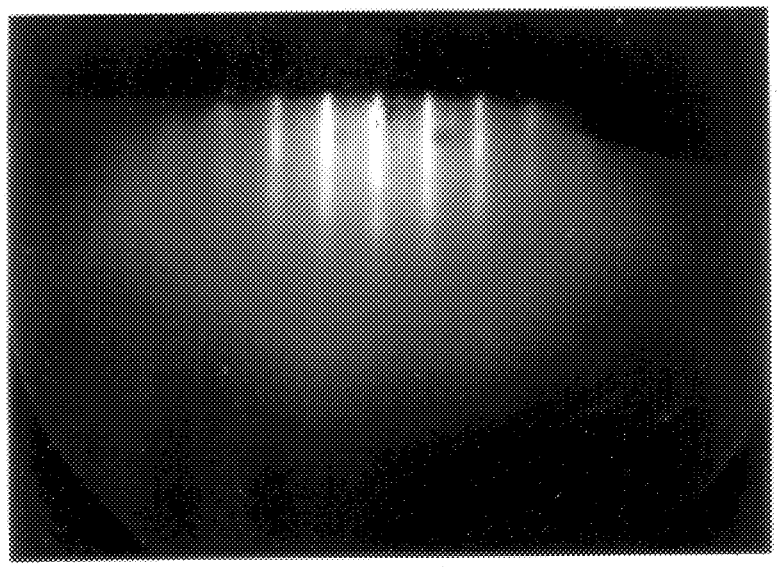
FIG. 43 is a drawing-substituting photograph of the crystal structure of $ZrO_2$ formed on a silicon (111) substrate, illustrating a RHEED pattern resulting from an electron beam incident on a single crystal silicon substrate from [110] direction.
Figure 44:
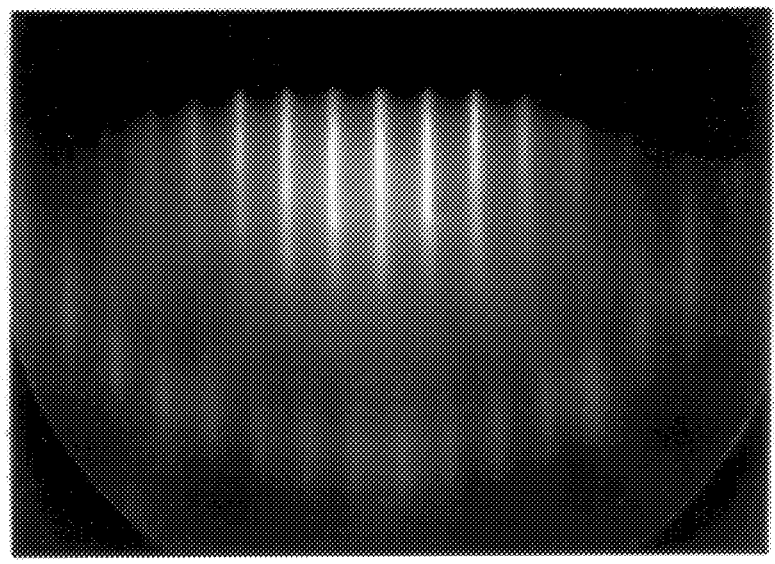
FIG. 44 is a drawing-substituting photograph of the crystal structure of YSZ formed on a silicon (100) substrate, illustrating a RHEED pattern resulting from an electron beam incident on a single crystal silicon substrate from [110] direction.

FIGS. 42, 43 and 44 show reflection high energy electron diffraction (RHEED) patterns of these thin films. The incident direction of electron beams is from [110] direction of the silicon substrate. As seen from these results, the diffraction pattern on the surface of the thin film of this structure is a completely streaky pattern and is completely different from a pattern having partially spot-like streaks as found in prior art examples. This completely streaky pattern indicates that $ZrO_2$ has superior crystallinity and surface properties. Also the $ZrO_2$ and YSZ films were measured for resistivity to find that the $ZrO_2$ film had a 5 times higher resistivity than YSZ, indicating superior insulation. The three films were measured for ten point mean roughness Rz according to JIS B-0610 (reference length L=500 nm) at 10 positions distributed over substantially the entire surface to find that the $ZrO_2$ film on the (100) silicon substrate had Rz of 0.75 nm on average, 0.95 nm at maximum, and 0.12 at minimum, the $ZrO_2$ film on the (111) silicon substrate had Rz of 0.85 nm on average, 1.2 nm at maximum, and 0.08 at minimum, the YSZ film on the (100) silicon substrate had Rz of 0.80 nm on average, 1.00 nm at maximum, and 0.12 at minimum, indicating that the surface was flat on the molecular level.

Films were formed by substituting Pr, Ce, Nd, Gd, Tb, Dy, Ho, Er, etc. for Y of the YSZ film, with the results equivalent to the above.

Figure 45:
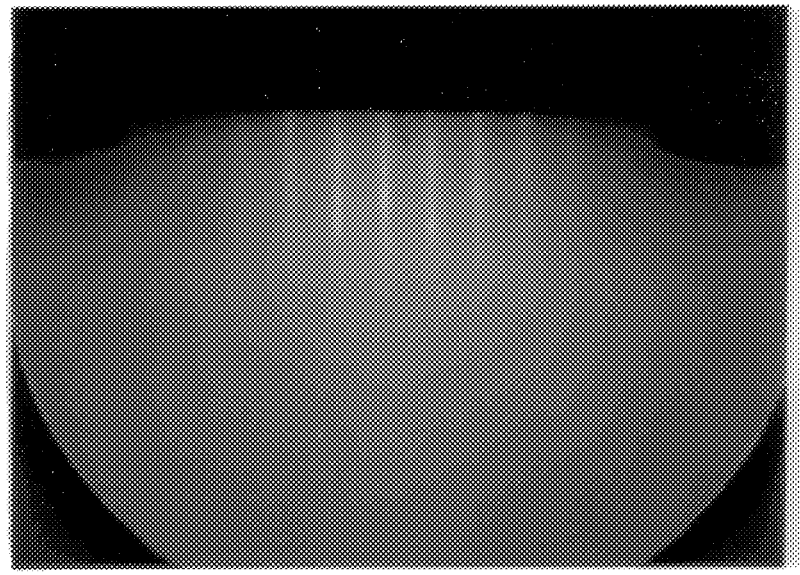
FIG. 45 is a drawing-substituting photograph of the silicon film surface structure of a silicon electrode formed on the sample of Example 4-2, (a), illustrating a RHEED pattern or diffraction pattern resulting from an electron beam incident on a single crystal silicon substrate from [110] direction.

Next, on the six oxide thin films (which are to serve as tunnel oxide films) of Examples 4-1 and 4-2, a silicon film is formed which is to serve as a floating gate electrode. The step of forming such a film without taking out the oxide thin film is described herein. The vacuum chamber was further evacuated to a vacuum of $1\times10^{-7}$ Torr and a silicon film 3-3 was formed at 900° C. by evaporation as shown in FIG. 32(c). The thus formed silicon electrode was an epitaxially formed silicon electrode because the epitaxial film was underlying. FIG. 45 is a RHEED pattern of the silicon electrode formed on the (001) $ZrO_2$ layer. It is acknowledged that the silicon electrode was epitaxially grown on the $ZrO_2$ film. For the remaining samples, epitaxial growth of silicon was similarly confirmed by RHEED. The interface between the tunnel oxide film 3-2 and the floating gate electrode 3-3 was flat on the atomic level.

Next, the floating gate film was patterned by photo-lithography and etched as shown in FIG. 32(d). Furtherthereon, a thick insulating film 3-4 of $SiO_2$ (having a thickness of about 50 nm) was formed by CVD as shown in FIG. 32(e), yielding a configuration having the floating gate buried therein. Next, an aluminum film 3-5 was formed by sputtering as shown in FIG. 32(f). The aluminum film was patterned by photo-lithography and etched as shown in FIG. 32(g), yielding a control electrode. The silicon substrate was then exposed by reactive ion etching (RIE) as shown in FIG. 32(h). Subsequently, phosphorus was implanted by ion implantation to form source and drain regions 3-6 as shown in FIG. 32(i). Subsequent wiring with an aluminum electrode 3-7 as shown in FIG. 32(j) completed the structure. The general parameters used in the semiconductor element manufacturing process are only exemplary in manufacturing a non-volatile semiconductor memory device according to the embodiment of the invention and not critical.

A comparative test was carried out on the thus manufactured non-volatile semiconductor memory device according to the embodiment of the invention and a device using conventional $SiO_2$ as the tunnel oxide film. On the respective cells, writing and reading was repeated $1\times10^5$ cycles. With a voltage applied between the control electrode and the source to apply an electric field of 6 MV/cm across the tunnel oxide film, a leakage current was measured. The prior art device had a leakage current of $1\times10^6$ $A/cm^2$ whereas the devices of the inventive embodiment had a leakage current as low as $0.5\times10^{-8}$ to $5.0\times10^{-8}$ $A/cm^2$. Particularly, the device using the $ZrO_2$ epitaxy film as the tunnel oxide film had a very low leakage current of $0.5\times10^{-8}$ to $1.5\times10^{-8}$ $A/cm^2$. A comparison of a change of the writing threshold voltage from the initial value revealed that the prior art device had a change of 50% whereas the inventive device had a change of only about 20%.

Finally, an example of the SOI device of the invention is described.

Example 5

The substrates used herein were the three (100) silicon substrates each having an oxide thin film in Example 4-1. On the $ZrO_2$ film (insulating layer film) on the (100) silicon substrate, a silicon semiconductor film (to be referred to as a silicon film, hereinafter) was formed as a functional layer.

Figure 46:
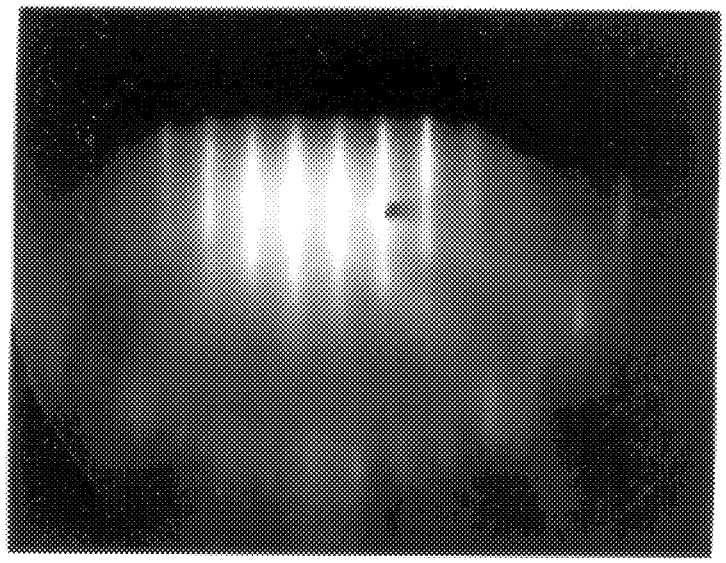
FIG. 46 is a drawing-substituting photograph of the surface structure of an epitaxial silicon film formed on a $ZrO_2$ insulating layer for sample No. 1, illustrating a RHEED pattern or diffraction pattern resulting from an electron beam incident on a single crystal silicon substrate from [110] direction.
Figure 47:
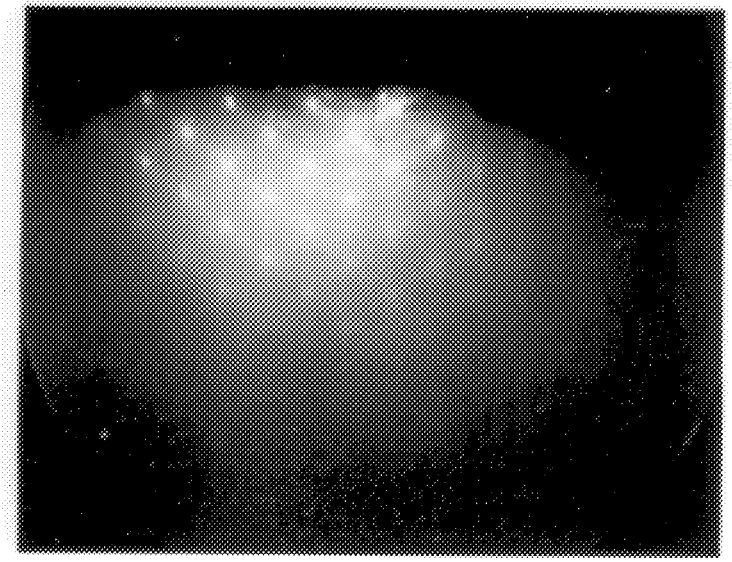
FIG. 47 is a drawing-substituting photograph of the surface structure of a polycrystalline silicon film formed on a $ZrO_2$ insulating layer for sample No. 2, illustrating a RHEED pattern or diffraction pattern resulting from an electron beam incident on a single crystal silicon substrate from [110] direction.
Figure 48:
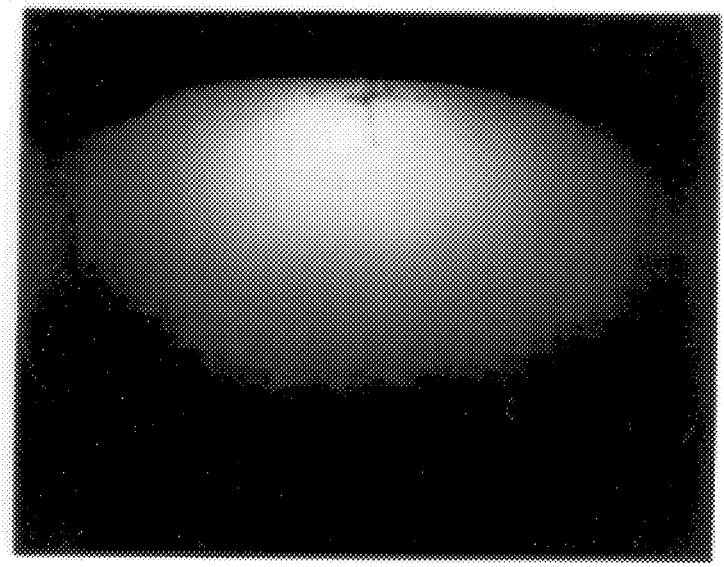
FIG. 48 is a drawing-substituting photograph of the surface structure of an amorphous silicon film formed on a $ZrO_2$ insulating layer for sample No. 3, illustrating a RHEED pattern or diffraction pattern resulting from an electron beam incident on a single crystal silicon substrate from [110] direction.

In this Example, three silicon films were formed. For sample No. 1, to form an epitaxial silicon film, a silicon film of 200 mm thick was formed by an MBE technique at a substrate temperature of 900° C. and a deposition rate of 0.05 nm/sec. For sample No. 2, to form polycrystalline silicon, polycrystalline silicon of 200 nm thick was deposited at a substrate temperature of 700° C. by an atmospheric pressure CVD technique using $SiH_4$ diluted with $H_2$ (to a concentration of 1%). Hydroxylation treatment was then carried out by hydrogen plasma. For sample No. 3, an amorphous silicon film of 10 nm was deposited at a substrate temperature of 300° C. by a plasma CVD technique using $SiH_4$ gas in a high frequency plasma. These silicon films were evaluated by RHEED, with the results shown in FIGS. 46 to 48. A streaky pattern was observed in the substrate (a) sample, indicating that silicon was epitaxially grown on $ZrO_2$. A spot pattern representative of silicon was observed in the substrate (b) sample. A ring-like arrangement of spots indicates a polycrystalline film. Especially for this film, intense orientation of crystals and superior crystallinity are seen because the ring is approximate to spots. The substrate (c) sample gave a halo pattern, indicating an amorphous state.

Next, these three silicon films are processed into TFT. The structure of TFT is shown in FIG. 6. This structure is of the so-called planar type TFT. On the silicon film, source and drain electrodes were formed by sputtering aluminum to 50 nm and patterning it by etching. Note that to provide ohmic contact between the aluminum electrode and the silicon semiconductor film, some measures were taken using n type conductive silicon. A $SiO_2$ film of 200 nm was formed as a gate insulating film by a plasma CVD method. The gate insulating film was patterned before an aluminum film was formed to 50 nm. The aluminum film was etched to form a gate electrode, obtaining TFT devices of sample Nos. 1 to 3.

The TFT device of sample No. 1 using the epitaxial silicon film exhibited satisfactory transistor properties. As compared with a 200-nm epitaxial silicon on a sapphire substrate having an electron mobility of 200 $cm^2/Vs$, it had a twice greater electron mobility of 400 $cm^2/Vs$. Where p type conductive silicon was used, the hole mobility was 100 $cm^2/Vs$ when a sapphire substrate was used, but 200 $cm^2/Vs$ in the inventive sample. This is probably because the substrate underlying the silicon film in the inventive example is formed of $ZrO_2$, less impurities (for example, aluminum when a sapphire substrate is used) are contained, and the epitaxial silicon film is improved in crystallinity as a result of reduced stresses in the silicon film by virtue of a matching in thermal expansion between $ZrO_2$ and silicon. Although the thin film is used to manufacture a FET in the illustrated example, it is possible to take more advantage of the thin film by applying it to bipolar CMOS devices because a silicon film of quality is obtained on the insulating substrate. Since the $ZrO_2$ layer is also highly insulating, a three-dimensional device can be manufactured by fabricating IC on the bulk silicon substrate.

The TFT device of sample No. 2 using the polycrystalline silicon film marked a big difference in leakage current as compared with the TFT device having conventional polycrystalline silicon formed using a quartz substrate as the substrate. When a comparison was made at a gate voltage of 0 V with a drain-source voltage of 5 V applied, a TFT manufactured using quartz in the same manner as the inventive example has a leakage current of $8.2 \times 10^{-12}$ A/$\mu$m$^2$ and the inventive example had a one-order smaller leakage current of $9.5 \times 10^{-13}$ A/$\mu$m$^2$. This is because the polycrystalline silicon in the inventive example is oriented in silicon (100) plane, there are less grain boundaries linked in the film in-plane direction and therefore, a leakage current path is formed between the source and the drain with difficulty.

The TFT device of sample No. 3 using the amorphous silicon film was compared with a conventional FET formed on glass. The FET on glass was manufactured by the same procedure under the same conditions as the inventive example. The amorphous silicon film had a thickness of 10 nm which was thinner than the film thickness used in conventional TFT. This is effective for reducing leakage of TFT due to photo-conduction. Upon comparison of TFTs using amorphous silicon, a significant difference was found in ON current/OFF current ratio. A high ON/OFF ratio is necessary in order for TFT to serve as a switching element. The TFT on glass had a ratio of less than 5 orders whereas the inventive TFT had a ratio of 6 orders. Since the amorphous silicon film used herein was as thin as 10 nm, the TFT characteristics are largely affected by irregularities at the interface and surface and continuity of the film. Since the ZrO$_2$ film of the invention has superior flatness and contains only asperities on the molecular level, the amorphous silicon formed thereon has a flat interface with ZrO$_2$ and contains few asperities on the surface. By virtue of good wettability between ZrO$_2$ and Si, even a thin film can be formed to superior continuity. Accordingly, by virtue of ZrO$_2$, an improved silicon film is obtained and TFT characteristics are improved.

TFT samples were similarly fabricated by forming three types of silicon semiconductor film on the remaining four types of substrate in Examples 4-1 and 4-2. Their results were substantially equivalent to the TFT manufactured by forming a silicon semiconductor film as a functional layer on a ZrO$_2$ film (insulating layer film) on the (100) silicon substrate.

We claim:

1. A method for forming an oxide thin film in the form of a unidirectionally oriented epitaxial film of the composition: $Zr_{1-x}R_xO_{2-\delta}$ wherein R is a rare earth metal inclusive of yttrium, x is a number of 0 to 0.75, and $\delta$ is a number of 0 to 0.5 on a single crystal silicon substrate, comprising the steps of:

carrying out in a vacuum chamber heating of a single crystal silicon substrate, introduction of an oxidizing gas into the vacuum chamber, and supply of zirconium or zirconium and at least one rare earth metal (inclusive of yttrium) to the surface of the single crystal substrate by evaporation, and allowing an oxide thin film to form on the surface of said single crystal substrate by epitaxial growth for forming a unidirectionally oriented epitaxial film of said composition.

2. The method for forming an oxide thin film of claim 1 wherein said single crystal silicon substrate used is a surface treated silicon substrate whose surface has a 1×1 surface structure formed of zirconium or zirconium and at least one rare earth metal (inclusive of yttrium) and oxygen.

3. The method for forming an oxide thin film of claim 1 wherein said surface treated silicon substrate used is a single crystal silicon substrate which has been pre-treated by forming a silicon oxide layer of 0.2 to 10 nm thick on the substrate surface, setting the substrate at a temperature of 600° to 1,200° C. and introducing an oxidizing gas into the vacuum chamber for establishing an atmosphere of $1 \times 10^{-4}$ to $1 \times 10^{-1}$ Torr at least in the vicinity of the substrate, and supplying in this condition zirconium or zirconium and at least one rare earth metal (inclusive of yttrium) by evaporation to the surface of the substrate having the silicon oxide layer formed thereon.

4. The method for forming an oxide thin film of claim 1 wherein the step of forming a silicon oxide layer includes heating the single crystal silicon substrate in the vacuum chamber having the oxidizing gas introduced therein to a temperature of 300° to 700° C. and establishing an atmosphere having an oxygen partial pressure of $\geq 1 \times 10^{-4}$ Torr at least in the vicinity of the substrate in the vacuum chamber for forming a silicon oxide layer.

5. The method for forming an oxide thin film of claim 1 wherein a silicon single crystal is used as said single crystal silicon substrate such that its (100) or (111) plane is made the substrate surface.

6. The method for forming an oxide thin film of claim 1 wherein an oxidizing gas is injected toward the surface of said single crystal silicon substrate from the proximity thereof, thereby establishing only in the vicinity of said single crystal substrate an atmosphere having a higher oxidizing gas partial pressure than the remainder.

7. The method for forming an oxide thin film of claim 1 wherein said single crystal silicon substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

8. The method for forming an oxide thin film of claim 1 wherein said single crystal silicon substrate is heated to at least 751° C. during formation of the epitaxial film.

9. A method for forming an oxide thin film in the form of an epitaxial film of a composition: $Zr_{1-x}R_xO_{2-\delta}$ wherein R is a rare earth metal inclusive of yttrium, x is a number of 0 to 0.75, and $\delta$ is a number of 0 to 0.5 on a single crystal substrate of silicon, comprising the steps of:

initially evacuating a vacuum chamber to a vacuum of $\leq 1 \times 10^{-5}$ Torr, heating a single crystal substrate of silicon in the evacuated condition, then evaporating at least zirconium among metal elements including zirconium and at least one rare earth metal (inclusive of yttrium) concurrently from distinct evaporation sources at a controlled ratio of Zr and the rare earth metal, thereby supplying the metal(s) to the surface of the single crystal substrate, introducing an oxidizing gas into said vacuum chamber at the same time as the supply of the metal(s) or after a delay time from the supply of the metal(s), thereby setting at least the atmosphere in proximity to the single crystal substrate in the vacuum chamber at a pressure of $1 \times 10^{-4}$ to $1 \times 10^{-2}$ Torr, and allowing an oxide thin film to form on the surface of said single crystal substrate by epitaxial growth.

10. The method for forming an oxide thin film of claim 9 wherein said epitaxial film is a unidirectionally oriented epitaxial film.

11. The method for forming an oxide thin film of claim 9 wherein the delay time from the supply of the metal(s) by evaporation to the introduction of the oxidizing gas is a time corresponding to 5 nm or less as expressed by the thickness of a metal thin film formed on said single crystal substrate.

12. The method for forming an oxide thin film of claim 9 wherein zirconium and rare earth metal (inclusive of yttrium) are concurrently evaporated from evaporation sources at a controlled molar ratio of rare earth metal to Zr of 0/1 to 3/1.

13. The method for forming an oxide thin film of claim 9 wherein zirconium and rare earth metal (inclusive of yttrium) are concurrently evaporated from evaporation sources at a controlled molar ratio of rare earth metal to Zr of 0.25/1 to 1.0/1.

14. The method for forming an oxide thin film of claim 9 wherein a silicon single crystal is used as said single crystal silicon substrate such that its (100) or (111) plane is made the substrate surface.

15. The method for forming an oxide thin film of claim 9 wherein an oxidizing gas is injected toward the surface of said single crystal silicon substrate from the proximity thereof, thereby creating only in the vicinity of said single crystal substrate an atmosphere having a higher oxidizing gas partial pressure than the remainder.

16. The method for forming an oxide thin film of claim 9 wherein said single crystal silicon substrate has a surface area of at least 10 square centimeter and is rotated within its plane, thereby providing an atmosphere of high partial pressure oxidizing gas entirely over said single crystal substrate for forming a uniform oxide thin-film over the entire surface of said single crystal substrate.

17. The method for forming an oxide thin film of claim 9 wherein said single crystal silicon substrate is heated to at least about 750° C. during formation of the epitaxial film.

18. A method for a surface treatment of a silicon substrate comprising the steps of forming a silicon oxide layer on the surface of a single crystal silicon substrate, and thereafter heating the substrate in vacuum and supplying to the surface at least one metal selected from the group consisting of an alkaline earth metal, rare earth metal (inclusive of scandium and yttrium), zirconium, and hafnium and an oxidizing gas, for thereby converting the substrate surface to a 1×1 surface structure formed of at least one metal selected from the group consisting of an alkaline earth metal, rare earth metal (inclusive of scandium and yttrium), zirconium, and hafnium and oxygen.

19. The method for the surface treatment of a silicon substrate according to claim 18 wherein the step of forming a silicon oxide layer includes heating the single crystal silicon substrate in the vacuum chamber having the oxidizing gas introduced therein to a temperature of 310° to 700° C. and establishing an atmosphere having an oxygen partial pressure of $\geq 1\times 10^{-4}$ Torr at least in the vicinity of the substrate in the vacuum chamber for forming a silicon oxide layer of 0.2 to 10 nm thick.

20. The method for the surface treatment of a silicon substrate according to claim 18 wherein the supply of the metal is carried out by evaporating the selected metal, during which the single crystal silicon substrate is set at a temperature of 600° to 1,200° C., and the oxidizing gas is introduced in this condition to establish an atmosphere having a pressure of $1\times 10^{-4}$ to $1\times 10^{-1}$ Torr at least in the vicinity of the single crystal silicon substrate in the vacuum chamber.

21. The method for the surface treatment of a silicon substrate according to claim 18 wherein said single crystal silicon substrate is used such that its (100) plane is made the substrate surface.

* * * * *

UNITED STATES PATENT AND TRADEMARK OFFICE
CERTIFICATE OF CORRECTION

PATENT NO. : 5,810,923
DATED : SEPTEMBER 22, 1998
INVENTOR(S) : YOSHIHIKO YANO ET AL.

It is certified that error appears in the above-identified patent and that said Letters Patent is hereby corrected as shown below:

On the Title page, item [75], delete Katsuto Nagano, Kanagawa, the third inventor.

Column 42, lines 27-28, delete "for forming a substantially uniform oxide thin film over the entire surface of said single crystal substrate".

Column 43, lines 21-22, delete "for forming a substantially uniform oxide thin film over the entire surface of said single crystal substrate".

Signed and Sealed this

Eighth Day of June, 1999

Attest:

Q. TODD DICKINSON

*Attesting Officer*        *Acting Commissioner of Patents and Trademarks*